United States Patent [19]

Takano et al.

[11] Patent Number: 5,579,463
[45] Date of Patent: *Nov. 26, 1996

[54] WAVEFORM DISPLAY APPARATUS OF FREQUENCY SWEEP TYPE FOR FACILITATING DISPLAY OF A HIGH DEFINITION WAVEFORM

[75] Inventors: Mitsuyoshi Takano, Machida; Aiichi Katayama, Isehara, both of Japan

[73] Assignee: Anritsu Corporation, Tokyo, Japan

[*] Notice: The portion of the term of this patent subsequent to Jan. 22, 2011, has been disclaimed.

[21] Appl. No.: 385,554

[22] Filed: Feb. 8, 1995

Related U.S. Application Data

[62] Division of Ser. No. 776,259, filed as PCT/JP91/00425, Mar. 30, 1991.

[30] Foreign Application Priority Data

Mar. 30, 1990 [JP] Japan .................................. 2-86973

[51] Int. Cl.$^6$ ........................................................ G06T 3/00
[52] U.S. Cl. .......................... 395/140; 395/139; 395/326; 345/134
[58] Field of Search ........................... 395/140, 133–139, 395/128, 155, 161; 345/133–135

[56] References Cited

U.S. PATENT DOCUMENTS

| 4,257,104 | 3/1981 | Martin et al. . | |
|---|---|---|---|
| 4,607,215 | 8/1986 | Takano et al. . | |
| 4,611,164 | 9/1986 | Mitsuyoshi et al. . | |
| 4,801,873 | 1/1989 | Takano . | |
| 4,839,582 | 6/1989 | Fukaya et al. | 324/77 |
| 4,868,785 | 9/1989 | Jordan et al. | 364/DIG. 2 |
| 5,075,618 | 12/1991 | Katayama | 364/485 X |

FOREIGN PATENT DOCUMENTS

| 0283804 | 9/1988 | European Pat. Off. . |
|---|---|---|
| 59-145970 | 8/1984 | Japan . |
| 60-203862 | 10/1985 | Japan . |
| 61-288164 | 12/1986 | Japan . |
| 63-75573 | 4/1988 | Japan . |
| 2-231567 | 9/1990 | Japan . |

*Primary Examiner*—Almis R. Jankus
*Attorney, Agent, or Firm*—Frishauf, Holtz, Goodman, Langer & Chick

[57] ABSTRACT

A measurement unit U100 measures an input signal to be measured by sweeping frequencies in a measurement range having a predetermined frequency band so as to obtain waveform data to be developed on the frequency axis such as spectrum data in, e.g., a spectrum analyzer. The waveform data obtained by the measurement of the measurement unit U100 is displayed by a display device 500 via a display data processor U20 included in a control unit U200 to be developed on the frequency axis of the display device, i.e., in correspondence with the measurement frequencies. The control unit U200 includes a measurement controller U30 for controlling the measurement unit U100 so as to display waveform data obtained by enlarging or reducing waveform data, before a measurement frequency condition is changed, at a predetermined magnification to have a predetermined point on the frequency axis as the center on the basis of a change in measurement frequency condition set by a condition setting unit U900, and an enlargement display/stable display processor U40 for controlling the display data processor U20. The enlargement display/stable display processor U40 realizes high-definition waveform observation, and has a function of controlling the display device U500 as the control unit U200.

11 Claims, 42 Drawing Sheets

MULTI-ZONE DISPLAY

MULTI-SPLIT DISPLAY

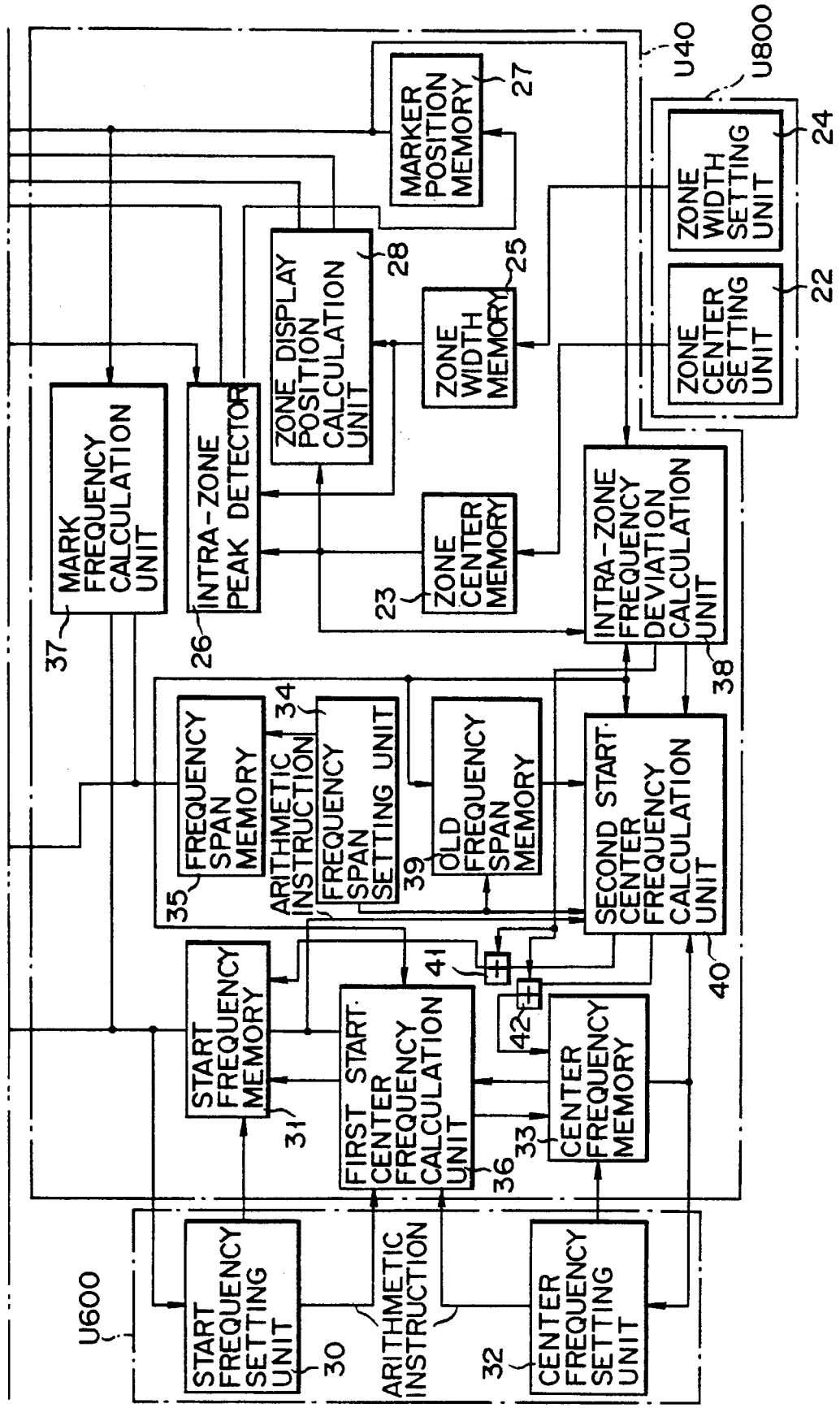
FIG. 3B-II

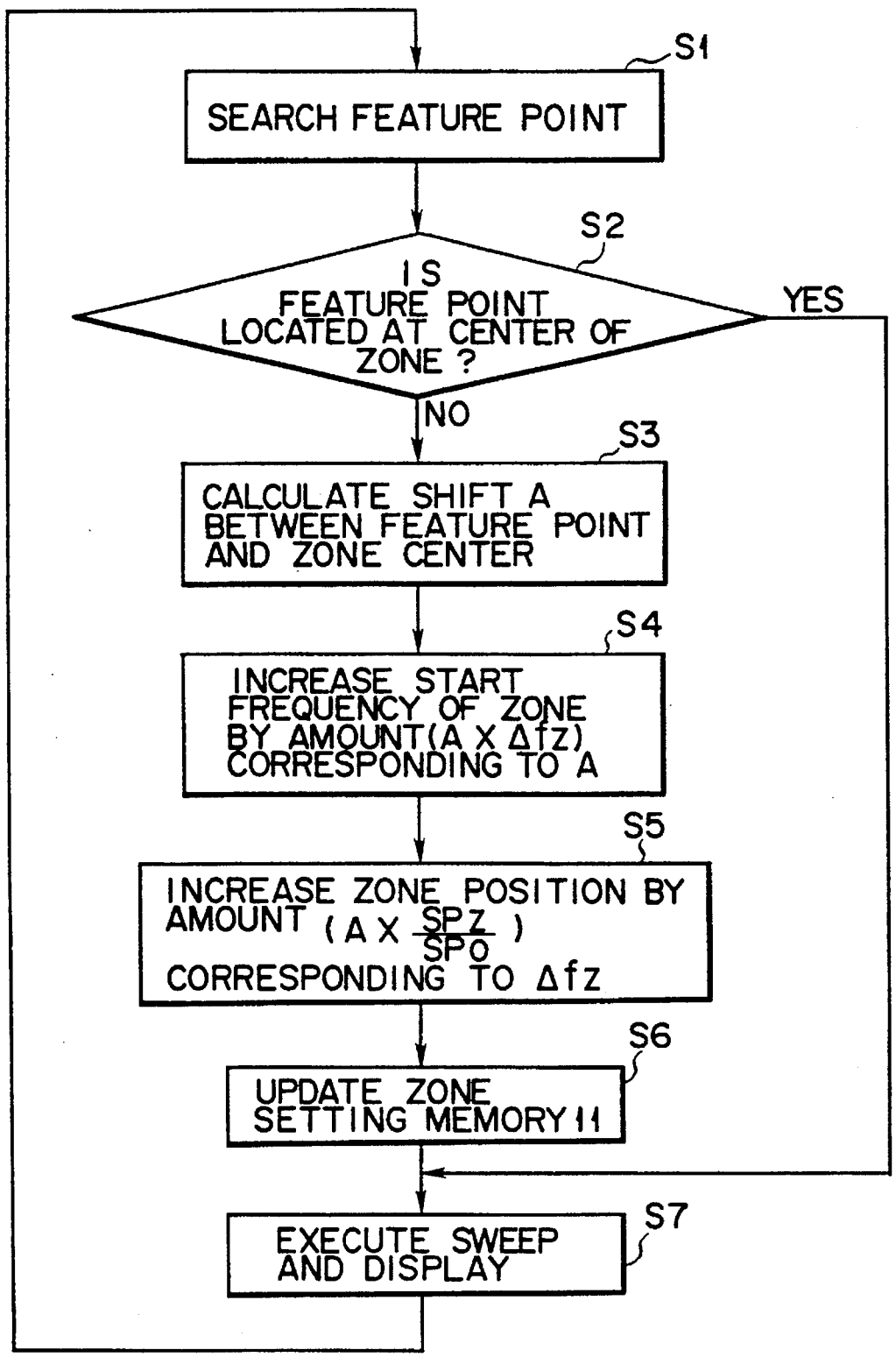
F I G. 9B

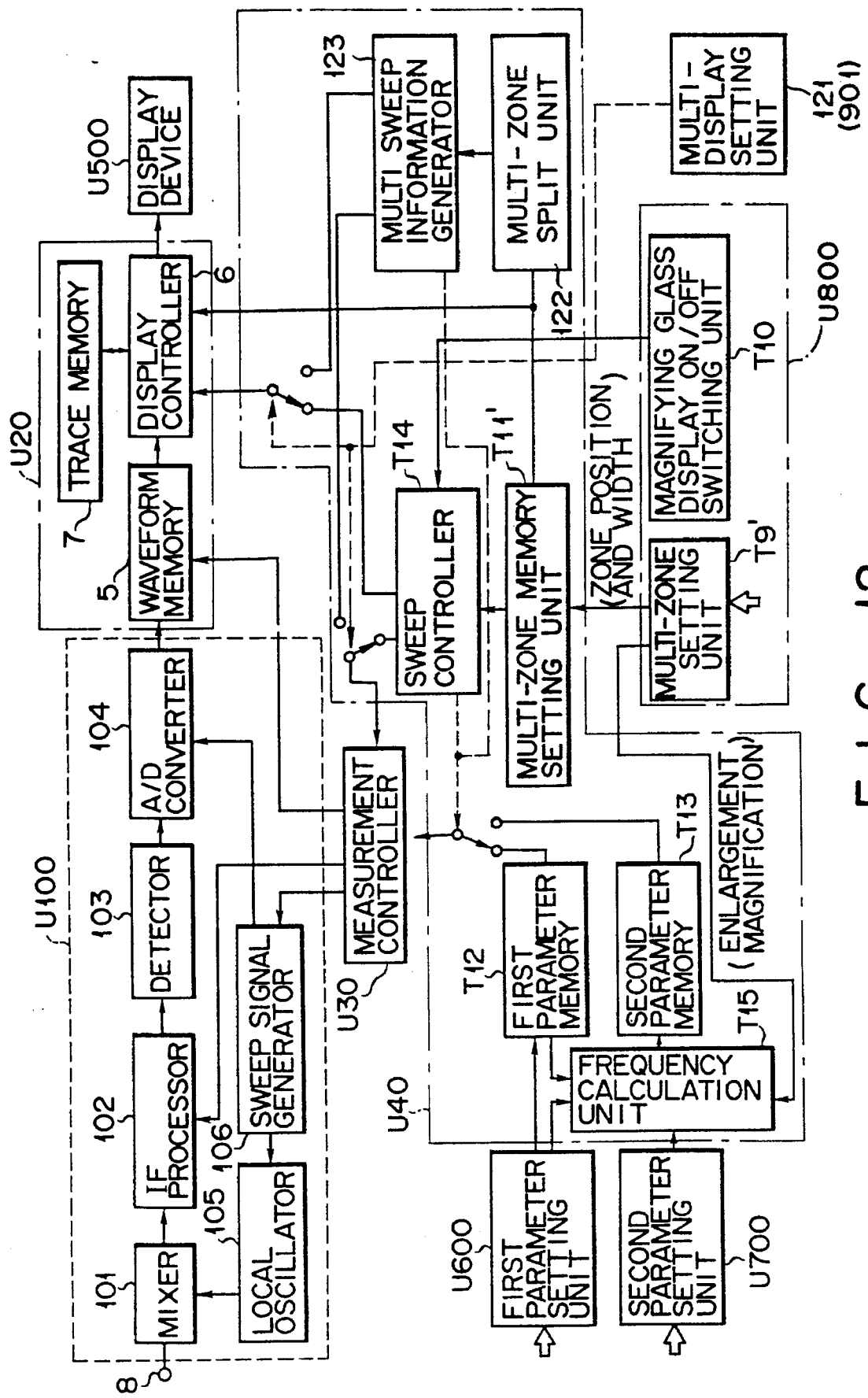
F I G. 12

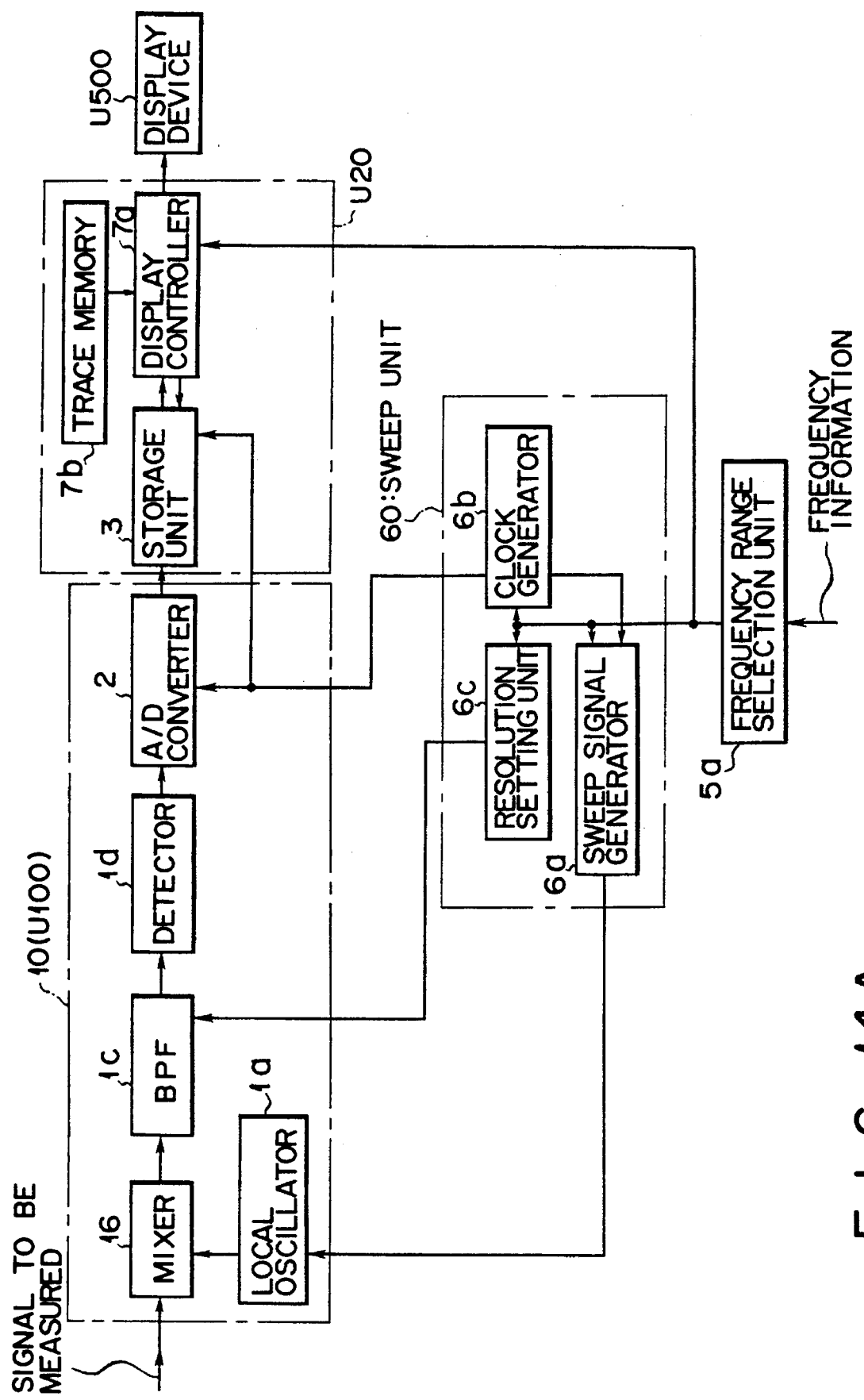
F I G. 14A

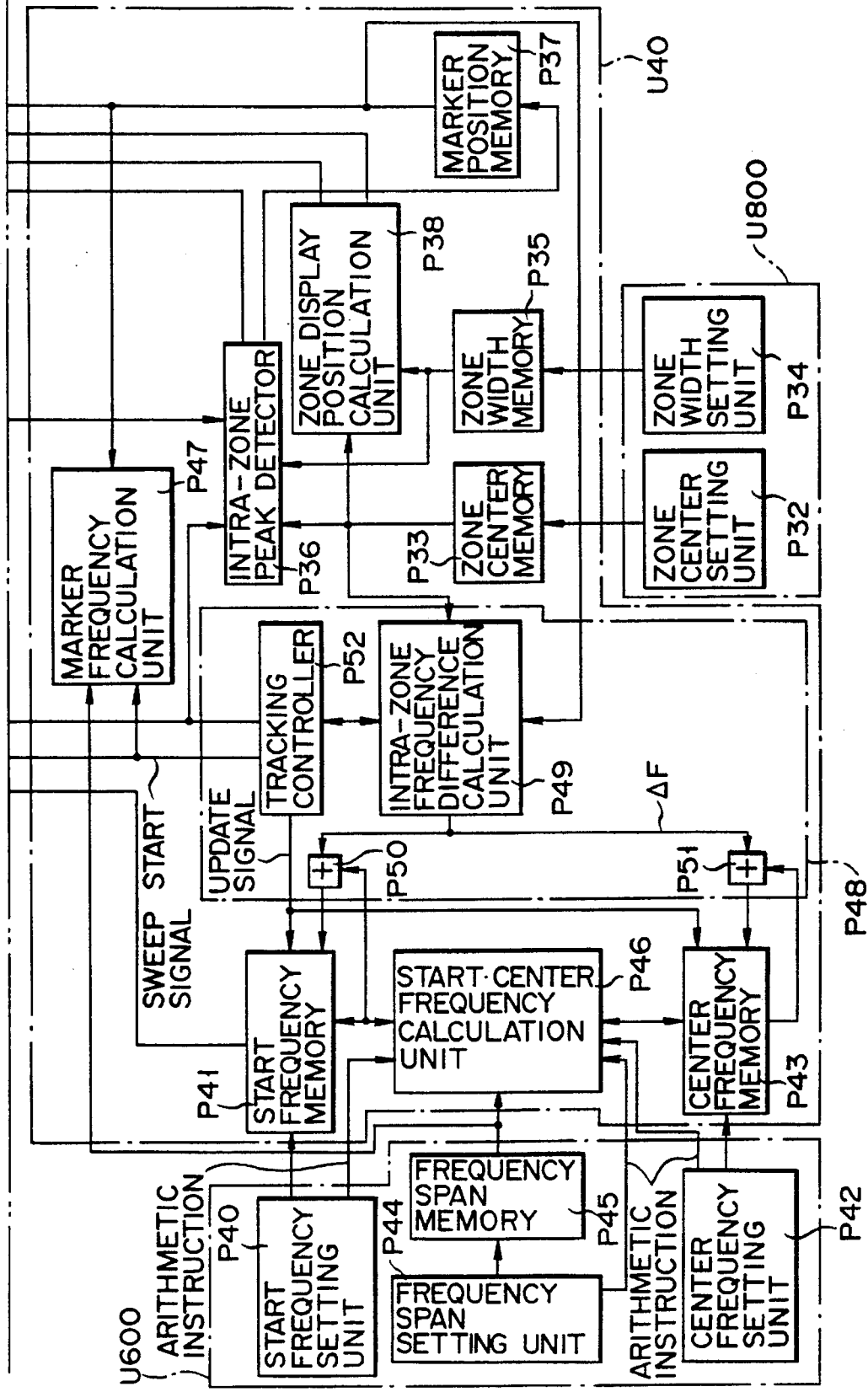
FIG. 21B-II

F I G. 33A
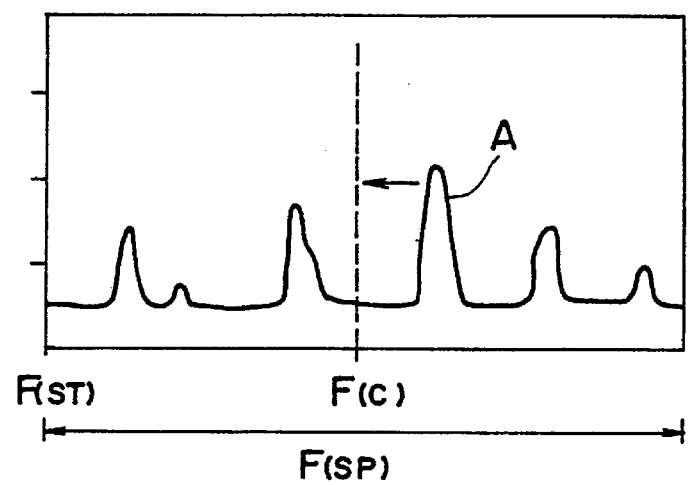
F I G. 33B
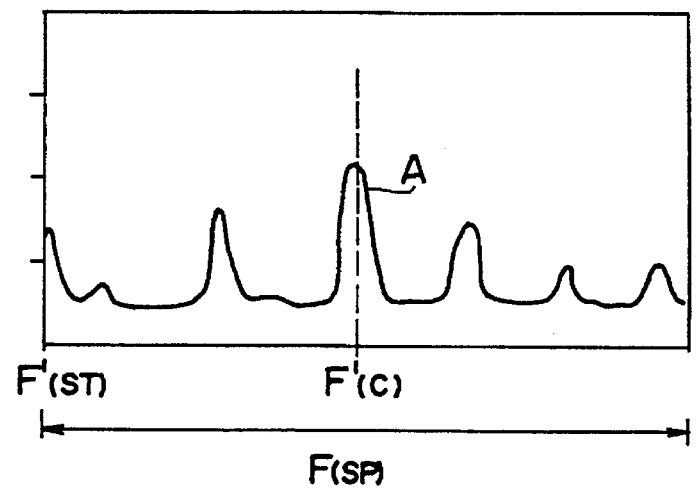

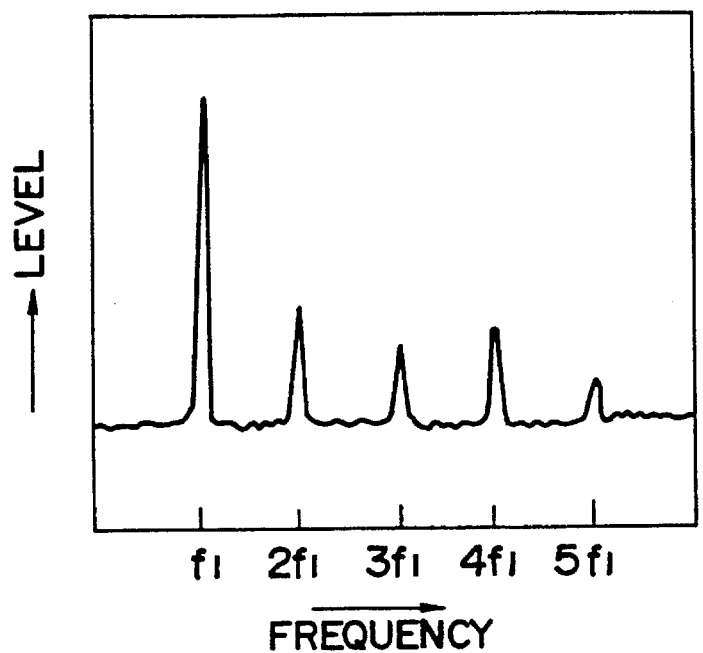
F I G. 35A
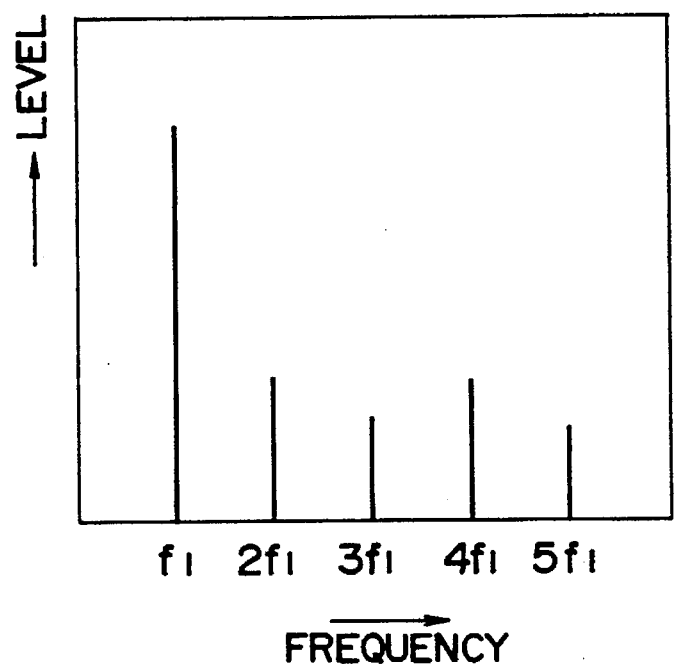
F I G. 35B

WAVEFORM DISPLAY APPARATUS OF FREQUENCY SWEEP TYPE FOR FACILITATING DISPLAY OF A HIGH DEFINITION WAVEFORM

This is a division of application Ser. No. 07/776,259 filed as PCT/JP91/00425 Mar. 30, 1991.

TECHNICAL FIELD

The present invention relates to a waveform display apparatus of a frequency sweep type including a spectrum analyzer for analyzing the spectrum of a signal, a network analyzer for analyzing the characteristic of a circuit element, and the like and, more particularly, to a waveform display apparatus which can easily perform high-definition observation of a desired peak/dip portion in a displayed waveform.

BACKGROUND ART

As is well known, a waveform display apparatus such as a spectrum analyzer, a network analyzer, or the like displays the spectrum of a signal to be measured, the transfer characteristic of a circuit element to be measured, or the like while developing it on the frequency axis.

When a waveform is observed using a waveform display apparatus of such a frequency sweep type, it is required to be able to easily provide high-definition waveform observation for a user.

However, a conventional spectrum analyzer, network analyzer, or the like cannot satisfy the above-mentioned requirement in the present state. These problems of conventional techniques will be described below taking spectrum analyzer as an example.

In general, in a spectrum analyzer, when the spectrum of an unknown signal is to be analyzed and evaluated, the level and frequency of the spectrum displayed to be developed on the frequency axis must be observed.

However, an actually displayed spectrum resolution suffers from a limitation due to, e.g., characteristics of elements constituting the spectrum analyzer. More specifically, each spectrum pattern to be observed is not always displayed by a single line segment, but has a mountain-like pattern in which a spectrum upper portion forms a moderate curve, and its lower portion is spread, although it depends on a measurement condition. The level and frequency of a maximum level point (peak) of a spectrum display having a mountain-like pattern correspond to those of a spectrum to be observed. For this reason, the maximum point of the spectrum must be searched. When some spectra are present in a narrow frequency range, and their levels and frequencies are to be measured, each spectrum must be selected, and the maximum level on a display must be detected. Furthermore, in some cases, a spectrum may be displayed to have a valley-like pattern in a direction opposite to the above-mentioned case. In this case, the level and frequency of a minimum level point (dip) correspond to those of a spectrum to be observed.

In the spectrum analyzer for analyzing the spectrum in this manner, many functions allowing convenient analysis have already been added. Since the present invention provides some of these functions, various functions of the conventional spectrum analyzer will be individually explained in different items below for the sake of easy understanding of the characteristic features of the present invention.

① Zone Marker

This function is disclosed in Japanese Patent Application, "Spectrum Analyzer"(Published Unexamined Japanese Patent Application No. 63-218869) by the same applicant (some common inventors) as the present invention. More specifically, in the zone marker function, in order to facilitate observation of a peak (dip) of a spectrum within a desired frequency range displayed on a display device, a desired frequency range in a measurement frequency region is set as a zone, the zone can be horizontally moved in the measurement frequency region, the zone width is also variable, and a peak (the top of a mountain) or a dip (the deepest bottom of a valley) is indicated by a marker. (See FIG. 25)

Thereafter, the same technique was disclosed as a U.S. Patent (U.S. Pat. No. 4,901,873).

② Zone Sweep (Partial Sweep)

This function is disclosed in Japanese Patent Application, "Spectrum Analyzer" (Published Unexamined Japanese Patent Application No. 64-9371) by the same applicant (some common inventors) as the present invention. More specifically, in order to allow high-speed observation while maintaining original performance and functions of a spectrum analyzer, a signal is analyzed by analog sweep, so that variation states of a carrier wave and a signal adjacent to the carrier wave are displayed on a single screen to be easy to see, and components to be seen can be quickly observed. That is, in the zone sweep function, a narrow range adjacent to a signal of interest within a measurement frequency region is set as a zone (see FIG. 26), and only this zone range is repetitively swept. Spectrum data obtained by sweeping the narrow range is updated. However, data outside the zone (on the right and left sides of the zone shown in FIG. 26) are stored in a memory without being updated after they are obtained by a single sweep operation, and are displayed together. In this zone sweep function, the sweep range is narrowed to provide partial, high-speed performance.

Thereafter, the same technique was disclosed as a U.S. Patent (U.S. Pat. No. 4,839,583).

③ Signal (Center) Tracking

This function is used in spectrum analyzers commercially available from U.S. companies (Type 8568 available from Hewlet-packard Corp., Type 2410 available from Tektronix Corp., and the like). These spectrum analyzers shift the frequency as the abscissa for each sweep, so that a peak point of a spectrum displayed on a screen of a CRT as a display is always located at the center of the screen. More specifically, every time a sweep operation is performed, a peak point is searched by signal (center) tracking, so that the frequency of the peak point corresponds to the center frequency (center) on the screen. (See FIG. 27)

④ Foreground (so-called FG) & Background (so-called BG) Two-frame Display

This function is disclosed in Japanese Patent Application, "Spectrum Analyzer" (Japanese Patent Application No. 2-15432; filing date Jan. 25, 1990) by the same applicant (some common inventors) as the present invention. A BG display indicates a wide-band sweep result (see a lower graph of FIG. 28), and when a desired signal within the sweep frequency range is selected by designating a zone (see the lower graph of FIG. 28), a bandwidth corresponding to the zone can be displayed as an FG display. The FG display is enlarged, as shown in an upper graph in FIG. 28. In addition, the zone designated on the BG display can be shifted, and the frequency which can be observed on the FG display can be changed in correspondence with a zone shift on the BG display.

Thereafter, the same technique was filed in U.S.A (U.S. Ser. No. 644,220; filing date Jan. 22, 1991).

⑤ Data Point Designation & Enlargement Function

As an early technique associated with a digital storage oscilloscope, "Digital Measurement Apparatus" (Published Unexamined Japanese Patent Application No. 50-6380) is known. With techniques before this technique, all the several thousands of coordinate points on a display device do not have sufficient resolution for observation. The data point designation & enlargement function is developed in consideration of this situation, and includes an "apparatus for controlling addresses and display positions of data points to be displayed on a display device in response to selected data points and a selected enlargement coefficient" so as to display data at a limited number of coordinate points at a time (in other words, to enlarge and display the data).

Thus, in the above-mentioned techniques added to a conventional spectrum analyzer, some problems remain unsolved.

First, in the conventional technique ⑤, a function of enlarging an image to be observed is realized by selecting desired data points and designating an enlargement coefficient. However, in order to compensate for insufficient functions of this technique upon actual high-definition observation of a spectrum, techniques described in items ① to ④ have been added according to requirements of users.

Of these techniques, the zone marker function ① and the zone sweep function ② will be examined below. When an observed spectrum drifts due to any cause, and falls outside the zone, the zone position must be set again. When a portion adjacent to an observed spectrum is to be enlarged, a user must instruct to change the center frequency (CENTER FREQ) by a panel operation so as to display the corresponding signal at the center of a screen of a CRT. (For example, an instruction for causing the frequency of the marker point to coincide with the center frequency must be issued.)

The signal (center) tracking function ③ will be examined below. In this function, only a portion inside a display range of a CRT screen is searched. For this reason, when a spectrum of a portion adjacent to a given signal is observed by sweeping a narrow band, the signal may abruptly drift, and may fall outside the CRT screen. In this manner, in order to search a signal in an observation disable state, a user must set a wider span (sweep frequency width) again to detect a signal to be observed, and thereafter, must narrow the span to restore an original state.

The foreground FG & background BG two-frame display function ④ will be examined below. In this function, in order to display two frame data, the display area on a panel surface of a device must be inevitably increased. That is, when the entire display area is suppressed to be reduced in scale, displayed data is not easy to see for a user. In addition, a user must set the zone position in the BG display again when a signal to be observed drifts. Furthermore, with this technique, spectrum data extends over two traces, and when data is saved or recalled, a large memory capacity is required.

On the other hand, in order to visually display spectrum components included in a measurement signal, a spectrum analyzer as shown in FIG. 29 is conventionally used.

In FIG. 29, a measurement unit P1 having a heterodyne receiver arrangement capable of sweeping a local frequency continuously sweeps and detects a predetermined frequency range of an input measurement signal, and outputs detection signals.

A waveform memory P2 updates and stores the detection signals output during one sweep operation as a series of waveform data for each sweep operation.

A display controller P3 displays waveform data stored in the waveform memory P2 on a display device P4 as a spectrum waveform to have the frequency axis as the abscissa.

A start frequency setting unit P5 sets a sweep detection start frequency of the measurement unit P1. A center frequency setting unit P6 sets a sweep detection center frequency. A frequency span setting unit P7 sets a width (span) of a sweep detection frequency.

A start.center frequency calculation unit P8 updates and sets a start or center frequency using a changed/set condition frequency with priority, so that the following relation can be established for condition frequencies from the frequency setting units P5, P6, and P7 for determining a range of the sweep detection frequency:

$$\text{Center frequency } F(c) = \text{Start frequency } F(st) + \text{Frequency span } F(sp)/2 \quad (1)$$

For example, when the start frequency is changed/set while the frequency span is fixed, the start.center frequency calculation unit P8 calculates and updates/sets a center frequency which can satisfy equation (1) for the new start frequency and the frequency span.

Therefore, a spectrum waveform is shifted by a difference in start frequency, and the same applies to a case wherein the center frequency is changed/set.

when the frequency span is changed/set while the start frequency is fixed, the spectrum waveform is displayed in an enlarged or reduced scale to have the start frequency as the center.

when the frequency span is changed/set while the center frequency is fixed, the spectrum waveform is displayed in an enlarged or reduced scale to have the center frequency as the center.

Therefore, when a spectrum waveform as shown in FIG. 30A is displayed on a screen of the display device P4, if a spectrum near the center frequency (F(c)) is to be observed in an enlarged scale, the frequency span can be decreased while the center frequency is fixed. Thus, the spectrum waveform is displayed in an enlarged scale to have the center frequency as the center, as shown in FIG. 30B.

As shown in FIG. 31(A), when a spectrum near a point a is to be observed in an enlarged scale, the spectrum waveform is shifted (by changing the start or center frequency) so that the point a is located at almost the center frequency, and thereafter, the frequency span is decreased while the center frequency is fixed. Thus, as shown in FIG. 31B, the spectrum near the point a is displayed in an enlarged scale to have the center frequency as the center, and further detailed spectrum observation is allowed.

However, as an observation mode of a spectrum analyzer, adjustment of equipment or the like is frequently performed while alternately observing the overall spectrum and an enlarged spectrum of a portion of the overall spectrum. In this case, in the conventional spectrum analyzer shown in FIG. 29, as described above, if a portion to be observed in an enlarged scale is not moved to near the center frequency, when the frequency span is changed, a target waveform may fall outside a display range. In this technique, in order to restore the enlarged waveform to an original spectrum waveform, operations must be performed in a reverse order, resulting in inconvenience.

For this reason, a marker point which is arbitrarily movable on a waveform may be provided, as has been realized in an oscilloscope, and a function (zoom function) of locating the marker point at a display center upon operation of a special-purpose enlargement key, and performing an enlarged-scale display to have the display center as the center may be utilized. However, with this technique, an enlarged waveform is fixed at the display center, resulting in inconvenience.

In the spectrum analyzer shown in FIG. 29, every time a waveform is enlarged, the frequency span and the start frequency are updated/set. Therefore, in order to display an original waveform, complicated operations are required.

As a conventional apparatus which utilizes the above-mentioned signal (center) tracking function so as to visually display a spectrum component included in a measurement signal, a spectrum analyzer as shown in FIG. 32 is known.

In FIG. 32, the same reference numerals denote the same parts as in the spectrum analyzer shown in FIG. 29, and a detailed description thereof will be omitted.

More specifically, in FIG. 32, reference numeral P10 denotes a tracking unit for preventing movement of a spectrum waveform on a screen for a measurement signal suffering from a frequency drift.

The tracking unit P10 detects an address corresponding to a maximum value of waveform data stored in a waveform memory P2 from a peak position detection unit 11, causes a frequency difference detection unit P12 to obtain the difference between a frequency corresponding to this address and the center frequency, and shifts a sweep detection frequency range by the difference.

Therefore, when a spectrum waveform as shown in, e.g., FIG. 33A is displayed on a screen of a display device P4, and the tracking unit P10 is operated, the overall spectrum waveform is shifted, so that the position of a maximum-level spectrum A is located at the center of the screen (at the position of the center frequency), as shown in FIG. 33B.

Thereafter, even when this measurement signal suffers from a frequency drift, since the sweep detection frequency range is shifted to follow this drift, the spectrum waveform can be observed while the maximum-level spectrum A is fixed at the center of the screen.

However, in the conventional spectrum analyzer as shown in FIG. 32, when a spectrum ranging from a fundamental wave having a large level to high-order harmonics having small levels is observed on a single screen like in harmonic measurement, if the above-mentioned tracking function is operated for the measurement signal, the fundamental wave is fixed at the center of the screen, and a display range of harmonics is limited to a region half the entire screen, resulting in inconvenience.

In the conventional spectrum analyzer, when the level of a spectrum to be subjected to tracking is smaller than the level of other spectra, condition frequencies (the start frequency, the frequency span, and the like) must be adjusted in advance to cause a spectrum having a large level to fall outside the sweep detection frequency range. As a result, observation on a single screen is undesirably disturbed.

A conventional spectrum analyzer having an arrangement as shown in FIG. 34 is also known. FIG. 35A shows a display example measured by the arrangement shown in FIG. 34.

A case will be explained below wherein measurement of up to 5th-order ($5f_1$) harmonic components of a signal to be measured whose fundamental wave $f_1$ is at 100 MHz, as shown in FIG. 35A, is performed using the arrangement shown in FIG. 34.

A local oscillator 1a in a measurement unit 1 outputs a frequency-swept signal to a mixer 1b according to instructions from a control unit 10a and a sweep signal generation unit 11a, and causes the mixer to convert up to 5th-order harmonic components of an input signal to be measured into intermediate-frequency (IF) signals. Therefore, the local oscillator 1a continuously frequency-sweeps the input signal to be measured over a band of almost 500 MHz. The IF signals passing through a band-pass filter (to be referred to as a BPF hereinafter) 1c are detected by a detector 1d, are converted into digital data by an A/D converter 2, and are stored in a storage unit 3 in correspondence with the swept frequencies. Data stored in the storage unit (waveform memory) 3 are displayed on a display screen of a display device 4. The data display on the display screen is made on a coordinate system defined by the abscissa as a frequency axis and the ordinate as a level axis by a predetermined total number of dots, e.g., 500 points for each of the abscissa and the ordinate.

An analysis resolution, a display resolution, and a comprehensive measurement resolution will be described below.
① Analysis resolution The analysis resolution is an index representing performance capable of analyzing adjacent signals, and is expressed by the band itself of the BPF 1c. When a measurement is performed while improving the analysis resolution, i.e., narrowing the band of the BPF 1c, the measurement S/N is also increased.

In order to perform an optimal measurement by sweeping frequencies, a transient response with respect to the velocity of an IF signal passing through the band of the BPF 1c must be taken into consideration, and this relationship is given by the following inequality:

$$(RBW)^2 > K \times BW/T \tag{1}$$

where

T: sweep time

K: constant

BW: frequency sweep bandwidth

RBW: analysis resolution (bandwidth of the BPF 1c)

Note that BW/T represents the sweep velocity.
② Display resolution of frequency axis (abscissa)

The display resolution is determined by the total number of dots on the abscissa, and the frequency sweep bandwidth.

More specifically, the display resolution=BW/(the total number of dots).
③ Example of numeric values:

If T=2 sec, BW=500 MHz, K=2, and the total number of dots=500, analysis resolution=22.54 KHz display resolution=1 MHz/dot The numeric values in this case reveal that the comprehensive measurement resolution visually observed from the display screen is determined by the display resolution, and is 1 MHz. The analysis resolution=22.4 KHz is not effective.

In general, the comprehensive measurement resolution tends to be determined by the display resolution as the frequency sweep bandwidth BW is larger, and tends to be determined by the analysis resolution as the bandwidth BW is smaller although it depends on the sweep time.

In the conventional spectrum analyzer shown in FIG. 34, when only a portion near up to 5th-order harmonic components of a signal to be measured having a fundamental wave of, e.g., 100 MHz is to be measured, the following problems are posed.

① Conventionally, since measurement is performed by continuously sweeping frequencies up to almost 500 MHz corresponding to the 5th-order harmonic component, the measurement resolution (or display resolution) near respective harmonic components of interest is low, thus often causing a measurement error.

For example, if a component other than a harmonic is present within the display resolution=1 MHz per dot in the above-mentioned numeric value example, the harmonic and other components are undesirably measured at the same time.

Since a band as wide as 500 MHz is measured, if there are many components other than harmonic components, an operation for specifying the harmonic components is necessary, resulting in inconvenience.

In order to solve the above-mentioned problems, a measurement device for making a display as shown in FIG. 35B is known.

This measurement device designates frequencies of respective harmonic components to measure the levels at the designated frequency points, and processes the data to display the data as a bar graph. In this measurement device, the above-mentioned problem 2 can be solved. However, when a signal to be measured which may include components other than harmonic components is to be measured, whether or not harmonic components are measured in practice cannot be confirmed.

As described above, in the conventional spectrum analyzers and their associated measurement techniques, high-definition waveform observation cannot be easily provided to a user, and it is an urgent subject to realize this in this field.

SUMMARY OF THE INVENTION

The present invention has been made in consideration of the above situation, and has as its first object to provide a waveform display apparatus of frequency sweep type, which can easily provide, to a user, high-definition waveform observation of a waveform displayed to be developed on the frequency axis.

It is the second object of the present invention to eliminate some problems of, particularly, a conventional spectrum analyzer shown in FIG. 29, i.e., to realize a waveform display apparatus of frequency sweep type, which can easily allow alternate observation of the overall (spectrum) waveform, and an enlarged (spectrum) waveform of the overall waveform by only an operation for changing condition frequencies, can arbitrarily set a reference position of the waveform, and hence, can easily provide high-definition waveform observation to a user.

It is the third object of the present invention to, first, simultaneously measure an adjacent (spectrum) waveform of a desired signal while observing a (spectrum) waveform over a wide band, and to, second, realize a function of measuring a desired signal to follow a frequency drift of the desired signal while realizing the first function, whereby the conventional zone marker, zone sweep, signal tracking, FG & BG two-frame display functions are improved, and inconveniences in operations are eliminated, thereby realizing a waveform display apparatus of frequency sweep type such as a spectrum analyzer, which can easily provide high-definition waveform observation to a user.

It is the fourth object of the present invention to eliminate some problems of, particularly, a conventional spectrum analyzer shown in FIG. 32, i.e., to realize a waveform display apparatus of frequency sweep type, which is free from a limitation on an observation region by tracking, can perform tracking of an arbitrary (spectrum) waveform of a large number of (spectrum) waveforms displayed on a single screen by only setting a region without adjusting the start frequency, the frequency span, and the like regardless of the level difference, or the like, from other (spectrum) waveforms, and can easily provide high-definition waveform observation to a user.

It is the fifth object of the present invention to eliminate some problems of, particularly, a conventional spectrum analyzer shown in FIG. 34, i.e., to realize a waveform display apparatus of frequency sweep type, which can measure a plurality of specified adjacent frequencies as objects to be measured, e.g., adjacent harmonic components with a high resolution while recognizing objects to be measured, and can easily provide high-definition waveform observation to a user.

In order to achieve the first object, according to the first aspect of the present invention, there is provided a waveform display apparatus of frequency sweep type, comprising:

a measurement unit for measuring a signal to be measured by sweeping a frequency under a predetermined measurement frequency condition so as to obtain waveform data corresponding to the frequency;

a display device for displaying the waveform data obtained by the measurement unit by developing the waveform data on the frequency axis;

condition setting means for setting and changing the predetermined measurement frequency condition; and control means for controlling the measurement unit and the display device so as to display, waveform data displayed by the display device before the condition is changed, as waveform data high-definition displayed at a predetermined magnification to have a predetermined point on the frequency axis as a center after the condition is changed, in accordance with the measurement frequency condition set and changed by the condition setting means.

The first aspect can be realized by (basic arrangement) of embodiments to be described later.

In order to achieve the second object, according the second aspect of the present invention, there is provided a first waveform display apparatus for sweeping and detecting a measurement signal within a predetermined frequency range, and displaying a detection output for each sweep operation as a series of (spectrum) waveforms on a screen, comprising:

a plurality of condition frequency setting means for respectively changing and setting at least two condition frequencies for determining a sweep detection frequency range performed for the measurement signal;

reference position setting means for setting a reference position at an arbitrary position along a frequency axis of the screen; and frequency calculation means for, when at least one of the condition frequencies is changed, calculating the other condition frequency for making a frequency at the reference position equal to a frequency before the condition frequency is changed, and updating and setting the calculated condition frequency in the corresponding condition frequency setting means.

A second waveform display apparatus according to the second aspect of the present invention, comprises, in addition to the arrangement of the first waveform display apparatus:

setting means for detecting a frequency representing a feature point of a waveform on the screen;

frequency difference calculation means for calculating a frequency difference between the frequency at the feature point and the frequency at the reference position; and frequency correction means for correcting a new condition frequency calculated by the frequency calculation means by the frequency difference, and updating and setting the corrected condition frequency in the corresponding condition frequency setting means.

Therefore, according to the waveform display apparatus of the second aspect, for example, when the frequency span as a condition frequency is changed, the start frequency as the other condition frequency is calculated and updated while the frequency at the reference position is equal to that before the frequency span is changed, and a display range of a spectrum waveform is changed to have the reference position as the center.

According to the waveform display apparatus of the second aspect, in addition to the above feature, the display range of the spectrum waveform is changed, so that the frequency at the feature point of the waveform coincides with the reference position.

The third aspect of the present invention is directed to an apparatus (e.g., a spectrum analyzer) for analyzing a signal, and displaying its (spectrum) waveform and, more particularly, to a waveform display apparatus of frequency sweep type such as a spectrum analyzer, which quickly designates a desired (spectrum) waveform of (spectrum) waveforms displayed on a display screen, and can display the designated portion in an enlarged scale at that position. Therefore, the third aspect of the present invention is directed to a spectrum analyzer which displays an adjacent spectrum of a desired signal in an enlarged scale while directly observing a wideband spectrum, and can analyze and measure the spectrum. Since a waveform display apparatus according to the third aspect of the present invention enlarges a desired signal at a desired position on a wide-band spectrum, it can be referred to as a waveform display apparatus having a function of a magnifier such as a magnifying glass on a display screen.

More specifically, the waveform display apparatus according to the third aspect of the present invention comprises means for realizing a function A to be referred to as a magnifying glass display function, and a function B to be referred to as a zone tracking function in place of a signal tracking function so as to eliminate the drawbacks of the prior arts. These characteristic functions A and B will be described hereinafter.

A. Magnifying Glass Display (See FIG. 37)

A lower graph of FIG. 37 shows a zone marker function of the prior art ①. Portions inside and outside a set zone (a rectangle in FIG. 37) have the same scale (scale factor) on the abscissa.

In contrast to this, the magnifying glass display of the present invention comprises means for setting a scale factor of a set zone on the abscissa independently of the scale factor of the overall display. The magnifying glass display also comprises separate memories for storing parameters set by the above-mentioned means. In addition, means for arithmetically controlling a display on a display device using these parameters is arranged. With these means, the abscissa of the overall display is graduated in units of 5 MHz per cm, while the abscissa inside the set zone can be graduated in units of 1 MHz per cm. The meaning of a decrease in scale factor in the zone is the same as enlargement of the scale, and the same effect as that for observing a displayed image via a magnifying glass as a magnifier can be obtained. More specifically, a narrow range (a broken rectangle) within a zone marker (a solid rectangle) in the lower graph of FIG. 37 is displayed in an enlarged scale, as indicated by ⓑ in the upper graph of FIG. 37 showing the magnifying glass display. On portions Ⓐ and Ⓒ on two sides of the zone Ⓑ, non-enlarged images are displayed.

The following three sweep methods may be proposed so as to make a display as shown in the upper graph of FIG. 37, and any one of these methods may be employed. (i) Portions Ⓐ, Ⓑ, Ⓒ are separately swept, and are displayed to have the same trace when they are displayed. (ii) Portions Ⓐ and Ⓒ including a portion overlapping the portion are continuously swept, and data obtained by this sweep operation, and data obtained by sweeping the portion Ⓑ are displayed to overlap each other. (iii) Only the portion Ⓑ is swept, and data obtained by the previous sweep operation and already stored in a memory are read out and used as data of the portions Ⓐ and Ⓒ.

In any one of these sweep methods, a desired one frequency (e.g., a frequency at the center of the zone, or a frequency at a peak or dip in the zone) in the set zone in an enlarged image coincides at one point with a frequency of an image before enlargement (since the enlarged image appears on the foreground side of the zone, the image before enlargement corresponds to an image on the background side of the zone). This respect can also provide the same relationship as that when an object is observed through a magnifying glass.

The magnifying glass display function A is realized by inventions described in the second embodiment to be described later.

B. Zone Tracking (See FIGS. 38A and 38B)

This function will be described below with reference to FIG. 38A. This function is used for following a zone, so that a feature point (e.g., normally a peak point, but may be a dip point) of a spectrum waveform in the zone is always displayed at the predetermined position (normally, the central point of the zone) of the zone in the magnifying glass display described in the above paragraph A. This function is realized by comprising intra-zone feature point detection means, arithmetic means for calculating parameters for performing zone tracking, and means for updating parameters in a memory with the parameters calculated by the arithmetic means.

FIG. 38A shows a case wherein the magnifying glass function is operated (ON state), and an image inside a zone indicated by a solid rectangle is enlarged. If movement of the waveform in this image is large in the zone, the zone is followed by zone tracking. Although the waveform in the zone is enlarged, since variations in frequency at two ends for determining the zone are determined by the scale factor of the overall image, the movement of the zone is small for an observer.

When the magnifying glass display function is set in an OFF state by switching a switch (see FIG. 38B), the overall waveform can be observed while one point of a frequency in the zone conincides with that of the overall image.

Since the present invention comprises means for realizing the above-mentioned magnifying glass display function A, parameters for a display within a set zone can be set independently of those for the overall display, and various functions can be added. These functions are as follows.

(1) An enlarged image at a desired position can be display without changing one point on the frequency axis (without movement in position) while observing the overall image.

(2) Since setting parameters within a zone can be processed as independent ones, an image can be enlarged in a desired scale.

(3) When the position of a zone is changed, since one point on the frequency axis described in item (1) is not moved, the moving amount of the position of the zone appears as a difference in the scale on the abscissa for the overall display, i.e., a frequency difference, and a display within the zone is scrolled by a moving amount proportional to a reciprocal number of a ratio of the scale factor (an enlargement ratio of the scale). Therefore, paying attention to the waveform within the zone, when the zone is moved, the actual moving amount of the zone is inversely proportional to the enlargement ratio of the scale, and an observer feels as if an image within the zone moved quickly.

(4) A trace within the zone can be displayed as a trace continuous with the overall trace. Unlike in the FG & BG two-frame display function, both the portions inside and outside the zone can be displayed as one frame by one trace. Since a one-trace display can be made, the capacity of a memory necessary for saving or recalling trace data can be reduced, and for example, maximum value holding (MAXHOLD) processing, and average ratio processing (AVERAGE) can be easily executed. In addition, a substantially two-channel display for simultaneously displaying traces in different detection modes can be easily executed.

Furthermore, since the present invention comprises means necessary for realizing the zone tracking function B in addition to the magnifying glass display function A, (1) if a tracking error occurs when the magnifying glass display function is in an ON state, the magnifying glass display function can be turned off to immediately display the overall waveform, and a signal can be easily captured again;

(2) a drift width of a desired signal to be observed can be directly read on the scale on the abscissa for the overall display as a moving amount of the zone;

(3) upon comparison between the zone tracking function of the present invention and the conventional signal tracking function, when a signal falls outside a screen, a wide frequency span must be set again to detect a signal again in the signal tracking function, while in the "zone tracking" function, since a spectrum in a wide band is displayed on the entire screen, the signal can be easily captured again by only turning on/off the magnifying glass display function;

(4) in the conventional signal tracking function, since a waveform is always displayed at the center of the screen, a frequency drift width of a signal cannot be intuitively grasped, while in the zone tracking function of the present invention, the drift width can be detected as movement of the zone;

(5) if the conventional signal tracking function is applied to an image inside the zone, a waveform can always be displayed at the center of the zone without changing the position of the zone; and (6) if a plurality of zones are set, and the magnifying glass display function, zone tracking function, or intra-zone signal tracking function is applied, a plurality of enlarged waveforms can be observed at a time.

In order to achieve the fourth object, according to the fourth aspect of the present invention, there is provided a waveform display apparatus for sweeping and detecting a measurement signal within a predetermined frequency range, and displaying a detection output for each sweep operation as a series of (spectrum) waveforms on a screen, comprising:

region setting means for setting a region having an arbitrary width at an arbitrary position along a frequency axis of the screen;

specific point position detection means for detecting a position of a specific point of a (spectrum) waveform displayed within the region; and tracking means for calculating a frequency difference between a reference position within the region and the position of the specific point, and shifting the sweep detection frequency range by the frequency difference to cause the position of the specific point to be closer to the reference position.

Therefore, in the waveform display apparatus according to the fourth aspect of the present invention, even when the frequency of a specific point within a region set at an arbitrary position on the screen is changed, since the sweep detection frequency range is shifted to follow the change, the position of the specific point is not deviated from a reference position. In addition, since the detection range of the specific point is limited to a portion within the region, if a specific point (e.g., a peak point) is present outside the region, it can be ignored.

The fifth aspect of the present invention is directed to a (spectrum) waveform display apparatus which selects (spectrum) waveforms near a plurality of frequency components of those of a signal to be measured, and simultaneously displays the spectrum waveforms of the respective measured frequency components on individual display regions obtained by dividing one display screen by the number of the plurality of frequency components in a direction of abscissa (frequency axis).

In particular, the fifth aspect of the present invention is directed to a (spectrum) waveform display apparatus which is convenient for a case wherein, in, e.g., a spectrum analyzer, when only harmonic components of an unknown signal to be measured are to be measured, waveforms near the respective harmonic components must be separated from components other than the harmonic components by increasing a resolution, and only the harmonic components must be reliably and quickly measured, and a case wherein when a specific harmonic component due to a distortion of a signal output from an electronic circuit such as a signal generator, or the like is adjusted, a state of a change in harmonic component including another fundamental wave must be simultaneously observed in an enlarged scale.

In the waveform display apparatus according to the fifth aspect of the present invention, when a signal to be measured includes frequency components over a wide band, specific frequency components and waveform near these components can be quickly observed with a high resolution.

In order to achieve the fifth aspect, the waveform display apparatus according to the fifth aspect of the present invention comprises the following frequency range selection means, sweep means, and display means in a spectrum display apparatus for measuring and displaying the spectrum of a signal to be measured.

The frequency range selection means selects a plurality of frequency ranges between upper and lower limits of a frequency range to be measured. As a typical example, when a harmonic component is to be measured, the means selects predetermined frequency ranges ($2\Delta f$, $10\Delta f < 5f_1$) to have frequencies ($f_1$, $2f_1$, $3f_1$, $4f_1$, $5f_1$ in the order from the lower ones) of first- to fifth-order harmonic components of frequency components of a signal to be measured as the centers on the basis of the fundamental wave $f_1$ of the signal to be measured. The predetermined frequency range $2\Delta f$ is a range to be frequency-swept near each harmonic component.

The sweep means respectively sweeps only the plurality of frequency ranges ($f_1 \pm \Delta f$, $2f_1 \pm \Delta f$, $3f_1 \pm \Delta f$, $4f_1 \pm \Delta f$, $5f_1 \pm \Delta f$) at a higher resolution than a measurement resolution when a measurement is continuously performed from the lower limit to the upper limit (the conventional apparatus requires at least a band of $5f_1$).

The display means simultaneously displays spectra in the plurality of frequency range obtained by the sweep operations.

Furthermore, the fifth aspect of the present invention is characterized by further comprising a data selection unit in addition to the above-mentioned means.

More specifically, during a measurement, a sweep velocity when the plurality of frequency ranges are swept is decreased to increase the number of data to be obtained (to increase the total number of dots on the abscissa), and the data selection unit selects the predetermined number of data of spectra of the plurality of frequency ranges in each frequency range, converts them into the predetermined total number of dots on the abscissa, and outputs the converted data.

Furthermore, according to the fifth aspect of the present invention, in addition to the above-mentioned features, the S/N can be further increased since a measurement is performed by increasing the number of data (the total number of dots on the abscissa). If the total number of dots for a display remains the same, the comprehensive measurement resolution is left unchanged.

In the typical example, if the conventional apparatus requires a band of $5f_1$ to measure up to a 5th-order harmonic component, its display resolution is $5f_1$/the total number of dots, while the display resolution attained by the fifth aspect of the present invention is $10\Delta f$/the total number of dots. Therefore, the display resolution can be improved $f_1/2\Delta f$ times that of the conventional apparatus, and an effective value of the analysis resolution can be increased correspondingly. Since ranges near desired frequencies ($f_1 \pm \Delta f$, $2f_1 \pm \Delta f$, $3f_1 \pm \Delta f$, $4f_1 \pm \Delta f$, $5f_1 \pm \Delta f$) can be measured in this state, the S/N can be increased as well as an improvement of performance for discriminating a desired signal and other signals.

In addition, according to the fifth aspect of the present invention, a plurality of desired signals including adjacent spectra can be simultaneously observed on a single screen.

According to the fifth aspect of the present invention, although the display resolution is left unchanged, since the measurement resolution can be increased, the S/N can be increased accordingly.

BRIEF DESCRIPTION OF THE DRAWINGS

FIG. 9B is a chart showing an operation flow of the modification of the second embodiment;

FIGS. 11A, 11B, and 11C, and FIG. 12 are respectively background and principle views, and block diagrams of the third embodiment of the present invention;

FIGS. 14A and 14B are block diagrams showing an arrangement according to the fourth embodiment of the present invention;

FIGS. 33A and 33B show display examples by the apparatus shown in FIG. 32;

FIGS. 35A and 35B show conventional display examples; and

FIGS. 36 to FIGS. 38A and 38B are views showing display examples according to the second embodiment of the present invention.

BEST MODE FOR CARRYING OUT THE INVENTION (Basic Arrangement)

Figure 1:
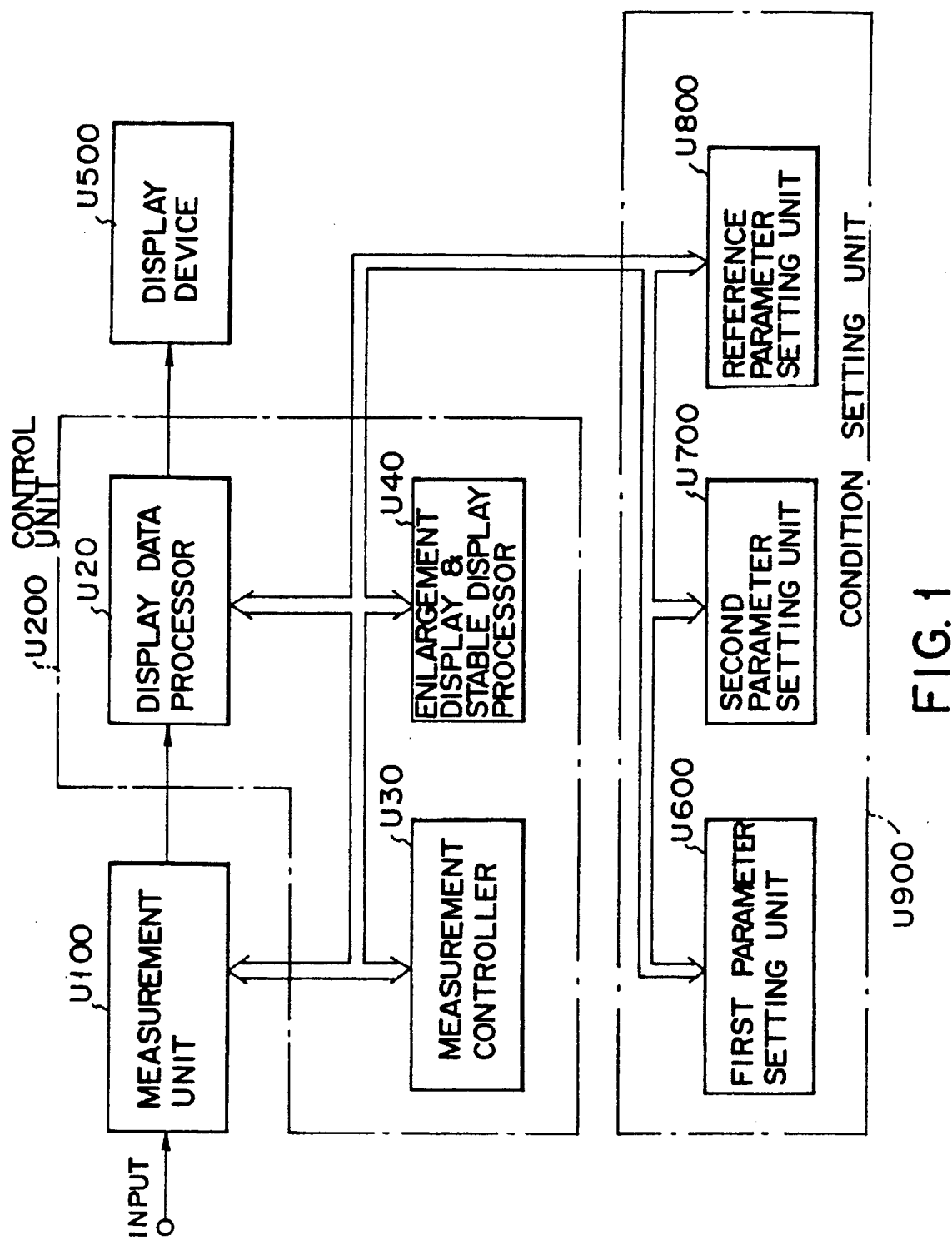
FIG. 1 is a block diagram showing a basic arrangement of a waveform display apparatus according to the present invention.

FIG. 1 shows a basic arrangement of a waveform display apparatus according to the present invention.

More specifically, a measurement unit U100 measures an input signal to be measured by sweeping frequencies within a measurement range of a predetermined frequency band so as to obtain waveform data developed on a frequency axis such as spectrum data in, e.g., a spectrum analyzer. Waveform data obtained by measurement in the measurement unit U100 is displayed by a display device U500 via a display data processor U20 included in a control unit U200 (to be described later) so as to be developed on the frequency axis of the display device, i.e., in correspondence with the measurement frequencies.

The control unit U200 comprises a measurement controller U30 for controlling the measurement unit U100 to display waveform data obtained by enlarging or reducing waveform data before conditions are changed at a predetermined magnification to have a predetermined point on the frequency axis as the center on the basis of changes in conditions of the measurement frequencies set by a condition setting unit U900, and an enlargement display/stable display processor U40 for controlling the above-mentioned display data processor U20. Note that the enlargement display/stable display processor U40 controls high-definition waveform observation as the gist of the present invention, and has a function of substantially controlling the display device U500 as the control unit U200.

The condition setting unit U900 comprises first and second parameter setting units U600 and U700 for selectively setting conditions consisting of the start frequency, the stop frequency, the center frequency, the frequency span, and the like associated with a measurement (sweep) range, and conditions associated with a display scale factor on the frequency axis of the display device U500 to desired values so as to set and change the measurement frequency conditions, and also comprises a reference parameter setting unit U800 for selectively setting conditions associated with a zone and a predetermined point (position) to be set on the frequency axis of the display device U500 to desired values.

The detailed arrangements and embodiments of the above-mentioned units will be described in the first to fifth embodiments to be described later. As shown in this basic arrangement, the present invention finally has the common basic concept of displaying waveform data obtained by enlarging or reducing original display waveform data at a predetermined magnification to have a predetermined point on the frequency axis of the display device U500 as the center, thereby easily providing high-definition waveform observation to a user.

Note that the predetermined magnification includes not only an enlargement magnification but also a reduction magnification, and of course, includes a magnification 1 as an intermediate magnification of the above magnifications since the present invention is achieved under the condition that waveform data to be displayed is suitable for observation with high definition.

Figure 2:
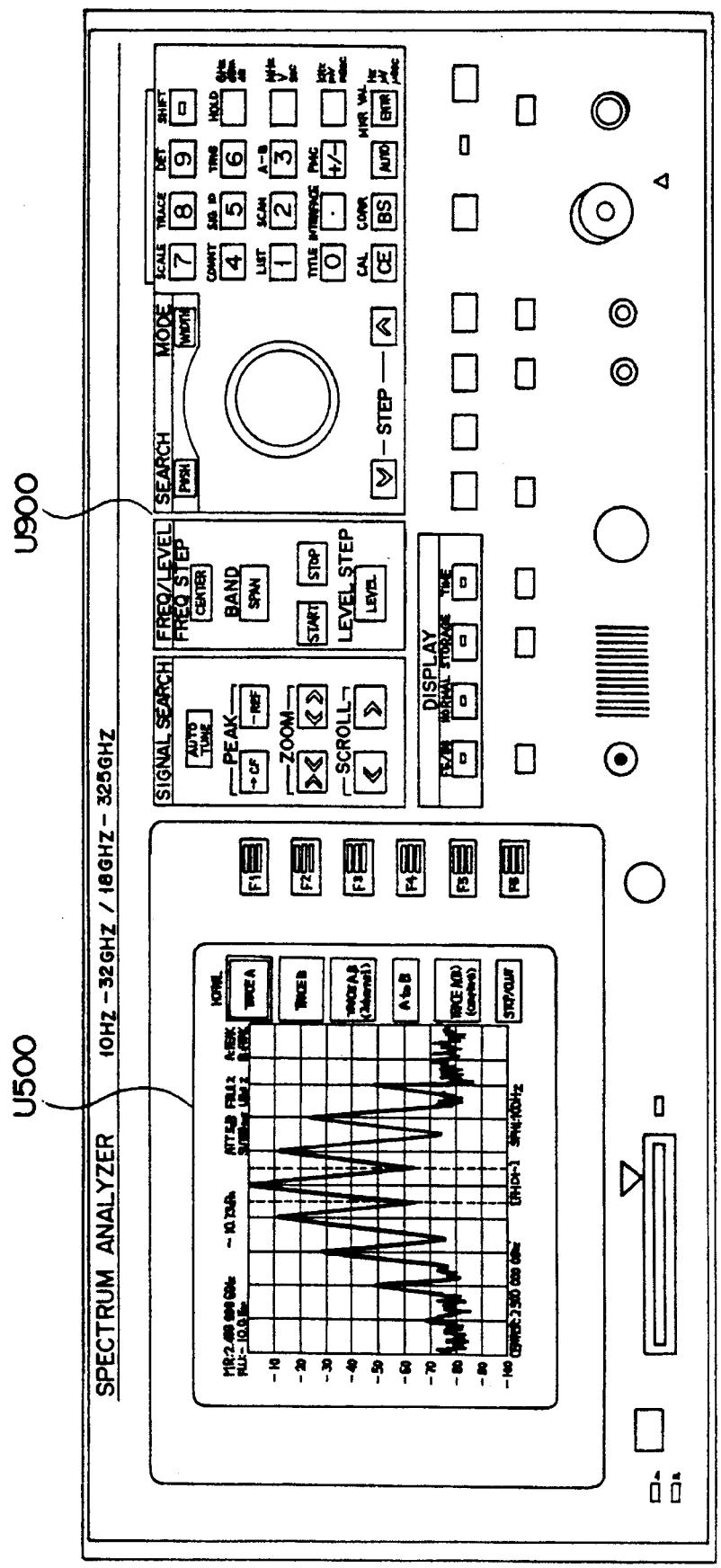
FIG. 2 is a schematic view of a spectrum analyzer to which the waveform display apparatus according to the present invention is applied.

FIG. 2 is a view showing an outer appearance of a spectrum analyzer realized by the basic arrangement, and illustrates the display device U500 for displaying a spectrum waveform at the predetermined magnification, and various operation members U900 for executing respective measurement.display functions of the first to fifth embodiments to be described later.

(First Embodiment: Zoom Function)

A zoom (ZOOM) function according to the first embodiment of the present invention will be described below with reference to the accompanying drawings.

Figure 3A:
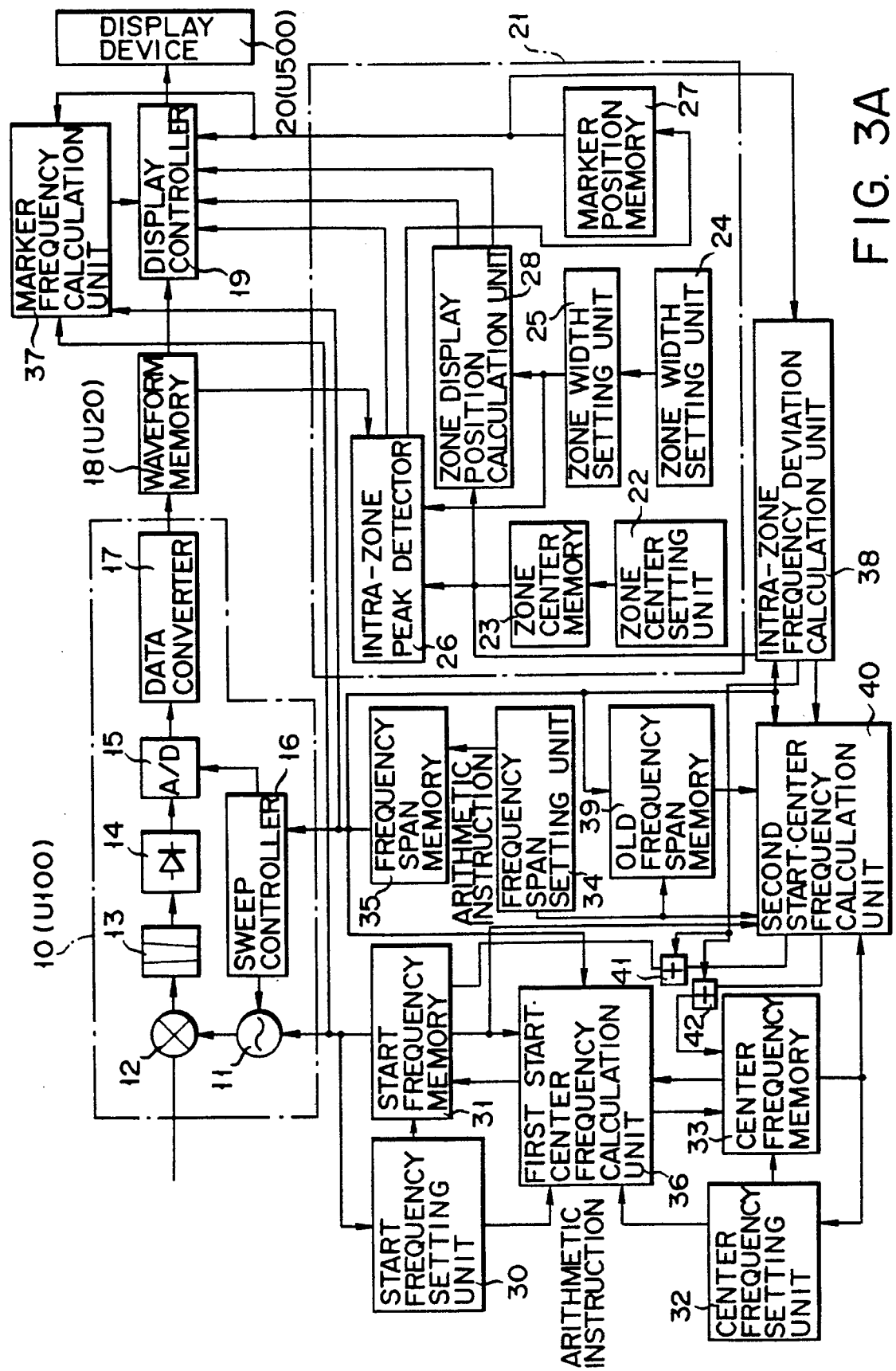
FIGS. 3A and 3B are block diagrams showing an arrangement according to the first embodiment of the present invention.

FIG. 3A is a block diagram showing a schematic arrangement of a spectrum analyzer according to the first embodiment.

Figures 1, 3B:
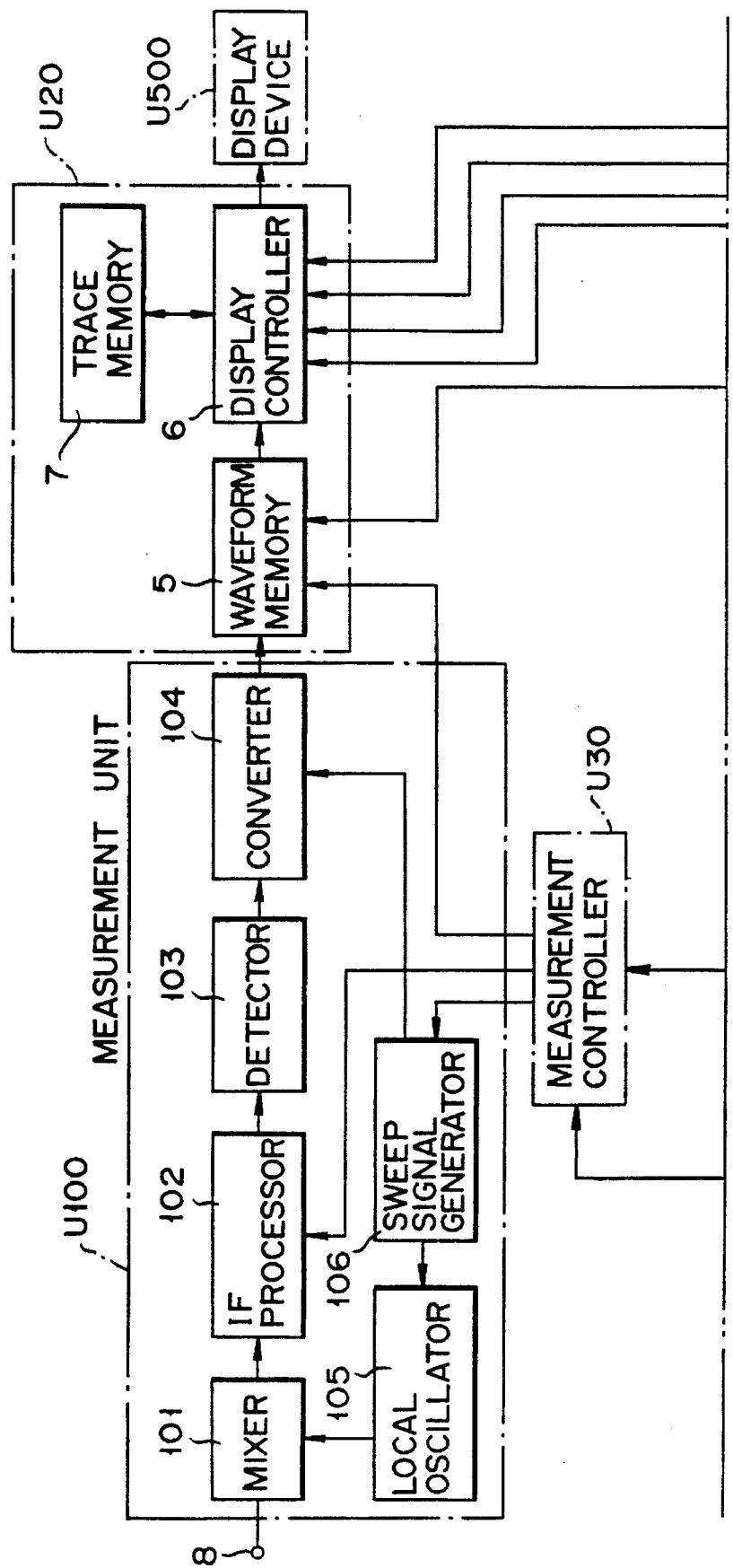

FIG. 3B is a block diagram showing FIG. 3A in more detail in correspondence with the basic arrangement shown in FIG. 1. The same reference numerals denote the same parts as in FIG. 1 and FIG. 3A, and a detailed description thereof will be omitted.

In FIG. 3A, reference numeral 10 denotes a measurement unit of this spectrum analyzer. The measurement unit 10 causes a mixer 12 to mix a measurement signal with a local oscillation signal from a local oscillator 11 capable of performing a sweep operation, causes a detector 14 to detect a signal passing through a band-pass filter 13 having a predetermined frequency, and causes an A/D converter 15 to output the detection signal as spectrum values (data) in units of frequencies. Note that the sweep frequency range of the local oscillator 11 is determined by the amplitude of a sweep signal from a sweep controller 16, and an offset voltage.

A data converter 17 performs correction processing of data from the A/D converter 15, and stores the corrected data in a waveform memory 18.

The waveform memory 18 has, e.g., 500 addresses, and the A/D converter 15 is assumed to output 500 spectrum data for each sweep operation.

A display controller 19 causes a display device 20 to display the data stored in the waveform memory 18 together with another display information to be described later as a series of spectrum waveforms.

A zone marker setting unit 21 displays and sets a zone having an arbitrary width at an arbitrary position on the frequency axis, and displays a marker at a peak point of a waveform within the zone.

A zone center setting unit 22 is a portion for setting zone center information serving as a reference position in a zone center memory 23. A zone width setting unit 24 is a portion for setting zone width information in a zone width memory 25.

An intra-zone peak detector 26 detects maximum data present within a set zone range of data stored in the waveform memory 18, and outputs its level and position data (address value) as a marker level and marker position data.

A marker position memory 27 stores the marker position data, and a zone display position calculation unit 28 calculates the display position of the zone.

A start frequency setting unit 30 is a portion for setting a sweep detection start frequency in the measurement unit 10 in a start frequency memory 31. A center frequency setting unit 32 is a portion for similarly setting a sweep detection center frequency in a center frequency memory 33. A frequency span setting unit 34 is a portion for setting a frequency span in a frequency span memory 35.

A first start.center frequency calculation unit 36 calculates a start frequency or a center frequency of a sweep detection frequency of the measurement unit 10 on the basis of condition frequencies set in these memories 31, 33, and 35. More specifically, when the start frequency is changed/set while the frequency span is fixed, the first start.center frequency calculation unit 36 updates/sets the content of the center frequency memory 33 to satisfy the above-mentioned equation (1). Contrary to this, when the center frequency is changed/set, the unit 36 updates/sets the content of the start frequency memory 31.

A marker frequency calculation unit 37 calculates a marker frequency on the basis of the start frequency, the frequency span, and the marker position.

In a calculation of the marker frequency calculation unit 37, a value obtained by dividing the frequency span with the number of display points (500 in this case) is multiplied with the marker position data, and the product is added to the start frequency, thus obtaining the marker frequency.

An intra-zone frequency deviation calculation unit 38 calculates the difference between the zone center frequency as a frequency at the reference position, and the marker frequency, and calculates a frequency deviation in such a manner that a zone center frequency obtained by adding, to the start frequency, a value obtained by dividing the frequency span with the number of display points, and multiplying zone center position data with the quotient is subtracted from the marker frequency.

An old frequency span memory 39 stores a frequency span previously set in the frequency span setting unit 34 when a new frequency span is set in the frequency span setting unit 34.

A second start-center frequency calculation unit 40 outputs a new start frequency and center frequency on the basis of the start frequency, the center frequency, the frequency span, and the old frequency span stored in the memories 31, 33, 35, and 39 when the frequency span setting unit 34 changes/sets the frequency span.

The second start.center frequency calculation unit 40 calculates a new start frequency $F(st)_N$ with reference to a zone center frequency $F(zc)$ on the basis of an old start frequency $F(st)_O$, an old frequency span $F(sp)O$, and a new frequency span $F(sp)_N$ by the following equation:

$$F(st)_N = F(zc) - (F(zc) - F(st)_O) \times (F(sp)_N / F(sp)_O) \quad (2)$$

In addition, a new center frequency $F(c)_N$ with reference to the zone center frequency $F(zc)$ is calculated on the basis of an old center frequency $F(c)_O$ by the following equation:

$$F(c)N = F(zc) - (F(zc) - F(c)_O) \times (F(sp)_N / F(sp)O) \quad (3)$$

A frequency correction unit 41 corrects the new start frequency and the hew center frequency calculated by the second start.center frequency calculation unit 40 by the frequency deviation from the intra-zone frequency deviation calculation unit 38. The new start frequency and the new center frequency corrected by the frequency correction unit 41 are respectively set in the start frequency memory 31 and the center frequency memory 33.

An operation of this spectrum analyzer will be described below.

Figure 4A:
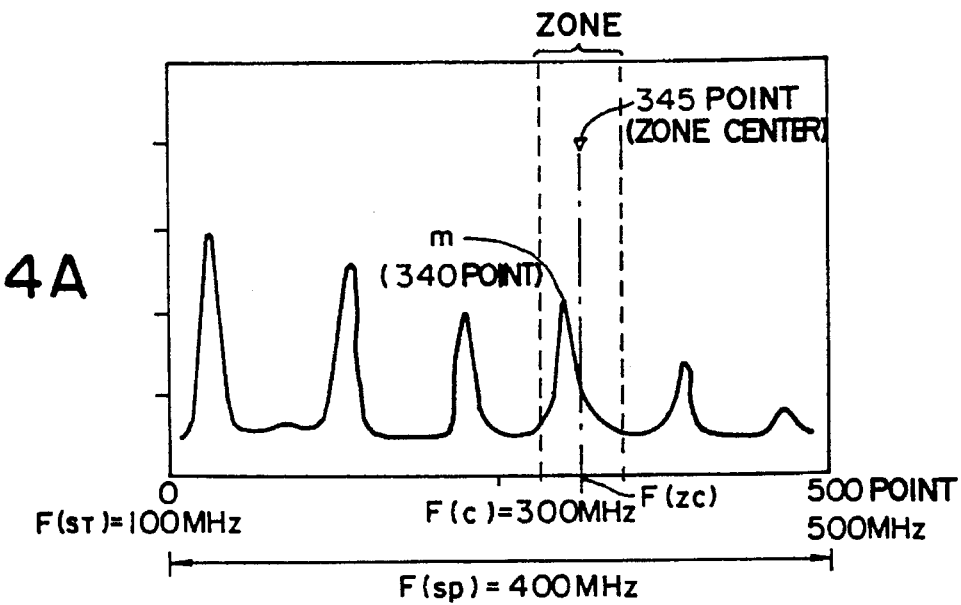
FIGS. 4A, 4B, and 4C show display screen data for explaining operations of FIGS. 3A and 3B.

For example, when a measurement signal is observed in a state wherein the start frequency=100 MHz, the frequency span=400 MHz, and the zone center position corresponds to a display point=345, a spectrum wave-form as shown in FIG. 4A is displayed on the display device 20, and a marker point m indicating the peak point within the zone is displayed at the position of a display point=340.

A marker frequency F(m) at this time is given by:

$$F(m) = 100 + (400/500) \times 340 = 372 (MHz)$$

A zone center frequency F(zc) is given by:

$$F(zc) = 100 + (400/500) \times 345 = 376 (MHz)$$

A frequency deviation ΔF between these frequencies is 4 MHz.

When the frequency span is changed/set to 100 MHz, the second start.center frequency calculation unit 40 calculates a new start frequency and a new center frequency as follows according to the above-mentioned equations (2) and (3):

New Start Frequency $F(st)_N = 375 - (376 - 100) \times 100/400 = 307 (MHz)$

New Center Frequency $(F(c)_N = 376 - (376 - 300) \times 100/400 = 357 (MHz)$

These calculated frequencies are respectively corrected by the frequency deviation ΔF (=−4 MHz), and are respectively set in the start frequency memory 31 and the center frequency memory 33.

Figure 4B:
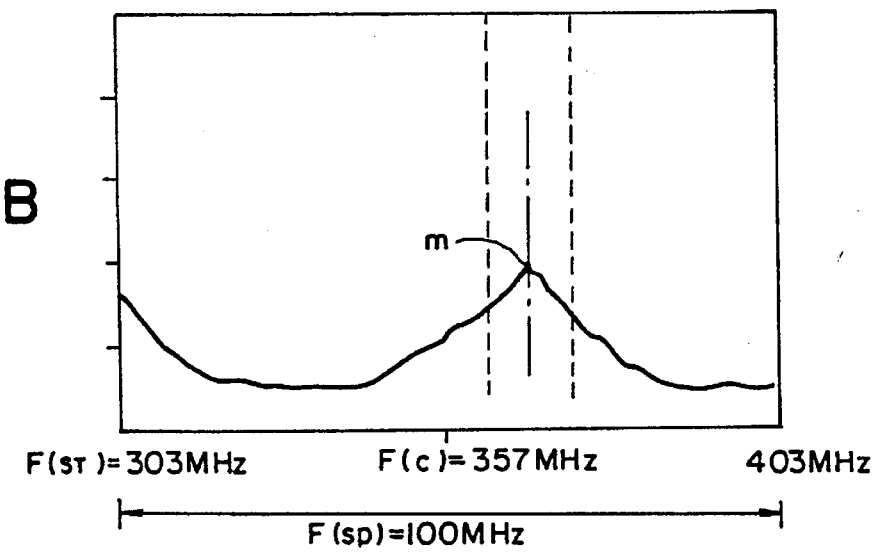

For this reason, the local oscillation frequency of the local oscillator 11 is controlled, so that the sweep reception range of the measurement unit 10 is changed from 303 MHz to 403 MHz, and a spectrum displayed on the display device 20 is displayed in an enlarged scale at a ×4 magnification to have the zone center as the reference position as the center, as shown in FIG. 4B.

In this case, since the marker frequency and the zone center frequency are corrected by the frequency correction units 41 and 42, they are expected to coincide with each other on the screen, but may not always coincide with each other due to a variation of a measurement signal or the linearity of the local oscillator 11. However, since this frequency correction is performed every time the frequency span is changed, a portion to be enlarged will not fall outside a display range.

Upon this change of the frequency span, the zone center frequency becomes 372 (MHz) by calculating:

$$303 + (100/500) \times 345$$

Figure 4C:
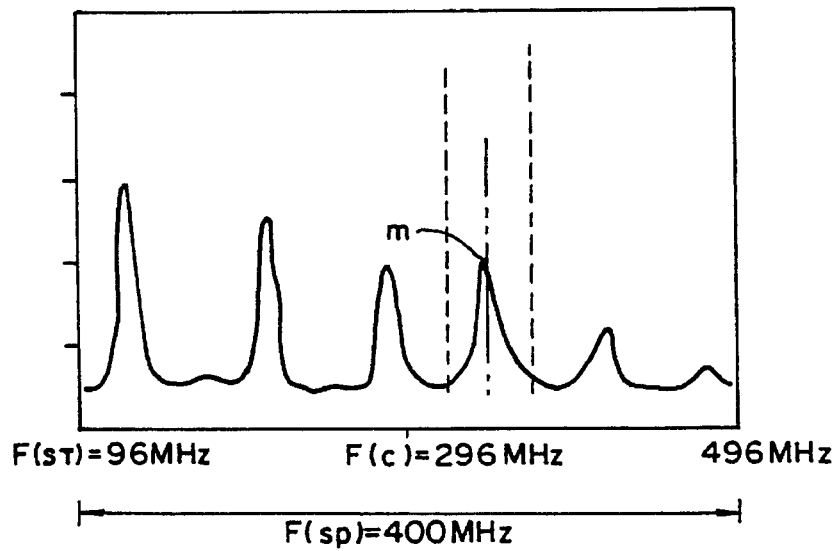

When the frequency span is reset to 400 MHz from this state (to have the frequency deviation ΔF=0), the start frequency= 96 MHz, and the center frequency=296 MHz are set, as shown in FIG. 4C, and are shifted by 4 MHz from the original waveform. However, this shift is negligible in relation to the frequency span, and does not pose a problem in actual observation.

This zone can be set at an arbitrary position on the display screen. When the zone center is set to surround the peak point of a waveform to be enlarged, and the frequency span is switched, the waveform which is enlarged to have the zone center as the center can be observed. When the frequency span is reset to an original value, the original entire waveform can be observed.

Figure 5:
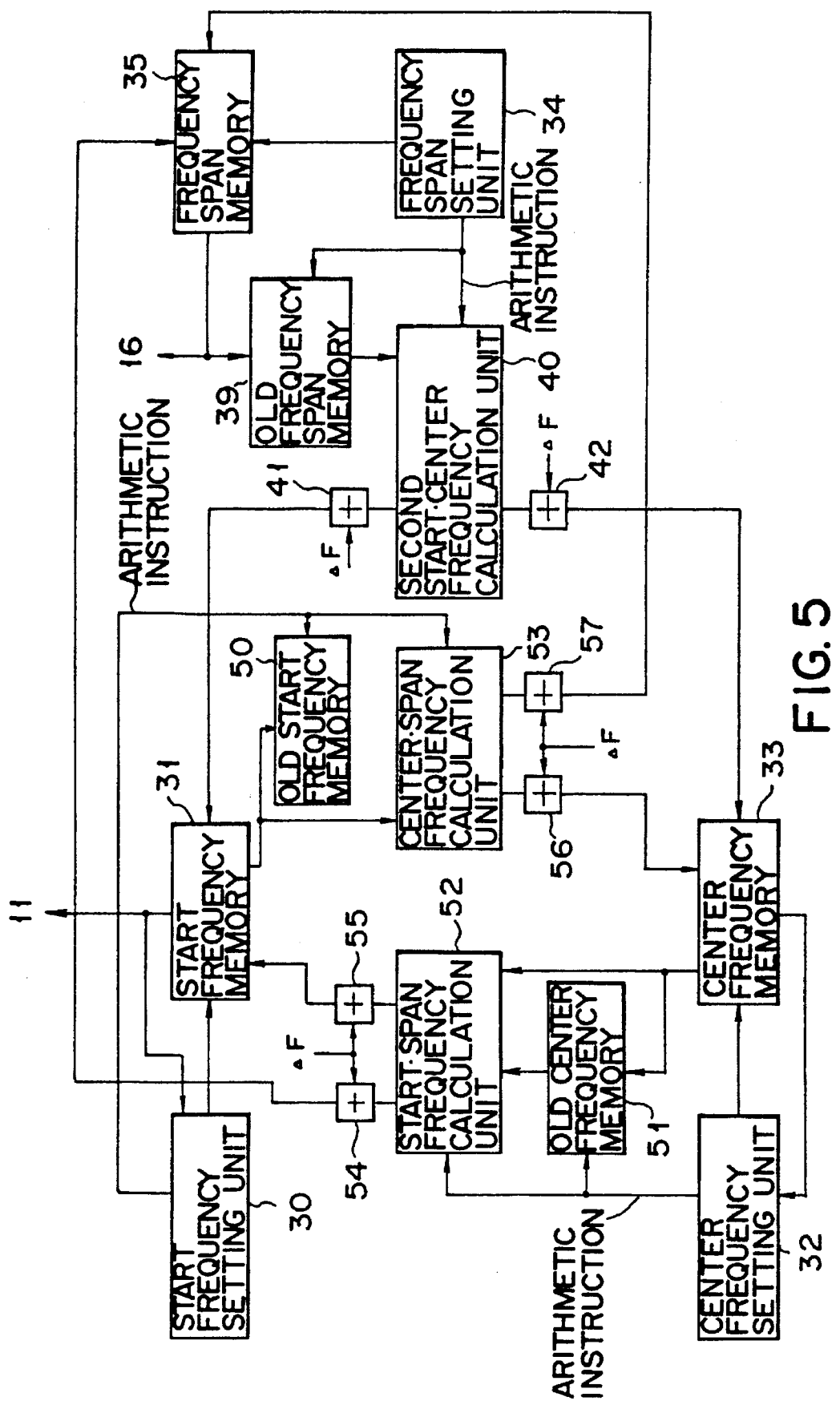
FIG. 5 is a principal part block diagram for explaining a modification of the first embodiment of the present invention.

In this embodiment, when the frequency span is changed/ set, the start frequency and the center frequency are automatically updated to have the zone center as the reference position as the center, and when the start frequency and the center frequency as other condition frequencies are changed, the sweep detection frequency range is merely shifted like in the conventional apparatus. However, as shown in FIG. 5, an old start frequency memory 50, an old center frequency memory 51, a start.span frequency calculation unit 52, a center.span frequency calculation unit 53, and respective frequency correction units 53 to 57 may be arranged, so that even when the start frequency or the center frequency is changed, enlargement or reduction can be reversibly performed to have the zone center as the center.

In this case, the start.span frequency calculation unit 52 calculates a new start frequency and a new frequency span as follows:

$$F(st)_N = F(st)_O + (F(zc) - F(st)_O) \times A$$

$$F(sp)_N = F(sp)_O \times A$$

(for $A = (F(zc) - F(c)_N)/(F(zc) - F(st)_O)$)

These calculated values are corrected by a frequency deviation (ΔF) by the frequency correction units 54 and 55, and are set in the corresponding memories.

The center.span frequency calculation unit 53 calculates a new center frequency and a new frequency span as follows:

$$F(c)_N = F(c)_O + (F(zc) - F(c)_O) \times B$$

$$F(sp)_N = F(sp)_O \times B$$

(For $B = (F(zc) - F(st)_N)/(F(zc) - F(st)_O)$)

These calculated values are corrected by a frequency deviation ($\Delta F$) by the frequency correction units 56 and 57, and are set in the corresponding memories.

Therefore, even when any one of condition frequencies, i.e., the start frequency, the center frequency, or the frequency span is changed, enlargement or reduction having the zone center as the reference position as the center can be performed.

In the above embodiment, the frequency axis is changed to have the zone center as the reference position. However, the present invention is not particularly limited to the zone center. There is no essential difference even when the frequency axis is changed to have the left or right end of the zone as the reference position. In addition, in a spectrum analyzer which does not have a zone marker function, and manually sets a marker point, the frequency axis may be changed to have the marker point as the reference position.

Figure 6:
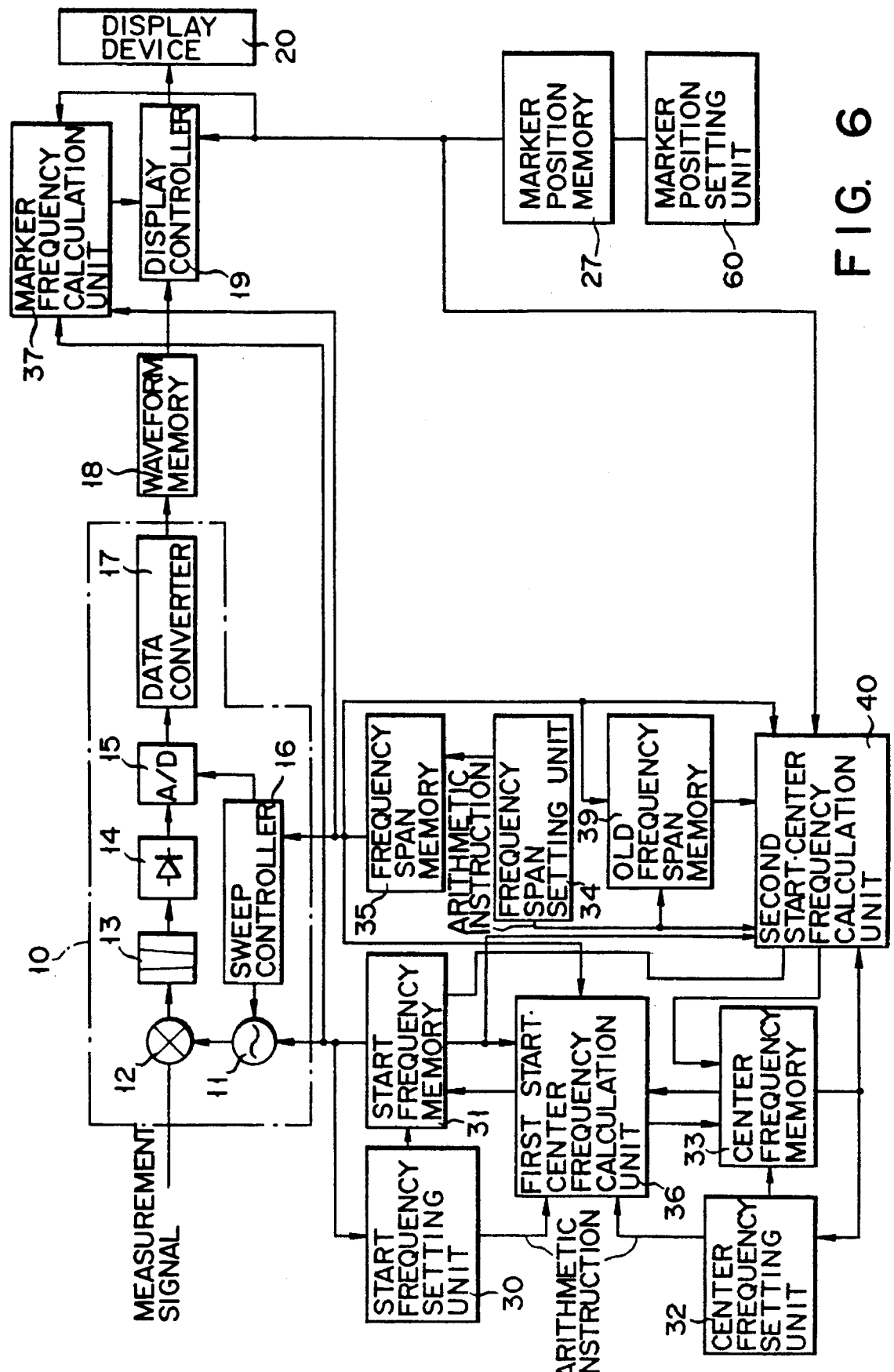
FIGS. 6 and 7 are block diagrams showing arrangements of other modifications of the first embodiment of the present invention.

In this case, as shown in FIG. 6, a marker position setting unit 60 for variably setting a marker position is arranged, a frequency at the marker is input to the second start.center frequency calculation unit 40 in place of a zone center frequency, and the calculated new start frequency and center frequency can be respectively set in the corresponding memories, thus allowing enlargement/reduction of a spectrum waveform to have the marker point as the reference.

Figure 7:
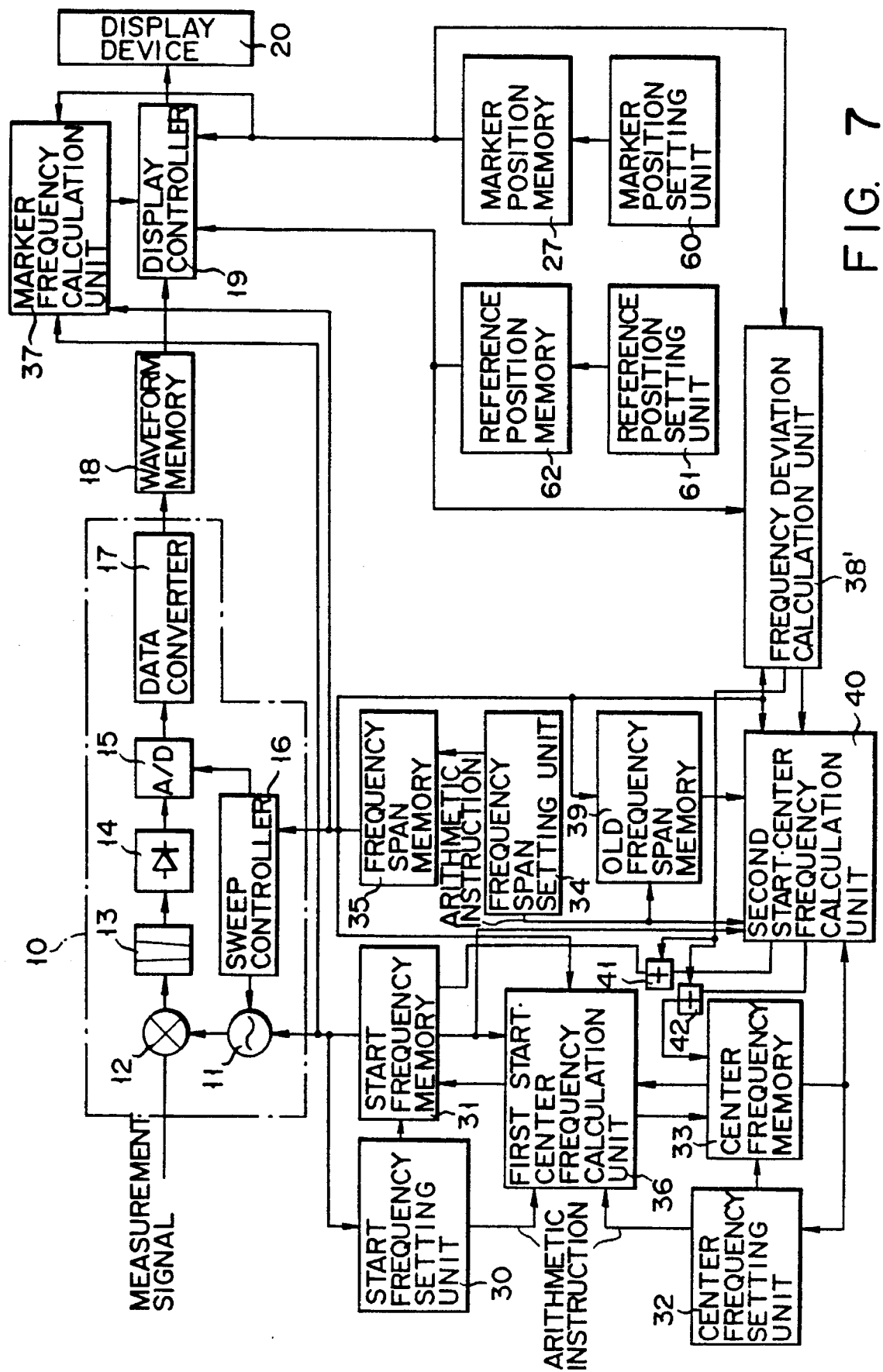

As shown in FIG. 7, a value set from a reference position setting unit 61 in a reference position memory 62 may be input to a frequency deviation calculation unit 38' in place of a zone center, so that the position of a manually moved marker point can be largely moved to the preset reference position of the display screen upon changing of the frequency span. In the spectrum analyzer according to the first embodiment of the present invention, as described above, since enlargement/reduction on the frequency axis can be performed while the frequency at the reference position set on the screen is fixed, the entire spectrum waveform, and a spectrum waveform obtained by enlarging a portion of the entire waveform (by the ZOOM function) can be easily alternately observed by only changing the condition frequencies, and the reference position can be set at an arbitrary position, resulting in a very easy-to-use apparatus.

Since a marker position can be close to the reference position by a change operation of the condition frequencies, operability can be greatly improved.

Note that portions in FIG. 3B which do not correspond to FIG. 3A will be described later in the second and subsequent embodiments by denoting them by the same reference numerals as in FIG. 3A.

(Second Embodiment: Magnifying Glass Display Function)

A magnifying glass display function according to the second embodiment of the present invention will be described below.

Figure 8:
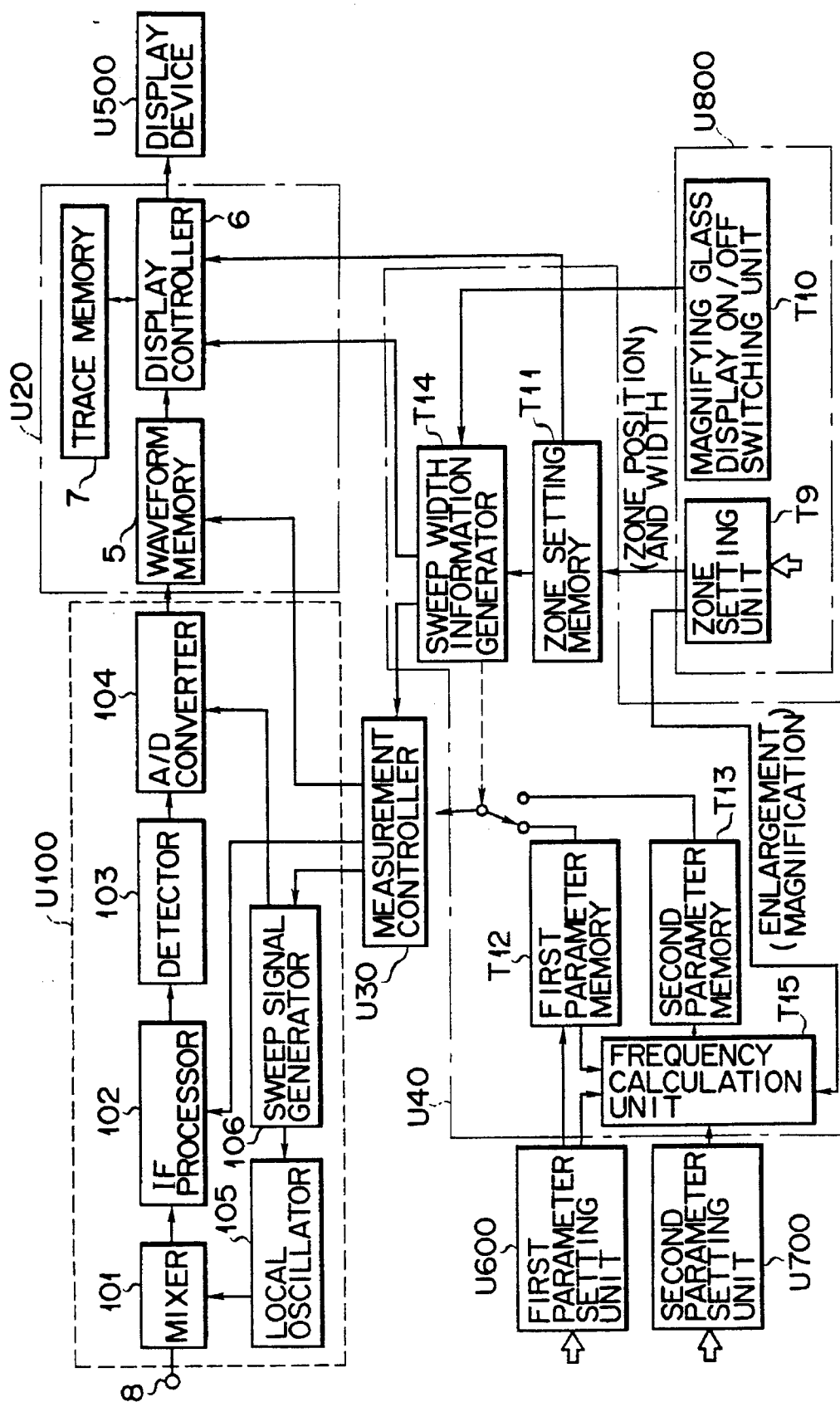
FIG. 8 is a block diagram showing an arrangement according to the second embodiment of the present invention.

FIG. 8 is a block diagram showing an arrangement of a spectrum analyzer according to the second embodiment in correspondence with the basic arrangement shown in FIG. 1.

A measurement unit U100 of this spectrum analyzer is arranged, as shown in FIG. 8. More specifically, the measurement unit U100 causes a mixer 101 to mix an input signal to be measured from an input terminal 8 with a signal from a local oscillator 105 so as to convert the input signal into an intermediate frequency signal IF, and causes a detector 103 to perform level detection via an IF processor 102 as an intermediate frequency circuit. In addition, the unit U100 sends digital (spectrum waveform) data obtained by converting the level-detected signal into a digital signal by an analog.digital (A/D) converter 104 to a waveform memory 5 included in a display data processor U20 of the next stage. On the other hand, a measurement controller U30 sweeps the frequency of the local oscillator 105 via a sweep signal generator 106 by a desired band so as to sweep a signal within a frequency region to be measured, and as a result, an input signal to be measured is measured by the measurement unit U100.

The waveform memory 5 which received the digital (spectrum waveform) data corresponding to the input signal to be measured from the measurement unit U100 of the spectrum analyzer stores the digital data as the levels of the input signal to be measured in correspondence with the measurement frequencies, and outputs the stored data to display them on a display device U500 (for example, on a CRT screen). Upon reception of the output signal from the waveform memory 5, the display device U500 displays a spectrum on the display screen. This control is performed by a display controller 6 and a trace memory 7 included in the display data processor U20. Control for the measurement unit U100 and the waveform memory 5 is performed by the measurement controller U30. The arrangement and operation described so far are the same as the known technique.

According to the present invention, a first parameter setting unit U600 for setting parameters for operating the spectrum analyzer is arranged. The first parameter setting unit U600 is used by a user to set parameters, e.g., a total frequency range (a center frequency and a frequency span), units of the scale (scale factor) of the display screen, a resolution bandwidth (RBW), a video bandwidth (VBW), and the like. Parameters set by the first parameter setting unit U600 are stored in a first parameter memory T12 included in an enlargement display/stable display processor U40 as needed.

In order to determine a magnifying glass display range, a zone setting unit T9 for setting a zone is arranged in a reference parameter setting unit U800, and sets the center position and width of the zone. These data are stored in a zone setting memory T11. The zone center position serves as an enlargement central position in the magnifying glass display.

Furthermore, a second parameter setting unit U700 is arranged, and sets a scale factor (or magnification) to be displayed in an enlarged scale. The position on the frequency axis as the center of enlargement is as one characteristic feature of the present invention, and represents coinciding points between an enlarged wave-form and a non-enlarged waveform (foreground and background waveforms). Based on these three parameters or the data set by the zone setting unit T9, a frequency parameter for sweep-displaying a waveform with the [scale factor set by the second parameter setting unit U700] without changing the position on the frequency axis is calculated by a frequency calculation unit T15, and the calculation result is stored in a second parameter memory T13.

Data from the first and second parameter memories T12 and T13, and the zone setting memory T11 are consequently used in control by the measurement controller U30 or the display controller 6, as shown in FIG. 8.

As described above, in the arrangement of the second embodiment, a portion for setting an arbitrary one frequency within a measurement frequency region of a waveform displayed at the first scale factor corresponds to the second parameter setting unit U700 in the embodiment shown in FIG. 8, and a portion for setting the second scale factor also corresponds to the second parameter setting unit U700, but may be realized by the zone setting unit T9. A control unit for enlarging a waveform at the intra-zone scale factor as compared to a waveform outside the zone is constituted by the frequency calculation unit T15, the second parameter memory T13, and the display controller 6 shown in FIG. 8 in addition to the measurement controller U30.

Figure 37:
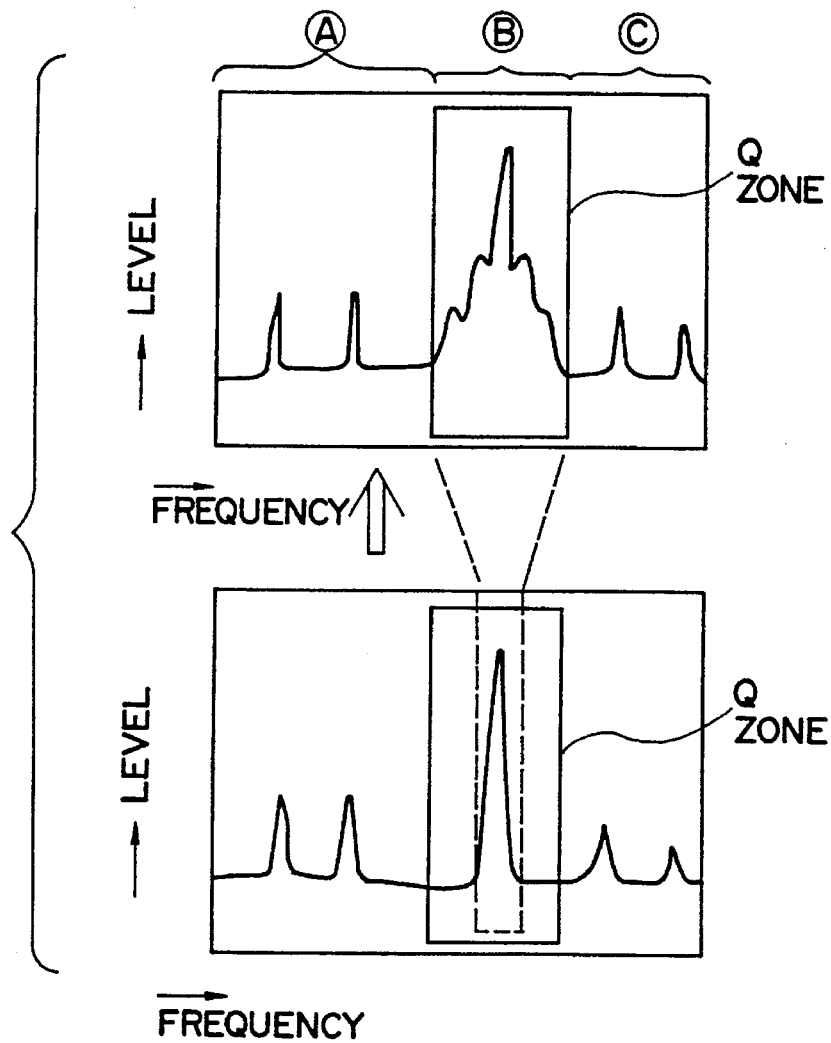
Figure 38A:
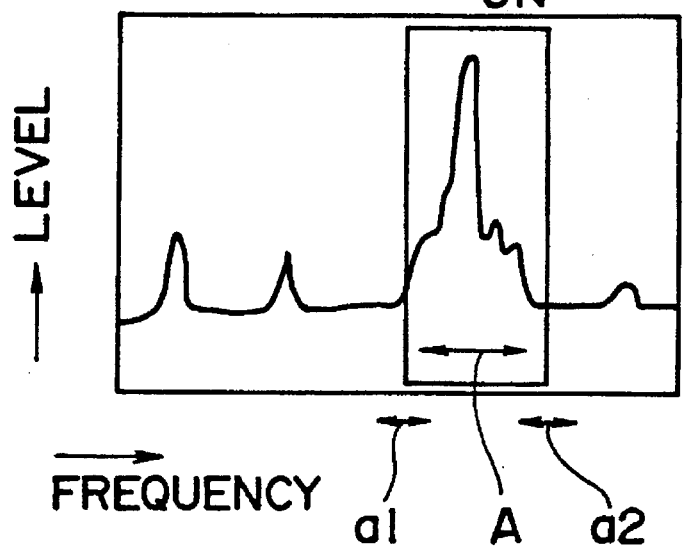
Figure 38B:
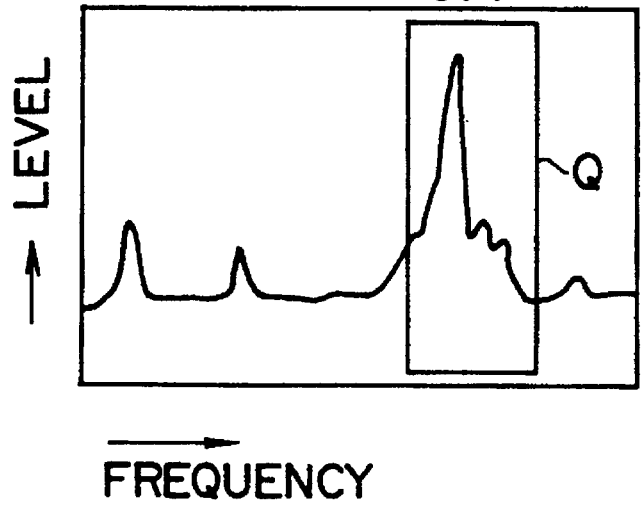

As has been described above with reference to FIG. 37, a sweep operation of the magnifying glass display function includes three different sweep methods. These methods will be described below in correspondence with the above arrangement. Parameters set by the first parameter setting unit U600 are those for sweeping portions corresponding to Ⓐ and Ⓒ in FIG. 37, i.e., for sweeping the overall signal. Parameters set by the second parameter setting unit U700 are those for sweeping a signal inside the zone set as a portion Ⓑ in FIG. 37. A sweep width information generator T14 controls sweep operations of the portions Ⓐ, Ⓑ, and Ⓒ in FIG. 37. Based on zone information set by the zone setting unit 9, the generator controls sweep start frequencies of the portions Ⓐ, Ⓑ, and Ⓒ in FIG. 37. The display controller 6 can have its principal function of arranging the portions Ⓐ, Ⓑ, and Ⓒ in FIG. 37 as one trace, and controlling to display a zone, and can also have a function of performing scroll processing of a waveform inside the zone.

Figure 10:
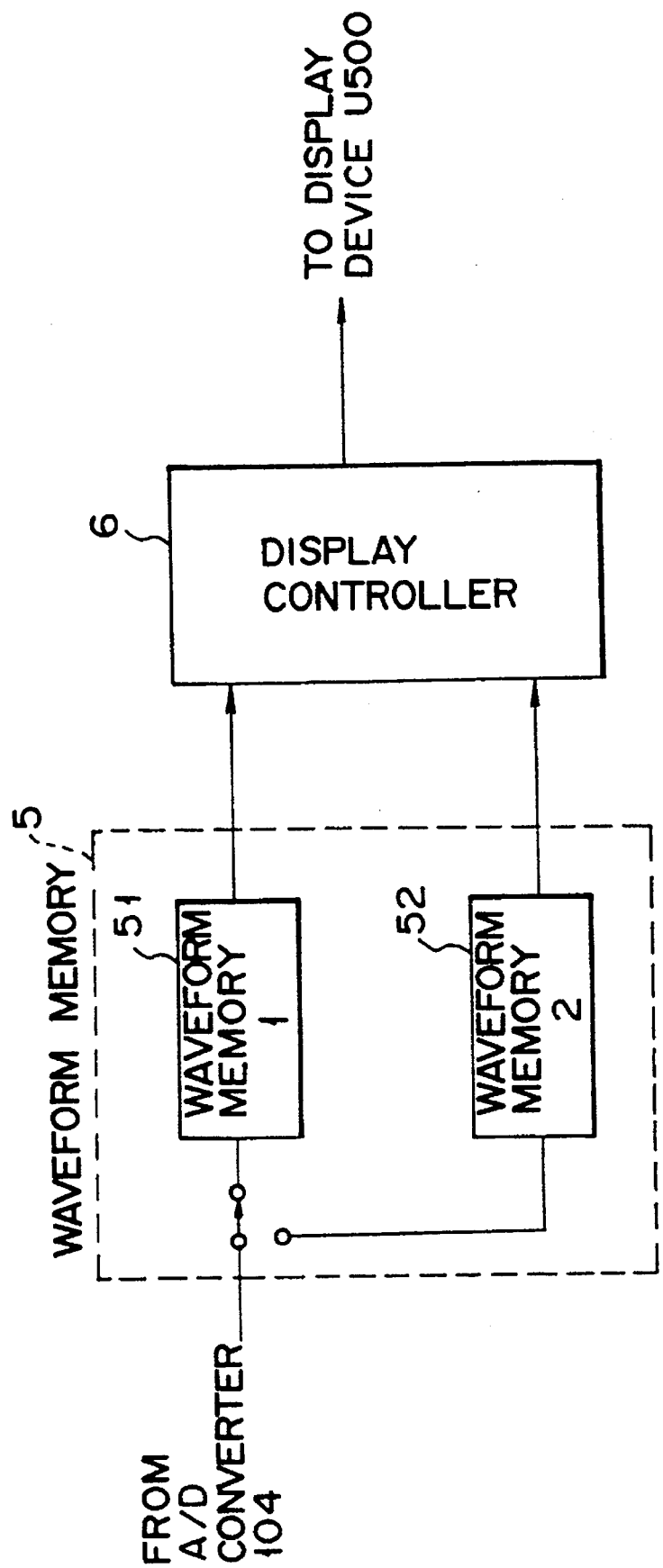
FIG. 10 is a diagram showing in detail a waveform memory according to the second embodiment of the present invention.

FIG. 10 shows an example wherein the waveform memory 5 is split into two memories. When the waveform memory is split into two memories, sweep operations for Ⓐ and Ⓒ are continuously performed (therefore, a sweep operation of a background portion of Ⓑ is also performed), and data are stored in a waveform memory 51. A waveform memory 52 stores data obtained by only a sweep operation of Ⓑ.

Figure 9A:
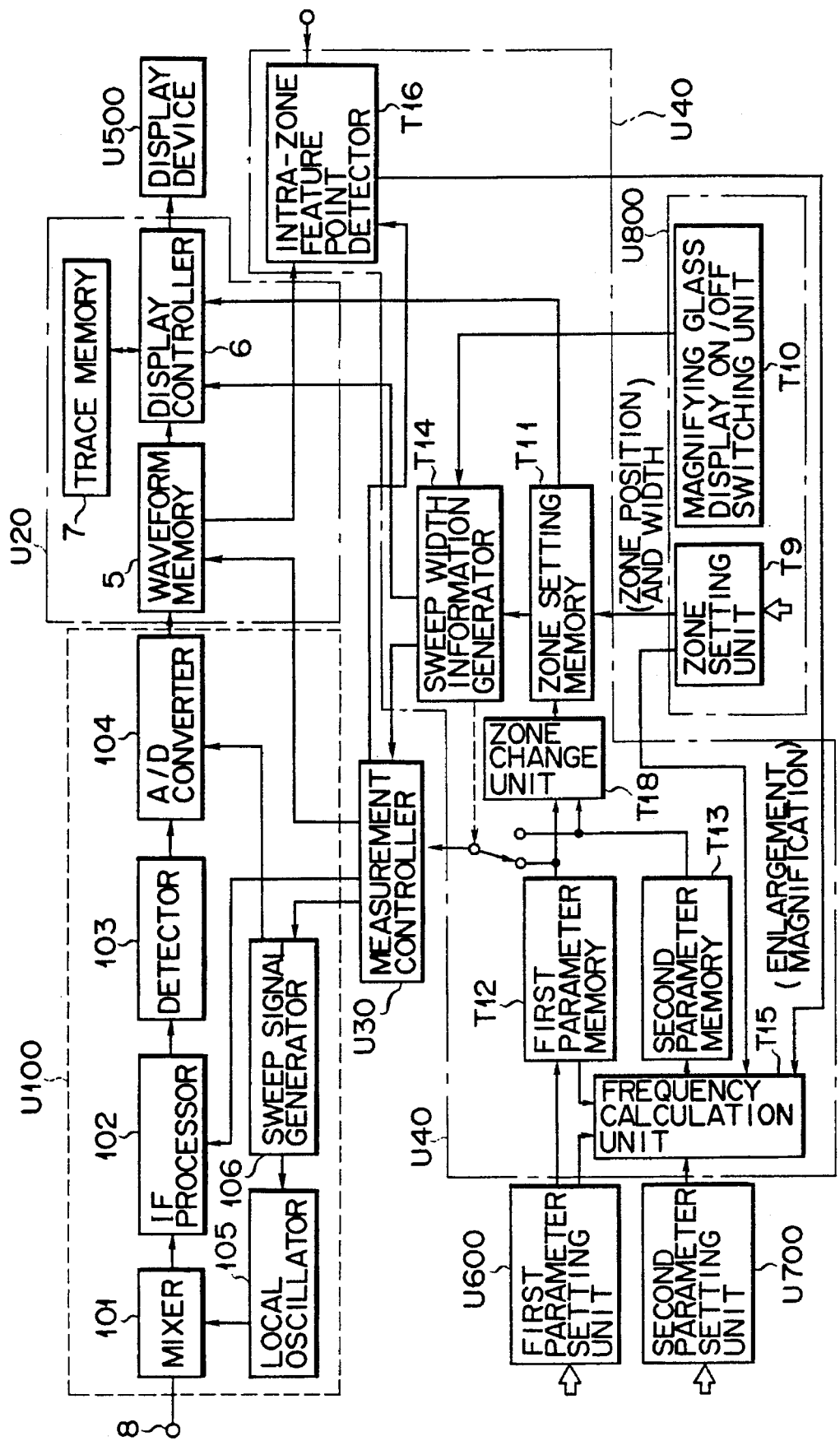
FIG. 9A is a block diagram showing a modification of the second embodiment of the present invention.

FIG. 9A shows a modification of the second embodiment. In FIG. 9A, in addition to the arrangement shown in FIG. 8 for realizing the magnifying glass display function, an intra-zone feature point detector T16 for receiving a feature point designation signal in a set zone, and detecting a feature point from information stored in the waveform memory 5 is arranged so as to execute zone tracking. A peak is normally designated as a feature point in the zone. However, a dip is sometimes designated. Based on the position of the feature point within the zone, and the frequency at that point, parameters such as a frequency for determining the zone so as to locate the designated point at the predetermined position (e.g., the center) of the zone are calculated by the frequency calculation unit T15, and data in the second setting parameter memory T13 are rewritten with these parameters. Based on the rewritten information, the display controller 6 is consequently operated, and a desired display is made on the display device U500.

Figure 36:
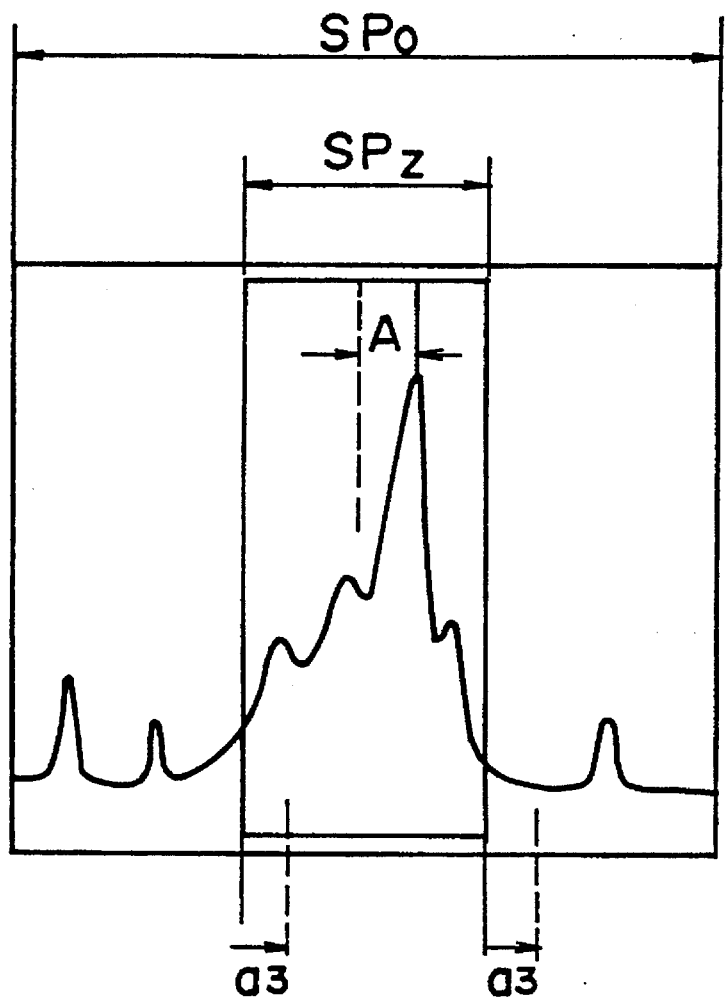

FIG. 9B is a flow chart showing in detail an operation shown in FIG. 9A. The intra-zone feature point detector T16 determines whether or not a detected feature point is located at the center of the zone (step S1). If the feature point is located at the center, a display is made without changing the zone position (step S7); if the feature point is shifted from the center, a position shift amount A from the center is calculated (step S3). Thereafter, the sweep start frequency of the zone is increased by an amount $(A \cdot \Delta F_Z)$ corresponding to the position shift amount (step S4). At the same time, a calculation for changing the position of the zone with respect to the entire screen by an amount $(A \cdot SP_Z/SP_O)$ corresponding to the shift amount A is performed (step S5). In the above description, $\Delta F_Z$, $SP_O$, and $SP_Z$ respectively represent $\Delta F_Z$: a frequency deviation per unit shift amount, $SP_O$: a frequency span set by the first parameter setting unit, and $SP_Z$: a frequency span in the zone. In FIG. 36, this value corresponds to $a_3$ in the figure. Note that a change in position is stored in the zone setting memory T11 (step S6). These functions are performed by a zone changing unit T18. Sweep and display operations of the zone are performed according to the stored (updated) content (value) of the zone setting memory T11, i.e., the new start frequency and new zone position (step S9).

With this function, since the feature point can always be displayed at the center of the zone, an easy-to-see intra-zone display can be made.

The frequency calculation unit 15 shown in FIG. 9A calculates frequency parameter values to be set as first and second parameters according to the difference between a frequency at the reference position and a frequency at the feature point, and the measurement controller controls the measurement unit according to these pieces of information, thereby realizing a so-called intra-zone signal tracking function with which a peak of a waveform is always present within a zone.

The second embodiment of the present invention can provide the following effects.

First, since a spectrum near a desired signal can be simultaneously measured while observing a wide-band spectrum, an enlarged image at a desired position can be displayed without changing one point on the frequency axis (without movement in position) while observing the overall image.

Since a trace within the zone can be displayed as a trace continuous with the overall trace, data can be displayed as one frame by one trace unlike in the FG & BG two-frame display function. In this manner, since a one-trace display can be attained, a memory capacity necessary for saving or recalling trace data can be decreased, and for example, maximum value holding processing (MAXHOLD) and average processing (AVERAGE) can be easily realized.

Since the one-trace display is made, a substantially two-channel display for simultaneously displaying traces of different detection modes can be easily realized.

In the signal tracking function of the prior art, since a waveform is always displayed at the center of the CRT screen, it is not easy to intuitively grasp the frequency drift width of a signal. However, in the zone tracking function of the present invention, since the one-trace display is made, the drift width can be read from movement of the displayed zone.

In addition, the drift width can be directly read by observing a moving amount of the zone along the scale of the overall abscissa.

The difference between the zone tracking function of the present invention and the signal tracking function of the prior art will be examined below. In the conventional signal tracking function, when a signal falls outside a screen, a wide frequency span must be set again to capture a signal again. However, in the "zone tracking" function of the present invention, since a wide-band spectrum is originally displayed on the entire screen, a signal can be easily captured again by only turning on/off the magnifying glass function.

In this manner, according to the second embodiment, a spectrum analyzer which can improve the conventional zone marker, zone sweep, signal tracking, and FG & BG two-frame display functions, and can eliminate inconvenience in operations can be provided.

(Third Embodiment: Multi-screen Display Function)

A multi-screen display function according to the third embodiment means a function of realizing the magnifying glass display function according to the second embodiment as a multi-screen (multi-split) display.

The background of the necessity for such a multiscreen display function, and the principle of the multi-screen display will be described below with reference to two-signal, 3rd-order distortion measurement.

Assuming that two sine wave signals having different frequencies are input to input terminals of a given device (e.g., a frequency multiplexer, an amplifier, an active filter, or the like), a spurious component having another frequency component appears at the output terminal of this device due to an interference (synthesis) of the two different frequencies in addition to the above-mentioned two signals. As the spurious level is lower, it is preferable for the device. Thus, the spurious (spectrum) level must be measured by, e.g., a spectrum analyzer for evaluating the performance of the device.

When this relationship is expressed by a formula, if the frequencies of the two sine wave signals having different frequencies are respectively represented by $f_1$ (Hz) and $f_2$ (Hz), a spectrum of $f_x$ containing a spurious component given by the following formula theoretically exists:

$$f_x = |mf_1 \pm nf_2| \text{ (m and n are integers)}$$

Note that $f_x$ yielding m+n=3 is called a two-signal, 3rd-order distortion.

Figure 11A:
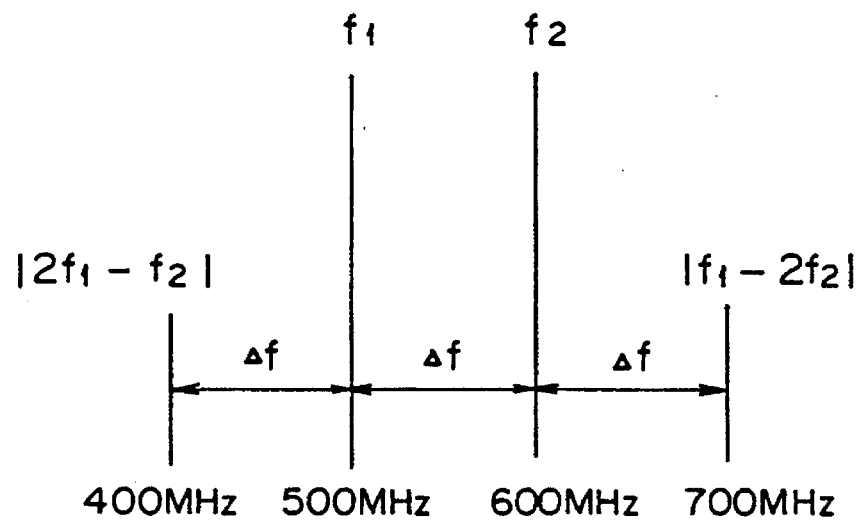

More specifically, as typical spectrum components of the two-signal, 3rd-order distortion when two signals of $f_1$=500 MHz and $f_2$=600 MHz, components of 400 MHz ($|2f_1-f_2|$) and 700 MHz ($|f_1-2f_2|$) appear. In other words, if $f_2-f_1=\Delta f$ is established for $f_2>f_1$, the spectrum components of the two-signal, 3rd-order distortion respectively appear at $f_1-\Delta f=f_3$, and $f_2+\Delta f=f_3'$. FIG. 11A illustrates this relationship.

Figure 11B:
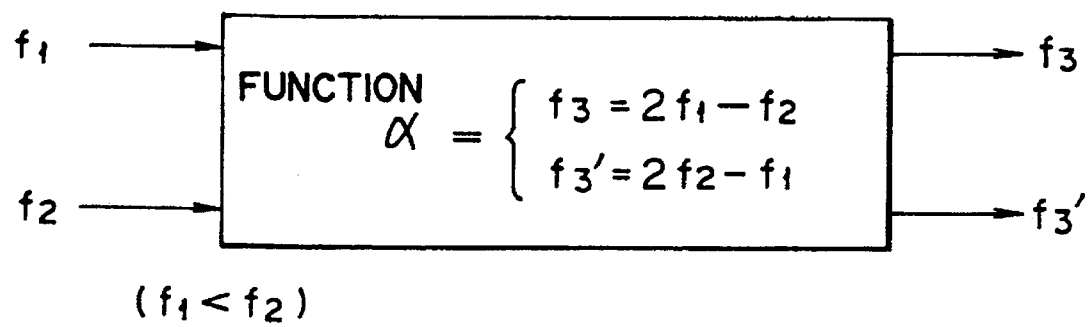

Therefore, if $f_1$ and $f_2$ are defined as input frequencies, and $f_3$ and $f_3'$ are defined as output frequencies, as shown in FIG. 11B, they are related by:

$$\text{Function } \alpha = \begin{cases} f_3 = 2f_1 - f_2 \\ f_3' = 2f_2 - f_1 \end{cases}$$

(for $f_1 < f_2$)

Figure 11C:
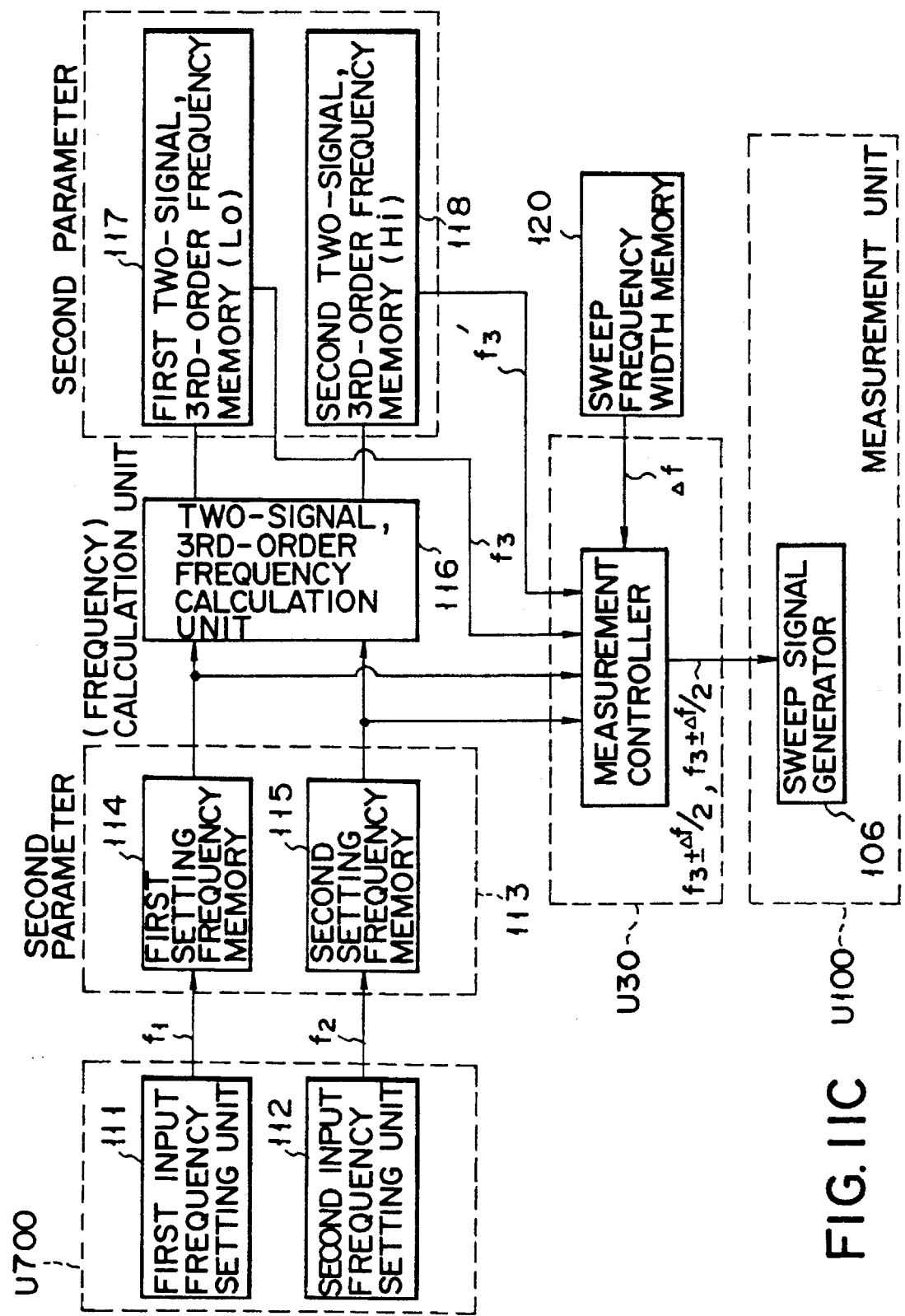

FIG. 11C is a diagram showing the principle when the multi-screen display function is realized so as to observe the spectrum of the two-signal, 3rd-order distortion on the basis of the above-mentioned background.

More specifically, a second parameter setting unit U700 corresponds to first and second input frequency setting units 111 and 112, and first and second setting frequency memories 114 and 115, and first and second two-signal, 3rd-order frequency memories 117 and 118 corresponding to a second parameter memory T13 are arranged. Stored data from the first and second setting frequency memories 114 and 115 are supplied to a two-signal, 3rd-order frequency calculation unit 116 corresponding to a frequency calculation unit T15. The two-signal, 3rd-order frequency calculation unit 116 outputs low and high two-signal, 3rd-order frequencies which are related by the function a having the relationship shown in FIG. 11B described above, and these output frequencies are respectively stored in the first and second two-signal, 3rd-order frequency memories 117 and 118. Stored data $f_3$; $f_3'$ from these memories 117 and 118, stored data $f_1$ and $f_2$ from the first and second setting frequency memories 114 and 115, and a predetermined bandwidth $\Delta f$ as output data from a sweep frequency width memory 120 are supplied to a measurement controller U30. The measurement controller U30 controls a sweep signal generator 106 by outputs given by $f_3 \pm \Delta f/2$, $f_1 \pm \Delta f/2$, $f_2 \pm \Delta f/2$, and $f_3' \pm \Delta f/2$. In this case, if control is made to perform sweep operations in the order of lower frequencies, frequency data are read out from the corresponding memories in the order of $f_3 \rightarrow f_1 \rightarrow f_2 \rightarrow f_3'$, thereby controlling the sweep signal generator 106. As a result, in this case, a multi-split display, i.e., a multi-screen display corresponding to four sweep periods can be realized.

Figure 13:
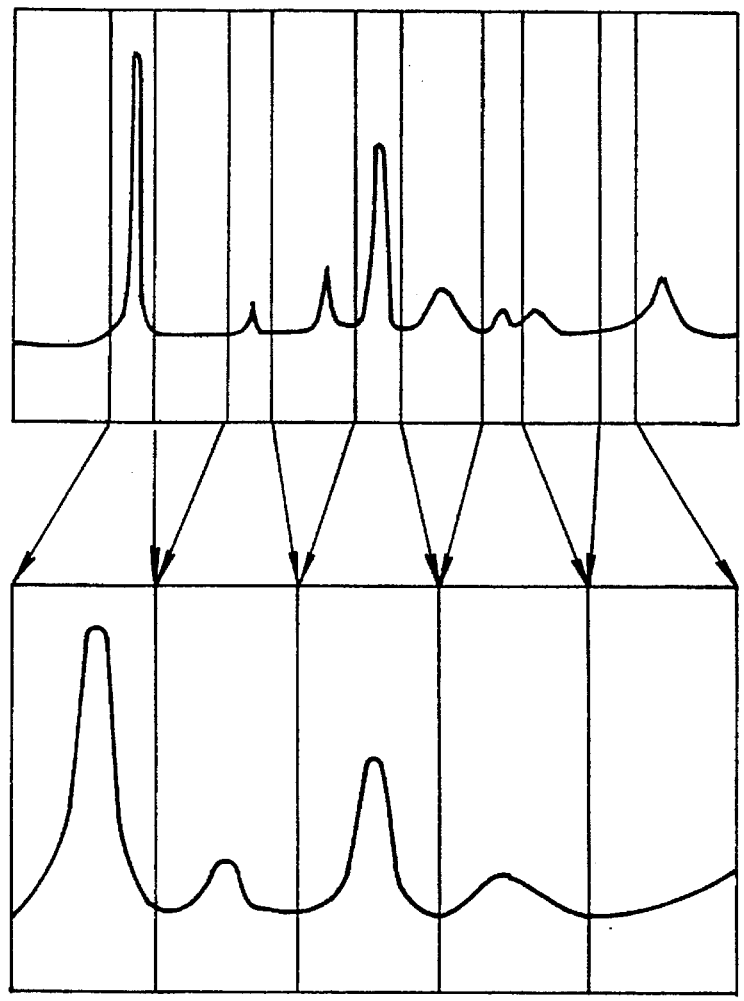
FIG. 13 shows a display example of the third embodiment of the present invention.

FIG. 12 is a detailed block diagram of a partial modification of FIG. 8 for realizing a multi-screen function. The arrangement shown in FIG. 12 is substantially the same as that shown in FIG. 8, except that the zone setting memory T11 and the zone setting unit T9 shown in FIG. 8 are respectively replaced with a multi-zone setting unit T11' and a multi-zone setting unit T9', and a multi display setting unit 121, a multi-zone split unit 122, and a multi sweep information generator 123 are newly arranged. A multi-zone display and a multi-split (screen) display shown in, e.g., FIG. 13 can be made on the basis of the principle of FIG. 11C. More specifically, a multi-split (screen) display shown in a lower portion of FIG. 13 can be made by enlarging signals in the respective zones of the multi-zone display shown in an upper portion of FIG. 13 by the magnifying glass display function.

(Fourth Embodiment: Multi-screen Display Function)

The multi-screen display function according to the fourth embodiment is directed to a harmonic measurement as an application different from the third embodiment.

FIG. 14A is a diagram showing an arrangement of a spectrum analyzer adopting the fourth embodiment of the present invention.

Figure 14B:
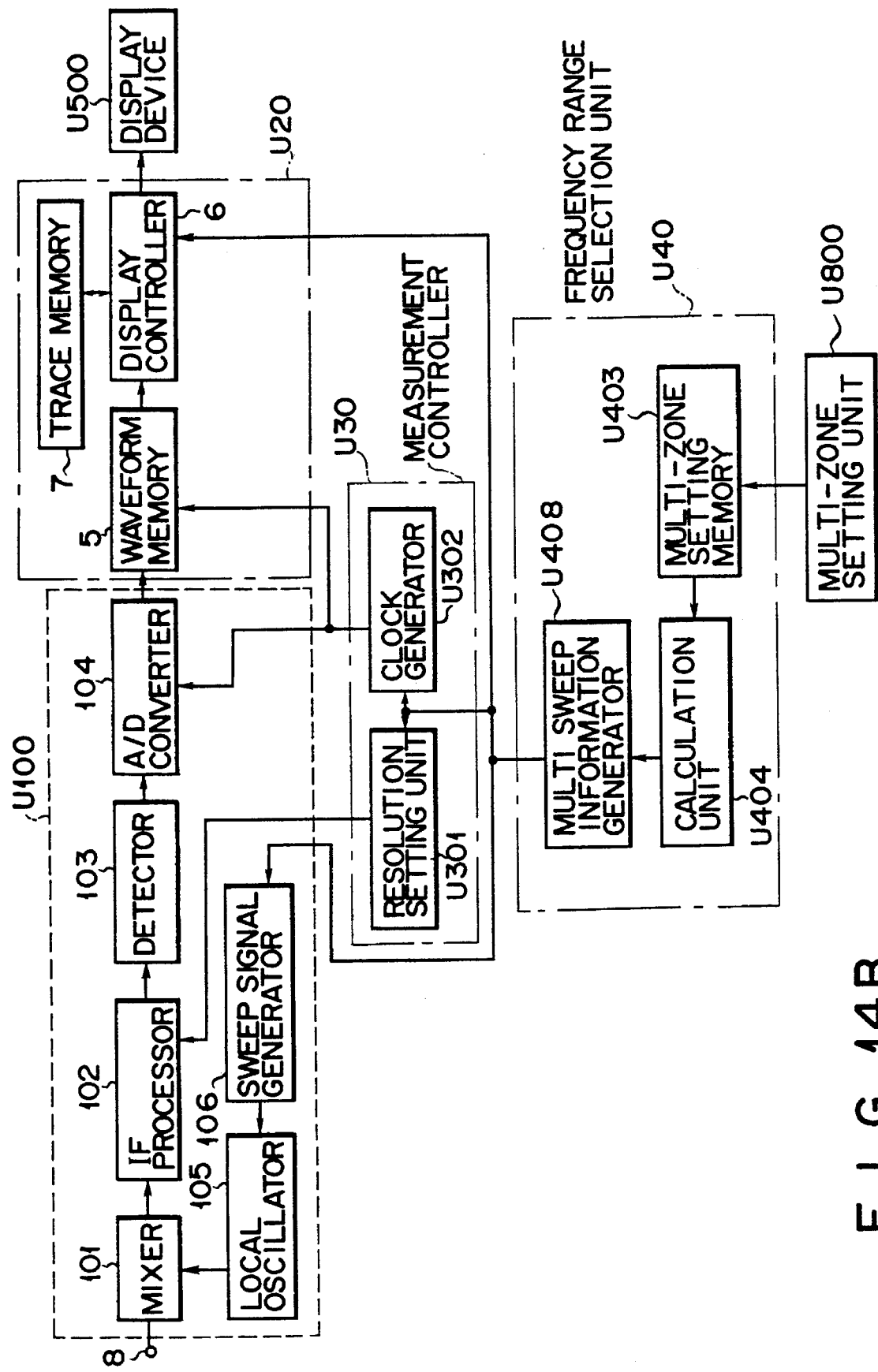

FIG. 14B shows FIG. 14A in correspondence with the basic arrangement shown in FIG. 1. The same reference numerals in FIG. 14B denote the same parts as in FIG. 1 and FIG. 14A, and a detailed description thereof will be omitted.

Figure 34:
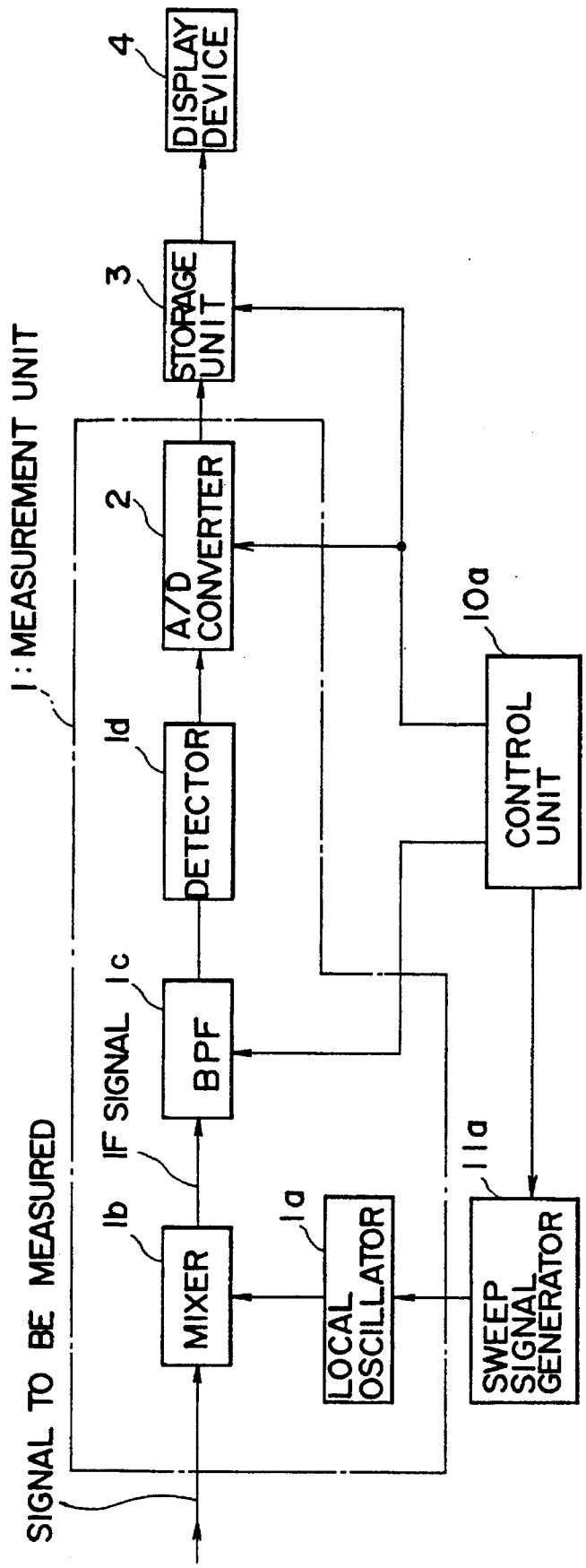
FIG. 34 is a diagram showing an arrangement of a conventional spectrum analyzer.

In the drawings, a measurement unit 10 (U100), an A/D converter 2 (104), and a storage unit 3 (5) are the same as those described in the prior art (FIG. 34).

A case will be exemplified below wherein harmonics are measured.

when a frequency range selection unit 5a receives frequency information of a fundamental wave of a signal to be measured, it obtains frequencies ($f_1$, $2f_1$, $3f_1$, $4f_1$, and $5f_1$ in the order from lower frequencies) of, e.g., up to 5th-order harmonic components. More specifically, a process of obtaining frequencies of 2nd-, 3rd-, 4th-, and 5th-order harmonic components from the frequency of the fundamental wave is the same as that of obtaining the two-signal, 3rd-order frequencies in the third embodiment. Furthermore, the unit 5a automatically selects five bands, i.e., BW1= $f_1 \pm \Delta f$, BW2=$2f_1 \pm \Delta f$, BW3=$3f_1 \pm \Delta f$, BW4=$4f_1 \pm \Delta f$, and BW5=$5f_1 \pm \Delta f$ on the basis of a predetermined bandwidth $2\Delta f$.

The predetermined bandwidth $2\Delta f$ corresponds to a sweep width near the fundamental wave and the respective harmonic components to be measured by frequency sweep operations.

For example, if $2\Delta f$=1 MHz when the fundamental wave= 100 MHz, the respective sweep frequency ranges BW1 to BW5 are respectively 99.5 to 100.5 MHz, 199.5 to 200.5 MHz, 299.5 to 300.5 MHz, 399.5 to 400.5 MHz, and 499.5 to 500.5 MHz.

A sweep unit 60 is constituted by a resolution setting unit 6c, a clock generator 6b, and a sweep signal generator 6a in this embodiment.

The sweep signal generator 6a receives the pieces of frequency range information BW1 to BW5 from the frequency range selection unit 5a, and generates and outputs a sweep signal for causing a local oscillator 1a to sweep frequencies in synchronism with a clock from the clock generator 6b.

The clock generator 6b generates a clock corresponding to the total number of dots/period. This clock determines a conversion timing of the A/D converter 2, and designates an address of the storage unit 3.

The resolution setting unit 6c sets a bandwidth of an analysis resolution which satisfies the above-mentioned equation (1), and is approximate to a display resolution 10Δf/the total number of dots in accordance with the predetermined bandwidth 2Δf.

Figure 15:
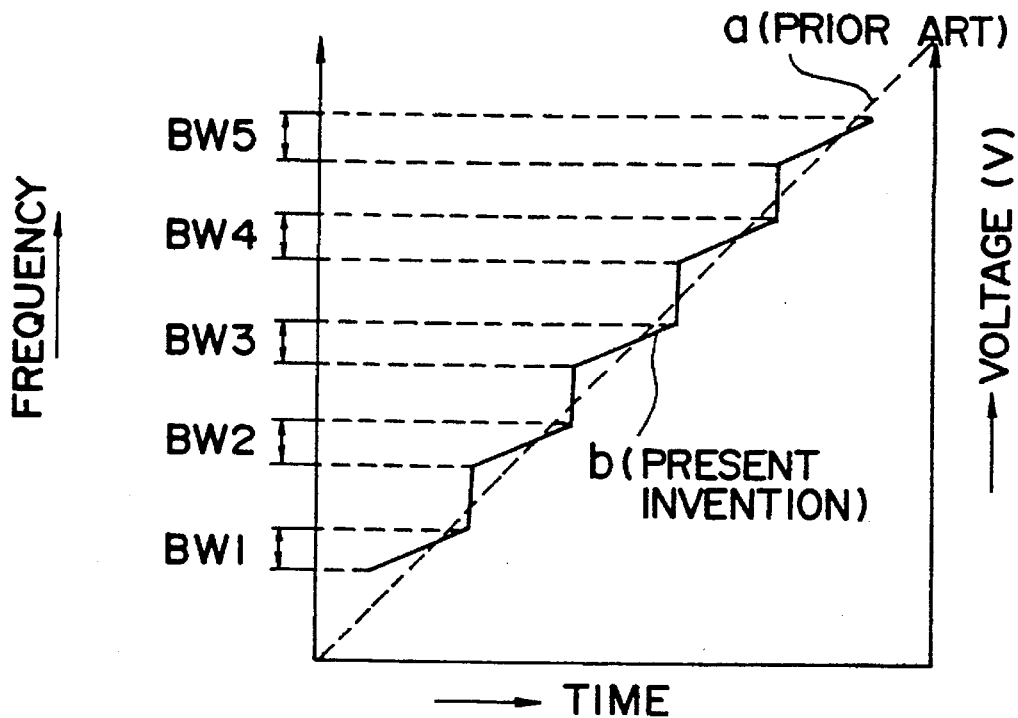
FIG. 15 is a chart for explaining a waveform of a sweep signal of the fourth embodiment.

The waveform of this sweep signal will be described below with reference to FIG. 15. In FIG. 15, an example of a sweep signal according to the present invention is represented by a solid line b, and an example of a conventional sweep signal is represented by a dotted line a. FIG. 15 illustrates a sweep signal when it is assumed that the sweep time of one period of the present invention is the same as that of the prior art on a coordinate system wherein the sweep time is plotted along the abscissa, and the voltage of the sweep signal and the frequency to be swept are plotted along the ordinate. Note that the local oscillator 1a outputs a frequency proportional to the voltage of the sweep signal.

The feature of the waveform of the sweep signal of the present invention is that the waveform changes stepwise, and an inclination when each of the desired frequency ranges BW1 to BW5 is swept is slow. Consequently, since a sweep speed when each of the desired frequency ranges BW1 to BW5 is swept is low (a substantial sweep time per unit frequency range is prolonged), the band of a BPF 1c can be narrowed, thus increasing the analysis resolution. Since the desired frequency ranges BW1 to BW5 are selectively swept step-wise while the total number of dots on the abscissa per period remains the same as in the prior art, portions excluding non-selected bands can be measured and displayed in an enlarged scale, thus also increasing the display resolution.

Outputs from a measurement unit 10 are stored by the A/D converter 2 and the storage unit 3 at the timing of the clock from the clock generator 6b. As data to be stored, data of only the desired frequency ranges BW1 to BW5 are stored in the order from lower frequencies (in the order of sweep frequencies).

A display data processor U20 for controlling a display device U500 is constituted by the storage unit 3, a display controller 7a, and a trace memory 7b this embodiment.

Figure 16:
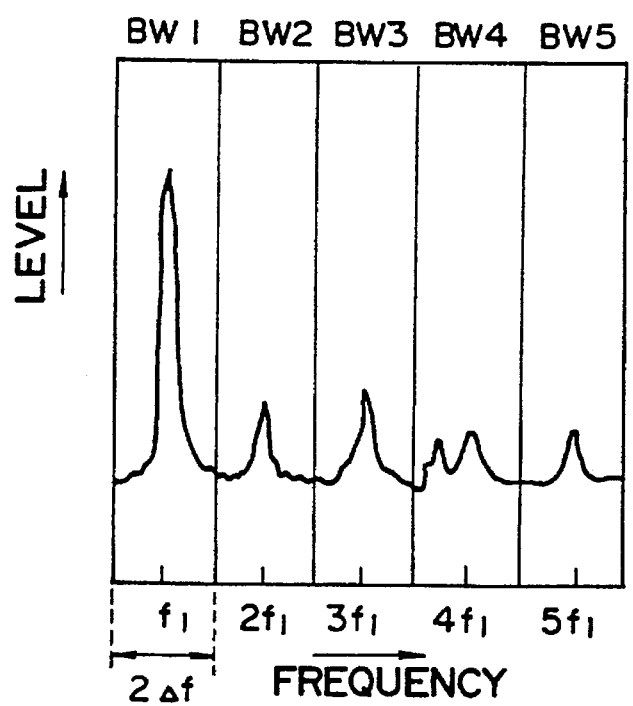
FIG. 16 shows a display example of the fourth embodiment.

The display controller 7a receives the pieces of desired frequency range information BW1 to BW5 selected in advance by the frequency range selection unit 5a, and forms a display format obtained by dividing a display screen into a predetermined number of sections, e.g., five sections in this embodiment, and assigning frequencies to these sections. Data stored in the storage unit 3 are read out, and are displayed on the display device U500 according to the display format. FIG. 16 shows this display example.

In FIG. 16, if the fundamental wave is 100 MHz, the bandwidth 2Δf of each of the desired frequency ranges BW1 to BW5 is 1 MHz, and the total number of dots on the abscissa is 500, the display resolution is 1 MHz/100=10 kHz.

If a sweep time T is a total of 2 sec, since a sweep time of each band is 0.4 sec, the analysis resolution can be about 0.7 kHz according to equation (1). However, the effective comprehensive measurement resolution is 10 kHz which is equal to the display resolution. As can be understood from comparison with an example of numeric values described in the prior art, since the conventional comprehensive measurement resolution is 1 MHz, and the analysis resolution is 22.4 kHz if other conditions remain the same, the measurement resolution of this embodiment is better than the conventional analysis resolution as well as the conventional measurement resolution.

In this manner, since a measurement can be performed with a high resolution, the S/N can be increased accordingly, and the measurement dynamic range can be widened. Since the respective harmonic components can be displayed in an enlarged scale, they are easy to see.

Note that the frequency range selection unit 5a, the sweep unit 60, and the display controller 7a of this embodiment can be constituted using a CPU.

Figure 17A:
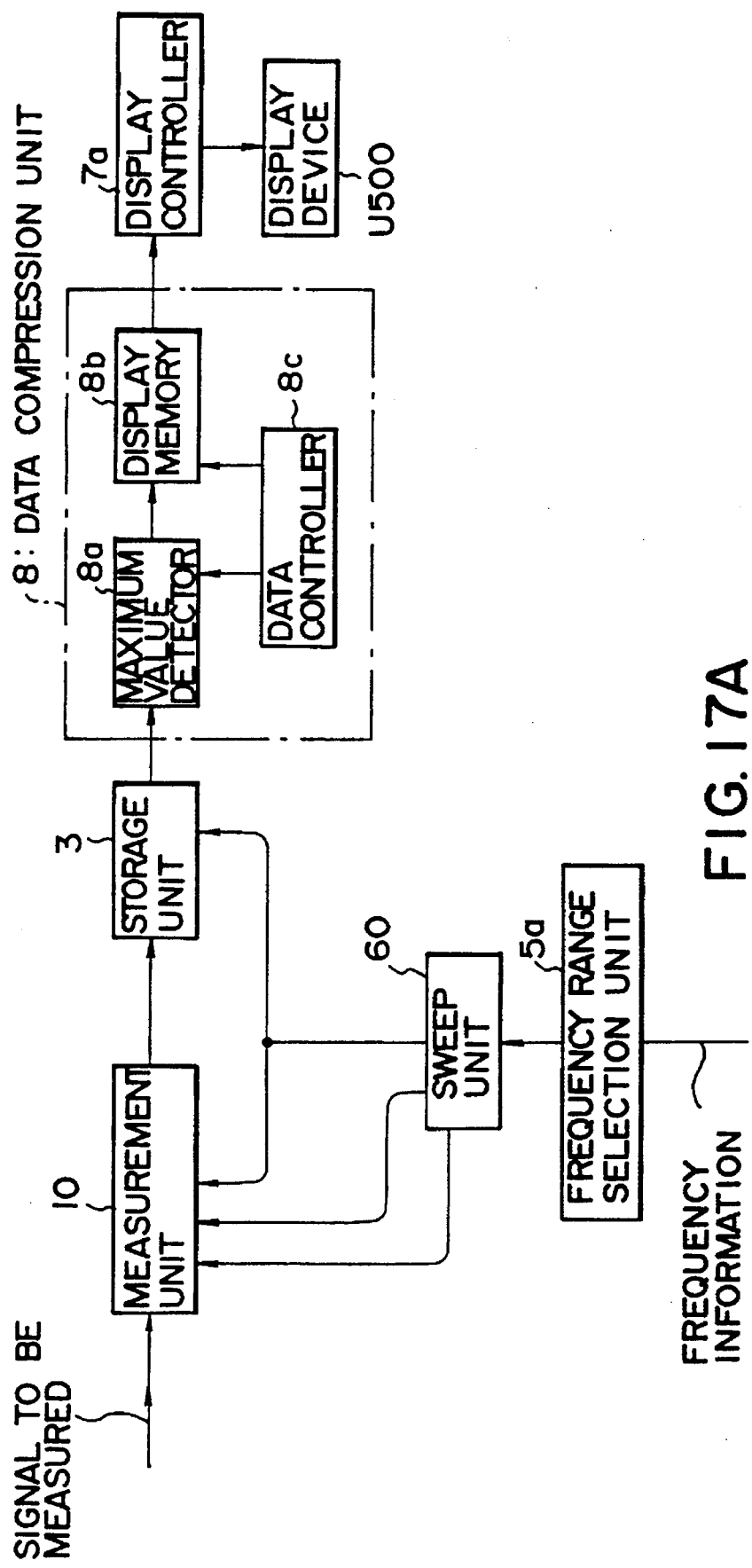
FIGS. 17A and 17B are diagrams showing an arrangement of a spectrum analyzer which adopts the fourth embodiment.

FIG. 17A shows a modification of the spectrum analyzer adopting the fourth embodiment.

In the case of FIG. 14A, each of the desired frequency ranges BW1 to BW5 (each having the bandwidth 2Δf) is directly assigned to the number of dots, 100, (the number of dots obtained by dividing the total number of dots, 500, on the abscissa with 5 as the number of the desired frequency ranges BW1 to BW5), thereby performing a measurement and a display.

Figure 18:
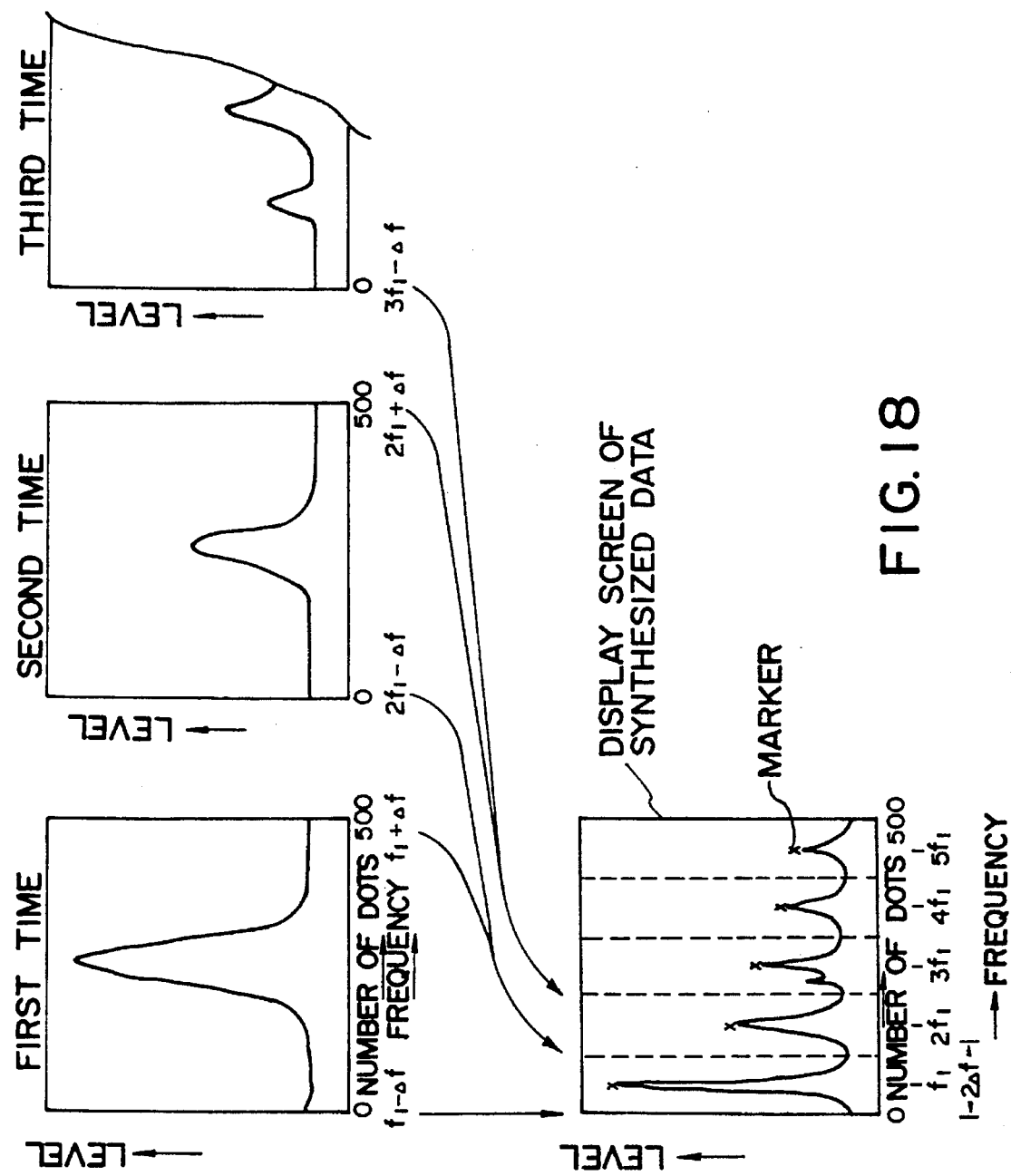
FIG. 18 shows data examples obtained upon measurements of the fourth embodiment, and a display example of the fourth embodiment.

In contrast to this, in the case of FIG. 17A, each of the desired frequency ranges BW1 to BW5 is measured five times as the number of measurement points, 500, which is equal to the number of display dots, 500, as indicated by the first time, second time, third time, ... in an upper portion of FIG. 18, and data of a total of 500×5=2,500 points are subjected to processing such as data compression, so that the abscissa is compressed to ⅕, and is displayed. ⅕ compression can be attained by generating new data point by point every 5 points of the data measured five times. In this case, as data compression processing for generating the 5-point data as new 1-point data, processing for obtaining a maximum value, a minimum value, or an average value of the levels is known. Differences between the arrangements shown in FIGS. 17A and 14A are that a data compression unit 8 is newly arranged, and that a sweep signal from the sweep generator 6a (see FIG. 14A) included in the sweep unit 60 has a different waveform in FIG. 17A. The storage method of the storage unit 3 is changed in correspondence with the difference in waveform of the sweep signal from the sweep generator 6a. In FIG. 17A, a maximum value is detected as the data compression processing.

The basic operations of other principal portions are substantially the same as those in FIG. 14A.

Figure 19:
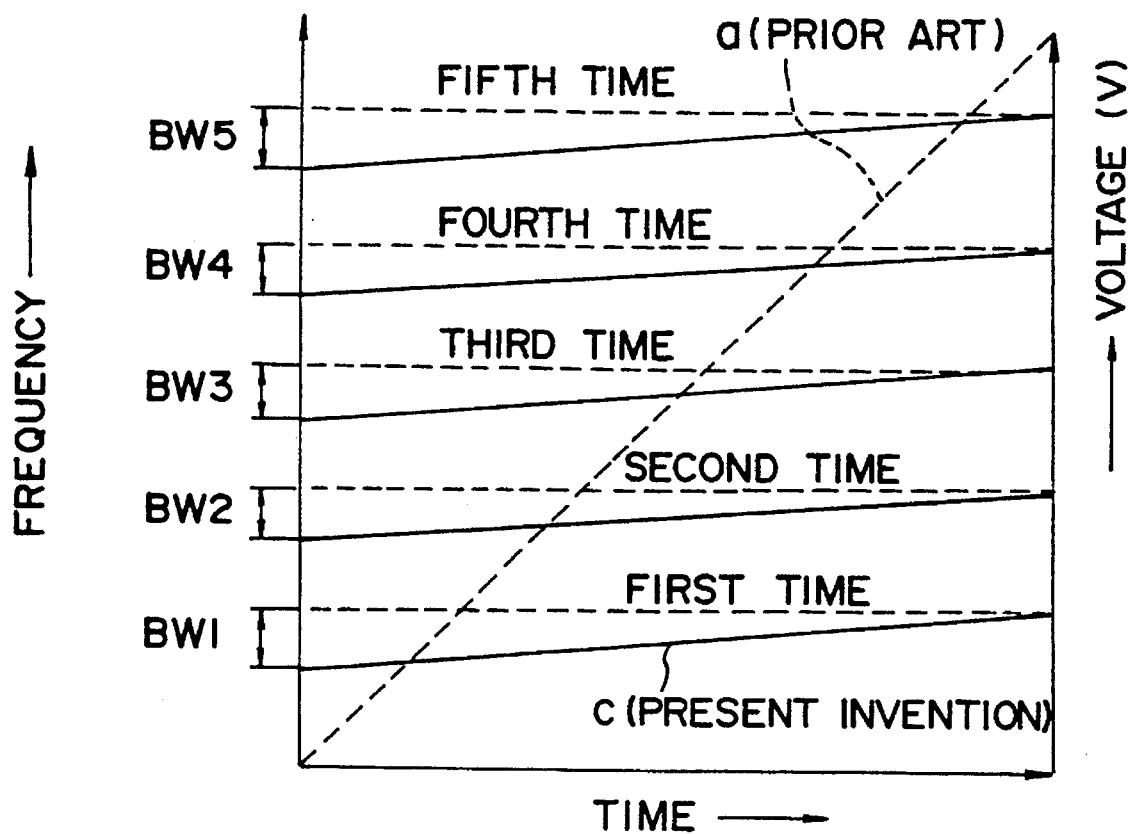
FIG. 19 is a chart for explaining a waveform of a sweep signal used in FIGS. 17A and 17B.

In FIG. 17A, the sweep signal generator 6a receives the pieces of frequency range information BW1 to BW5 output from the frequency range selection unit 5a, and generates and outputs a sweep signal for causing the local oscillator 1a to sweep frequencies in synchronism with a clock from the clock generator 6b (see FIG. 14A; the same applies to the following description). The sweep signal in this case will be described below with reference to FIG. 19. In FIG. 19, solid lines c are for explaining the sweep signal of FIG. 17A, and dotted lines a are an example of the conventional sweep signal.

The sweep signal of FIG. 17A sweeps one desired frequency range in a conventional sweep time per period, and performs five sweep operations in correspondence with the pieces of frequency range information BW1 to BW5.

Therefore, in the case of FIG. 17A, although the bandwidth 2Δf of each of the desired frequency ranges BW1 to BW5 remains the same, the substantial number of measurement dots is increased to a value the number of sweep times, i.e., five times the total number of dots on the abscissa in FIG. 14A.

The storage unit 3 must have a memory capacity five times the total number of dots on the abscissa in FIG. 14A, or must output stored data to the data compression unit 8 in the next stage at proper time intervals if it has the same capacity as that in FIG. 14A. In the following description, for the sake of simplicity, the storage unit 3 is assumed have a capacity five times that in FIG. 14A. In this case, the period of the clock sent from the clock generator 6b to the storage unit 3 is the same as that in FIG. 14A. However, a clock output time must be five times that in FIG. 14A in correspondence with the capacity of the storage unit 3 (or the sweep signal from the sweep signal generator 6a).

The data compression unit 8 is constituted by a maximum value detector 8a, a display memory 8b, and a data controller 8c.

The data controller 8c reads out data corresponding in number to the desired frequency ranges BW1 to BW5 from a lower frequency (from a lower address of the storage unit 3), i.e., five data from addresses 0 to 4. The maximum value detector 8a detects a maximum value of the five data. The data controller 8c selects the maximum value, and writes it at address 0 of the display memory 8b. The data controller 8c repeats such an operation every five addresses of the storage unit 3 to convert all the data corresponding to the frequency ranges BW1 to BW5 stored in the storage unit 3, and writes the converted data in the display memory 8b.

In this manner, the data compression unit 8 selects every 5th data stored in the storage unit 3 to compress the data to ⅕, thereby converting the number of data to that the same as the total number of dots on the abscissa. The unit 8 sends the converted data to the display device U500, and causes it to display the data.

In this case, since the sweep time is 2 sec, and the sweep bandwidth 2Δf=1 MHz, the analysis resolution is 1 kHz. The resolution of data stored in the storage unit 3 at measurement dots is 1 MHz/500=2 kHz. Therefore, the measurement resolution when the data are stored in the storage unit 3 is 2 kHz (the band of the BPF 1c is set to be 2 kHz).

This measurement resolution is five times that in FIG. 14, and the S/N can be increased accordingly, thus widening the measurement dynamic range.

The value of the display resolution of data output from the storage unit 3, and compressed and stored in the display memory 8b is 10 kHz since it is five times the measurement resolution of 2 kHz. In this manner, at the end timing, the display resolution is the same as that in FIG. 14A. However, the improved measurement dynamic range can be maintained.

Note that the frequency of a spectrum generally means a frequency corresponding to the maximum level of the spectrum. Therefore, in this measurement, a frequency value corresponding to the maximum level of each spectrum including a harmonic component is finally required. Thus, the frequency value is obtained from non-compressed data in the storage unit 3, and if the obtained value can be numerically displayed as a frequency value representing a maximum value after compression, frequency measurement precision depending on the measurement resolution before compression can be maintained. In this case, an error caused by visual observation is determined by the display resolution after compression.

Figure 17B:
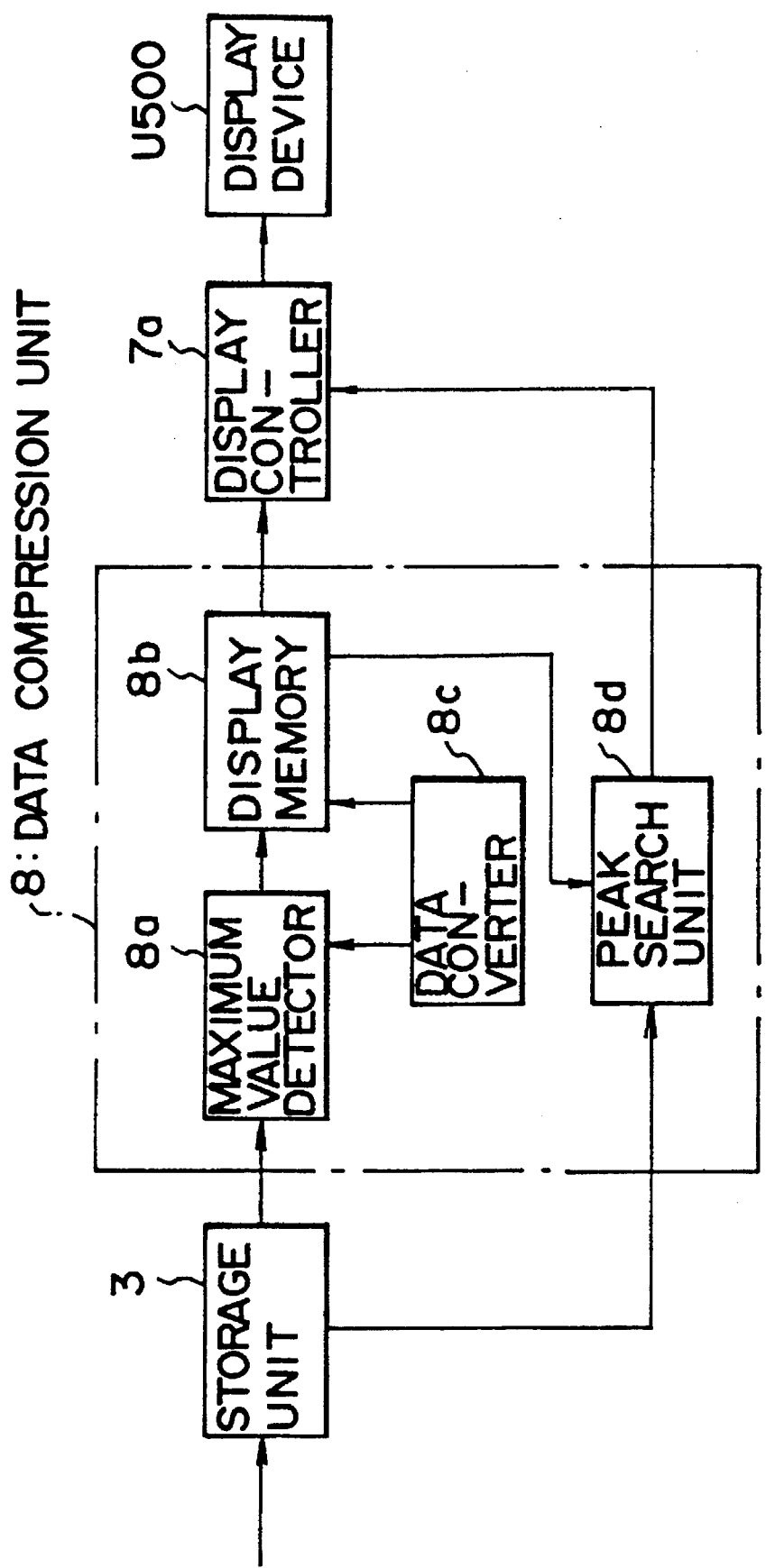

FIG. 17B shows an arrangement of an embodiment for displaying a marker, and a frequency value of the marker point.

In FIG. 17B, a peak search unit 8d is arranged in addition to FIG. 17A. The display controller 7a adds a marker to display data on the display device U500 upon an instruction from the peak search unit 8d, and at the same time, numerically displays the corresponding frequency value.

The peak search unit 8d searches a point representing a maximum value in each range on the basis of data from the display memory 8b in units of desired frequency ranges, and instructs the display controller 7a to add a marker to the searched point. On the other hand, the unit 8d obtains a frequency value of the searched point on the basis of data stored in the storage unit 3, and instructs the display controller 7a to display the frequency value as the frequency of the marker point.

Note that the data compression unit 8 can be constituted using a CPU and a storage element.

Figure 20:
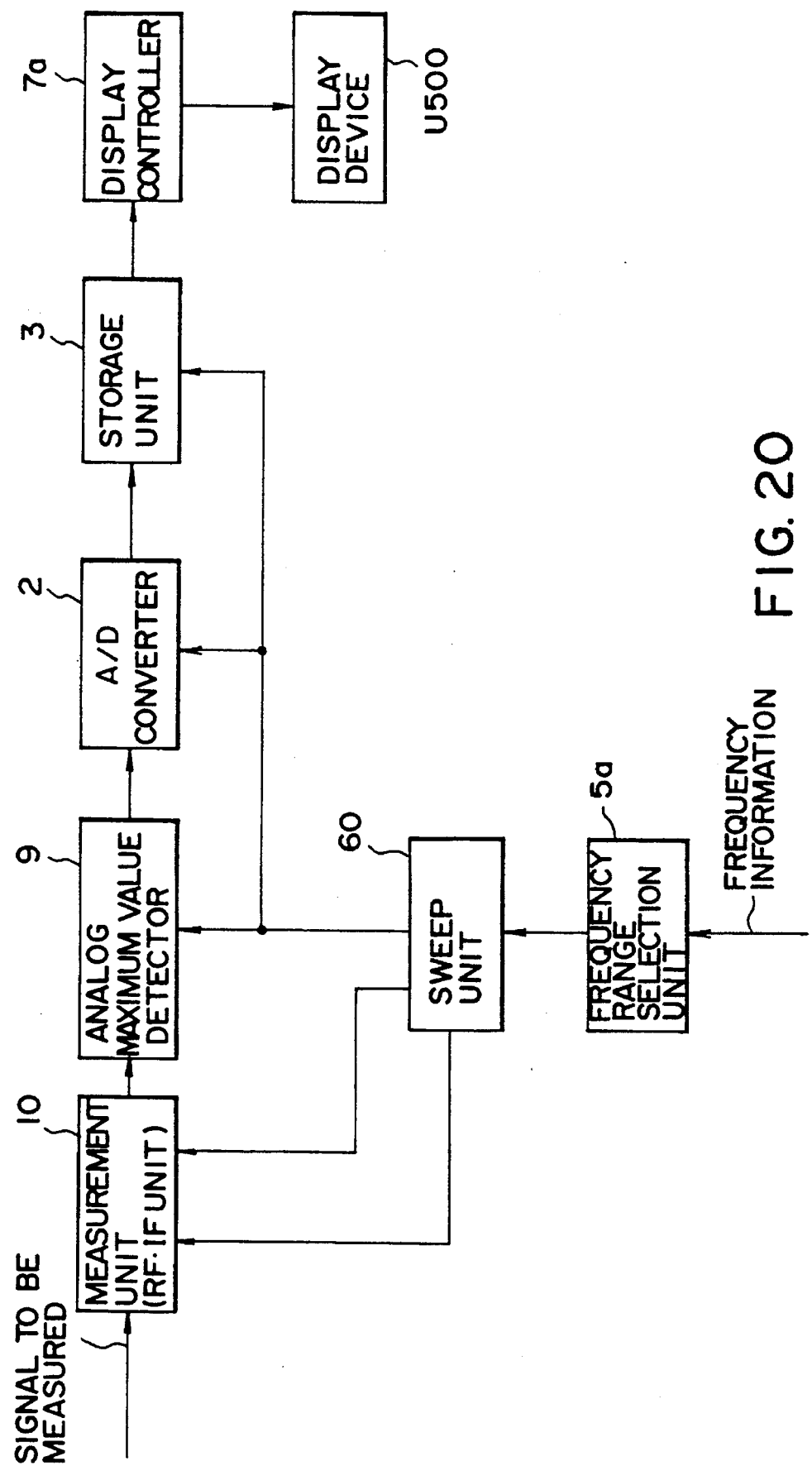
FIG. 20 is a diagram showing an arrangement of another spectrum analyzer which adopts the fourth embodiment.

FIG. 20 shows still another arrangement of the spectrum analyzer adopting the fourth embodiment.

In FIG. 20, the function of the data compression unit 8 in FIG. 17A is realized in an analog manner. For this purpose, in FIG. 20, in place of the data compression unit 8 in FIG. 17A, an analog maximum value detector 9 is arranged between the measurement unit 10 and the A/D converter 2.

In FIG. 20, operations excluding those of the analog maximum value detector 9, the A/D converter 2, the storage unit 3, and the clock generator 6b (see FIG. 14A) are the same as those in FIG. 17A.

In FIG. 20, the A/D converter 2, the storage unit 3, and the clock generator 6b have a different clock operation and storage capacity from those in FIG. 17A, and the storage capacity of the storage unit 3 is 500 which is the same as the total number of dots on the abscissa. A clock output to the analog detector 9, the A/D converter 2, and the storage unit 3 in FIG. 20 has a period five times that in FIG. 17A, and its output period is the same as that in FIG. 17A. The clock output period corresponds to a period in which the sweep signal from the sweep generator 6a sweeps five times like in the second embodiment.

The analog maximum value detector 9 holds an analog signal output from the measurement unit 1 during the clock period, and is reset in response to the next clock. Therefore, the analog maximum value detector 9 detects and holds the maximum value during the clock period.

The storage unit 3 selects an A/D-converted maximum value during one clock period, and stores it in correspondence with one address thereof.

In this case, since one clock period in FIG. 20 is five times that in FIG. 17A, as has been described above, the storage unit 3 receives analog data five times those obtained by the clock in FIG. 17A, and detects the maximum value from the data, thereby compressing and storing the data.

In FIG. 20, other operations, and the resolutions are the same as those in FIG. 17A. However, in FIG. 20, non-compressed data cannot be utilized since they are not stored unlike in FIG. 17A.

In the above description of the fourth embodiment, the harmonic measurement has been exemplified. However, the present invention is not limited to harmonic components. The arrangement shown in FIGS. 14A and 14B, FIGS. 17A and 17B, or FIG. 20 may be applied as long as the frequency of an object to be measured is known.

As described above, according to the fourth embodiment of the present invention, in particular, the frequency range selection unit selects the plurality of frequency ranges, the plurality of frequency ranges are swept by the sweep unit to allow a measurement with a high resolution, and a plurality of desired frequency ranges obtained in this manner are displayed on a single screen. Therefore, a plurality of desired frequencies of interest can be measured while confirming frequency components near these frequencies. Furthermore, only frequency components of interest can be observed in an enlarged scale. Moreover, a measurement can be performed with an increased S/N.

In addition, since the fourth embodiment of the present invention comprises the data selection unit in addition to the above arrangement, a measurement can be performed with a further increased S/N.

(Fifth Embodiment: Signal Tracking)

The signal tracking function according to the fifth embodiment of the present invention will be described hereinafter with reference to the accompanying drawings.

Figure 21A:
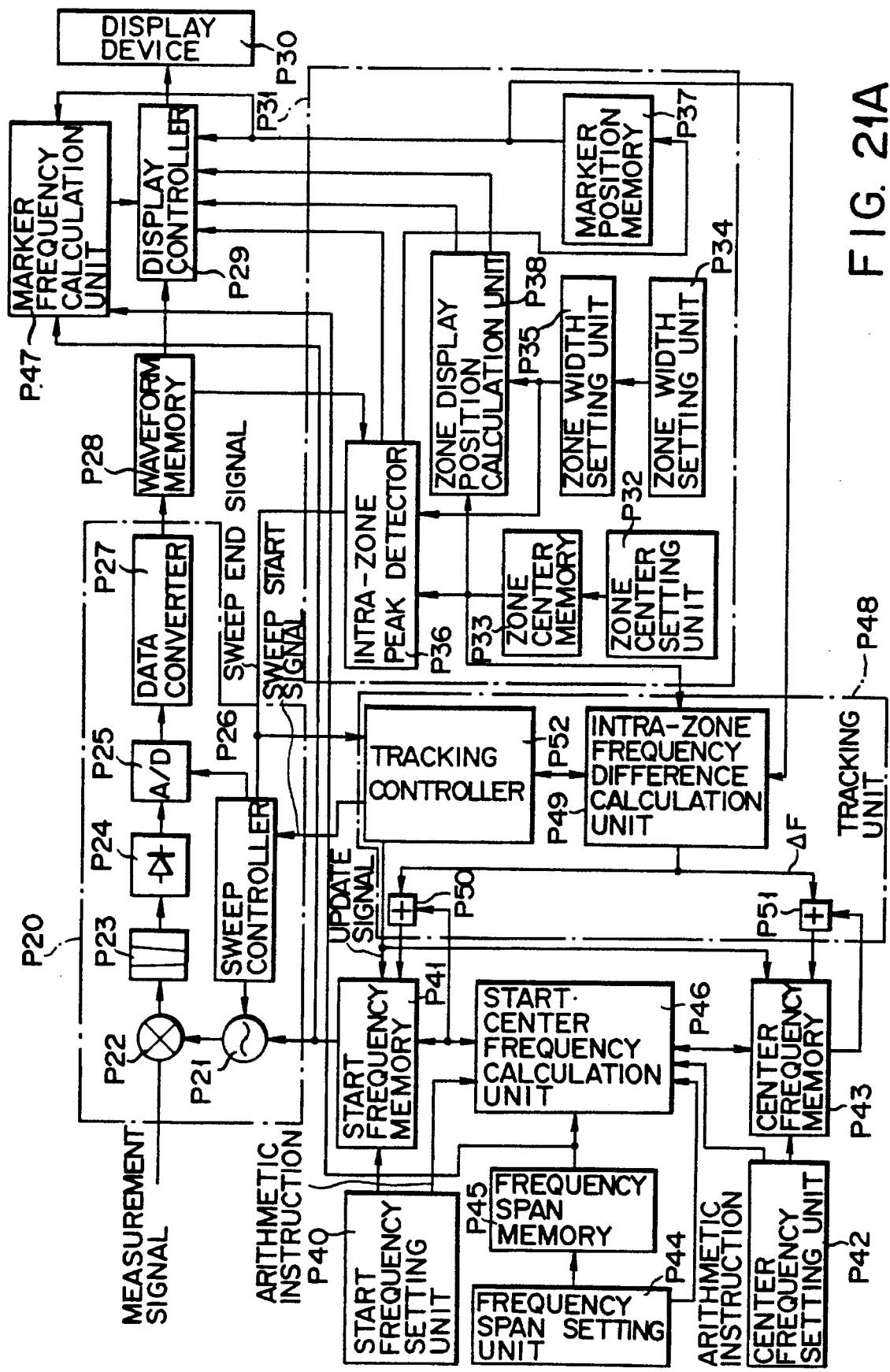
FIGS. 21A and 21B are diagrams showing an arrangement according to the fifth embodiment of the present invention.
Figures 1, 21B:
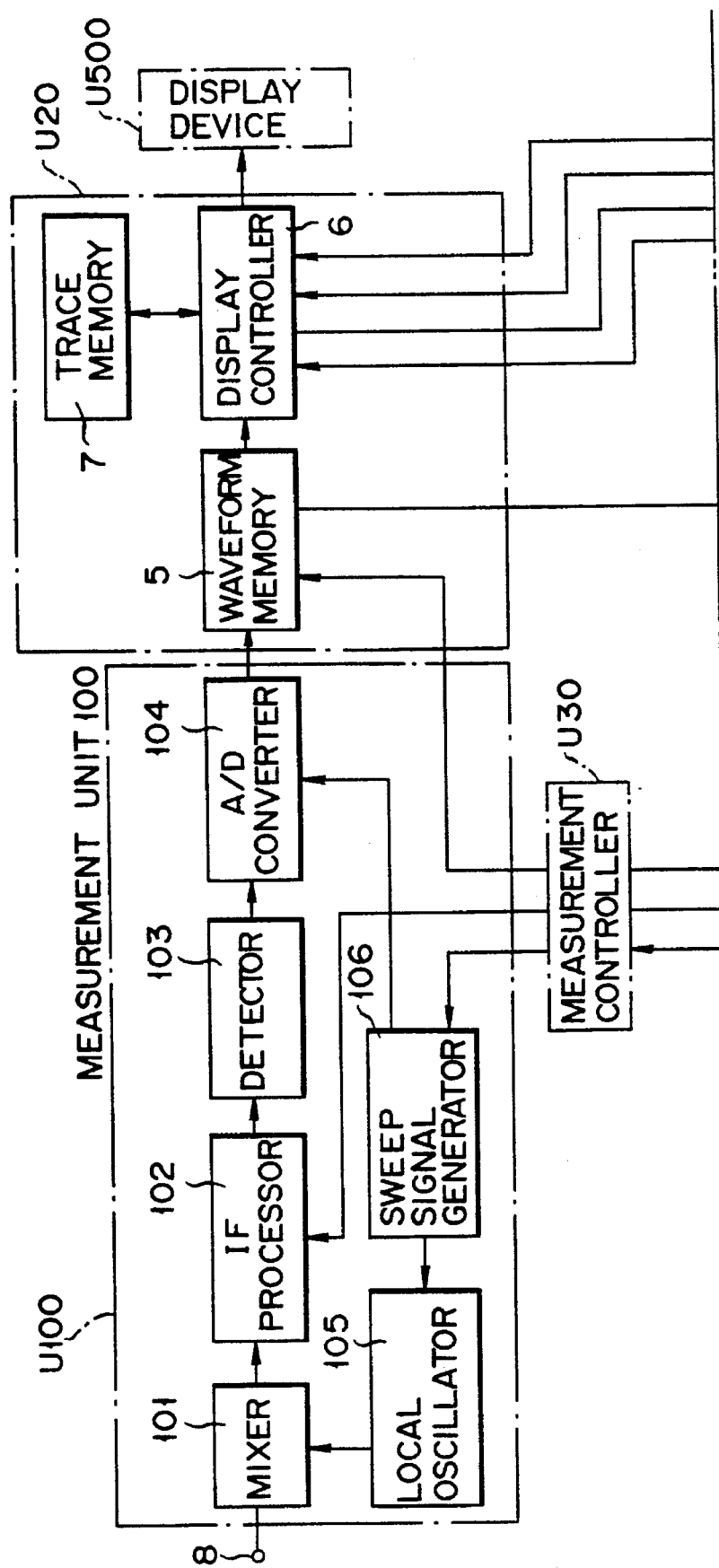

FIG. 21A is a block diagram showing an arrangement of a spectrum analyzer adopting the fifth embodiment. FIG. 21B shows FIG. 21A in correspondence with the basic arrangement shown in FIG. 1. The same reference numerals in FIG. 21B denote the same parts as in FIG. 21A and FIG. 3B, and a detailed description thereof will be omitted.

In FIG. 21A, reference numeral P20 denotes a measurement unit of this spectrum analyzer. This measurement unit P20 causes a mixer P22 to mix a measurement signal with a local oscillation signal from a local oscillator P21 capable of performing a sweep operation, causes a detector P24 to detect the mixed signal passing through a band-pass filter P23 having a predetermined frequency, and causes an AD converter P25 to output the detection signal as a spectrum value in units of frequencies. Note that the sweep frequency range of the local oscillator P21 is determined by the amplitude of a sweep signal from a sweep controller P26, and an offset voltage.

A data converter 27 performs correction processing of data from the AD converter P25, and stores the corrected data in a waveform memory P28.

The waveform memory P28 has, e.g., 500 addresses, and the AD converter P25 outputs 500 spectrum data in each sweep operation.

A display controller P29 causes a display device P30 to display data stored in the waveform memory P28 as a series of spectrum waveforms together with another display information to be described later.

A zone marker setting unit P31 is a portion for displaying and setting a zone having an arbitrary width at an arbitrary position on the frequency axis, and for displaying a marker at a peak point of a waveform in the zone.

A zone center setting unit P32 is a portion for setting zone center position information serving as a reference position in the zone in a zone center memory P33. A zone width setting unit P34 is a portion for setting zone width information in a zone width memory P35.

An intra-zone peak detector P36 detects a level maximum point (specific point) in the set zone from data stored in the waveform memory P28, and outputs a level and position data (address value) of the detected point as a marker level and marker position data.

A marker position memory P37 stores marker position data. A zone display position calculation unit P38 calculates a zone display position.

A start frequency setting unit P40 is a portion for setting a sweep detection start frequency in the measurement unit P20 in a start frequency memory P41. A center frequency setting unit P42 is a portion for similarly setting a sweep detection center frequency in a center frequency memory P43. A frequency span setting unit P44 is a portion for setting a frequency span in a frequency span memory P45.

A start frequency calculation unit P46 calculates a start frequency or a center frequency of a sweep detection frequency of the measurement unit P20 on the basis of the condition frequencies respectively set in these memories P41, P43, and P45. When the start frequency is changed/set, the unit P46 updates/sets the content of the center frequency memory P43 to satisfy the above-mentioned equation (1); when the center frequency is changed/set, it updates/sets the content of the start frequency memory P41.

When the frequency span is changed/set, the unit P46 updates/sets the content of the start frequency memory P41 or the center frequency memory P43 (i.e., has two different modes including a start frequency fixed mode, and a center frequency fixed mode).

A marker frequency calculation unit P47 calculates a frequency at the marker as the specific point in units of sweep operations on the basis of the start frequency, the frequency span, and the marker position, and outputs the calculated frequency to the display controller P29.

In a calculation of the marker frequency calculation unit P47, a value obtained by dividing the frequency span with the number of display points (in this case, 500) is multiplied with the marker position data, and the product is added to the start frequency, thus obtaining the marker frequency.

A tracking unit P48 corrects the contents of the start frequency memory P41 and the center frequency memory P43 by the difference between the zone center frequency and the marker frequency every time one sweep operation is ended.

An intra-zone frequency calculation unit P49 calculates the difference between a frequency at the zone center as the reference position, and the marker frequency for each sweep operation, and calculates a frequency difference $\Delta F$ by multiplying a value obtained by dividing the frequency span with the number of display points with a value obtained by subtracting a display point value of the zone center from a display point value of the marker point.

Adders P50 and P51 add the calculated frequency difference $\Delta F$ to the start frequency and the center frequency in the previous sweep operation to correct them, and output the corrected frequencies to the corresponding memories.

A tracking controller P52 updates the contents of the start frequency memory P41 and the center frequency memory P43 with the outputs from the adders P50 and P51 every time one sweep operation is ended, and then instructs to start the next sweep operation.

An operation of this spectrum analyzer will be described below.

Figure 22A:
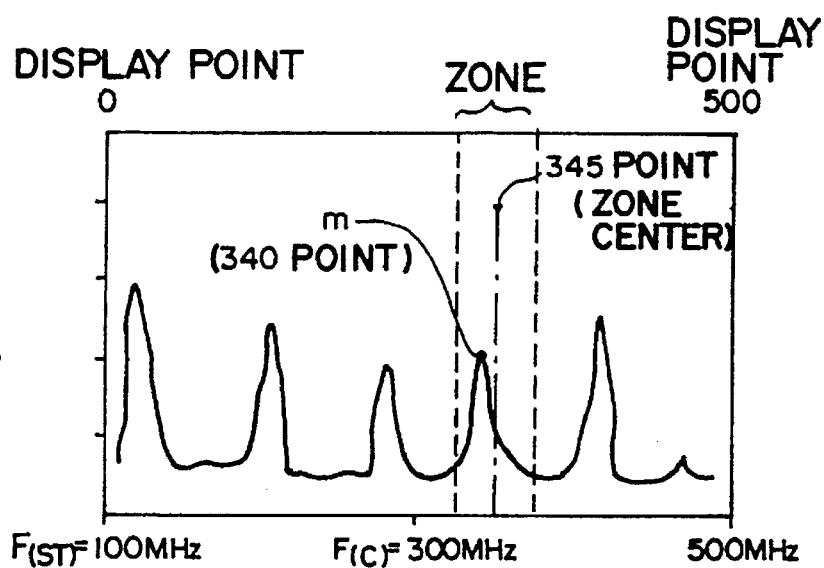
FIGS. 22A, 22B, and 22C show display examples of the fifth embodiment.

For example, when a measurement signal is observed in a state wherein the start frequency is 100 MHz, the frequency span is 400 MHz, and the zone center position corresponds to a display point value 345, a spectrum waveform shown in FIG. 22A is assumed to be displayed on the display device P30 by the first sweep operation, and a marker point m indicating a peak point in the zone is assumed to be displayed at the position of a display point value 340.

A difference $\Delta F$ between the marker frequency and the zone center frequency at this time is −4 MHz since (340−345) (400/500).

Therefore, a new start frequency and a new center frequency are respectively corrected to 96 MHz and 296 MHz, and are updated and stored in the start frequency memory P41 and the center frequency memory P43.

Figure 22B:
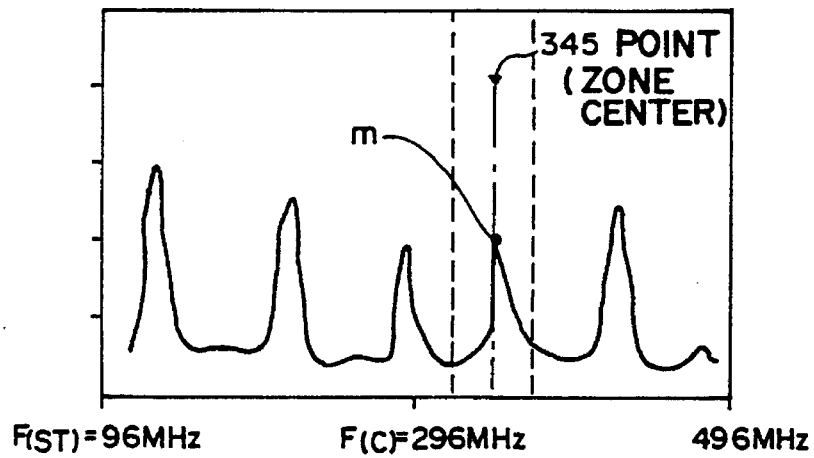

For this reason, the next sweep operation is performed at the start frequency of 96 MHz and the frequency span of 400 MHz. When a measurement signal does not suffer from a frequency drift, the entire spectrum is shifted, so that the marker point coincides with the zone center (reference position), as shown in FIG. 22B.

Even when the measurement signal suffers from the frequency drift, and the frequency of the marker point as the specific point is changed, since the marker point can be shifted to the zone center in each sweep operation, the marker point can be fixed at a position very close to the zone center unless a frequency drift exceeding the zone width occurs in one sweep operation.

Figure 22C:
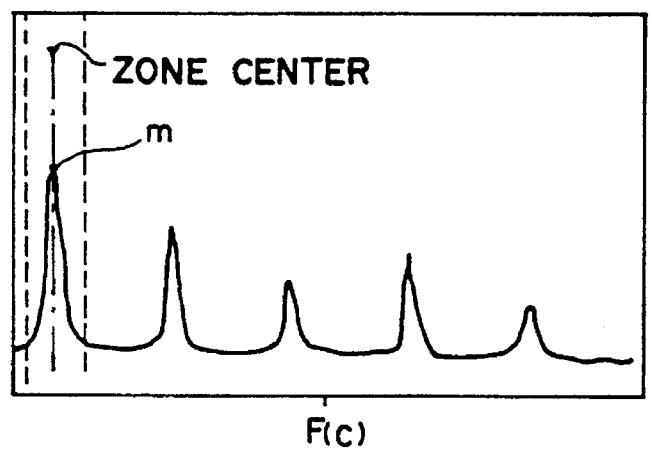

Since the zone position can be arbitrarily moved, when a harmonic measurement shown in FIG. 22C is to be performed, if a zone is set to sandwich a fundamental wave near the start frequency, the entire screen can be used as an observation region for high-order harmonic components.

If a zone is set to sandwich a spectrum having a level lower than those of other spectra, a target spectrum can be tracked while observing the overall spectrum.

When a display in the zone is made in an enlarged scale based on the magnifying glass display function, even when a desired signal drifts, the desired signal can always be present in the zone, and can be observed as a detailed waveform.

Figure 23:
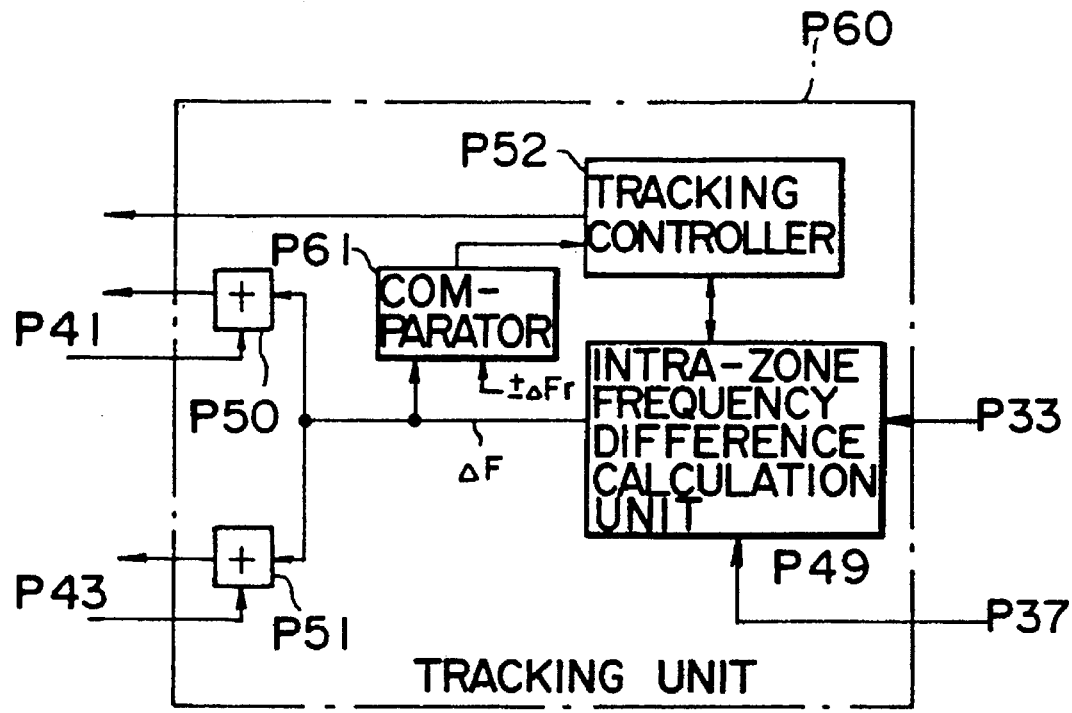
FIGS. 23 and 24 are principal part block diagrams showing different modifications of the fifth embodiment.

In the above case, tracking is performed for every sweep operation. However, correction by tracking may be performed upon completion of a plurality of sweep operations. Alternatively, as shown in a tracking unit P60 shown in FIG. 23, whether or not a frequency difference $\Delta F$ between the zone center as the reference position and the marker position as the specific point falls within an allowable frequency range $\pm \Delta Fr$ is checked by a comparator P61, and when the frequency difference $\Delta F$ exceeds the allowable frequency range, correction by tracking may be performed.

In the above-mentioned case, a point corresponding to the maximum level in the zone is defined as the specific point. However, a maximum minimal point or a minimum maximal point in the zone may be detected as the specific point.

Figure 24:
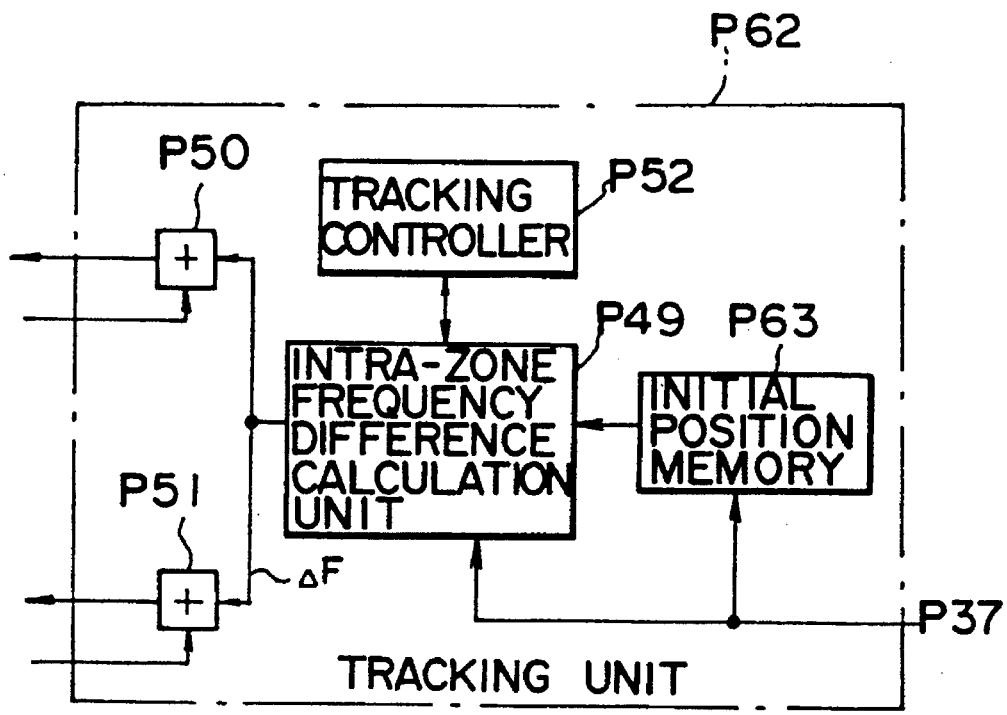
Figure 25:
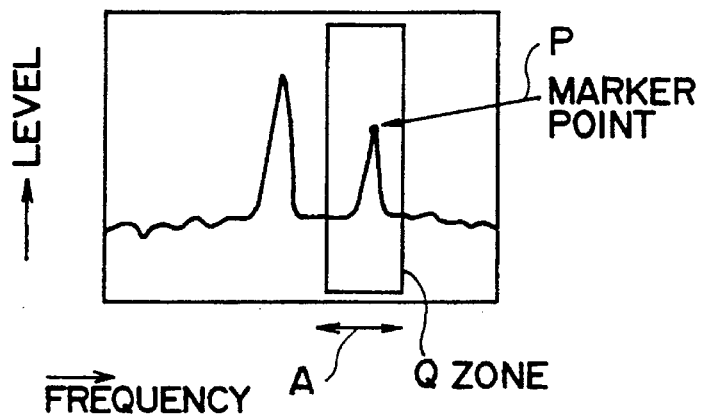
FIGS. 25 to 28 show display examples of the prior art.
Figure 26:
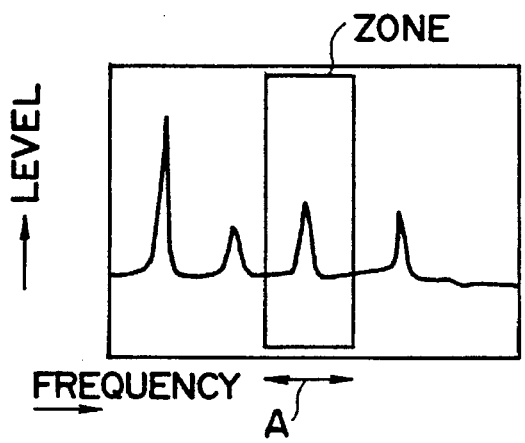
Figure 27:
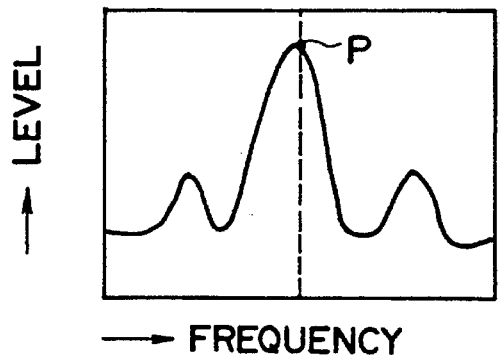
Figure 28:
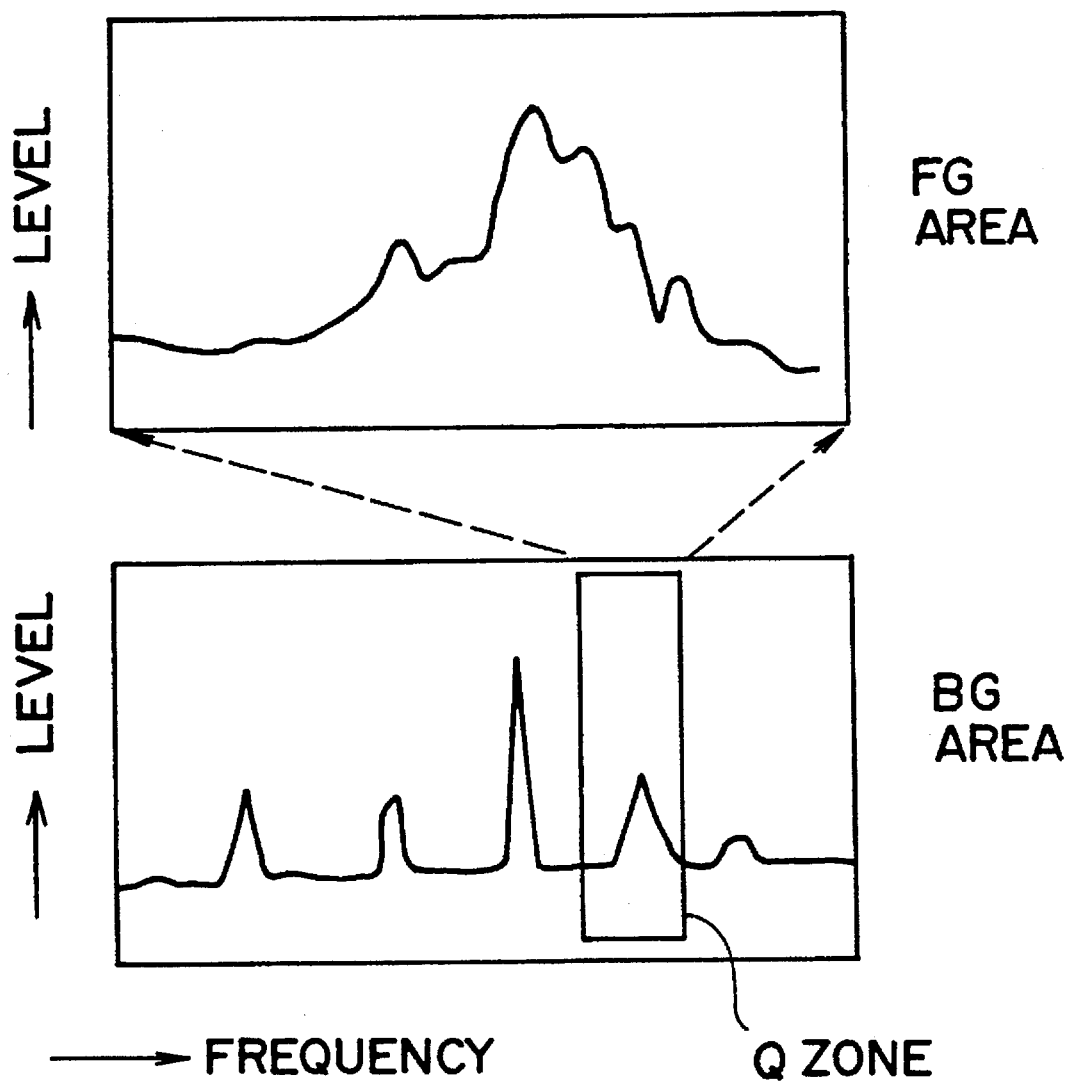
Figure 29:
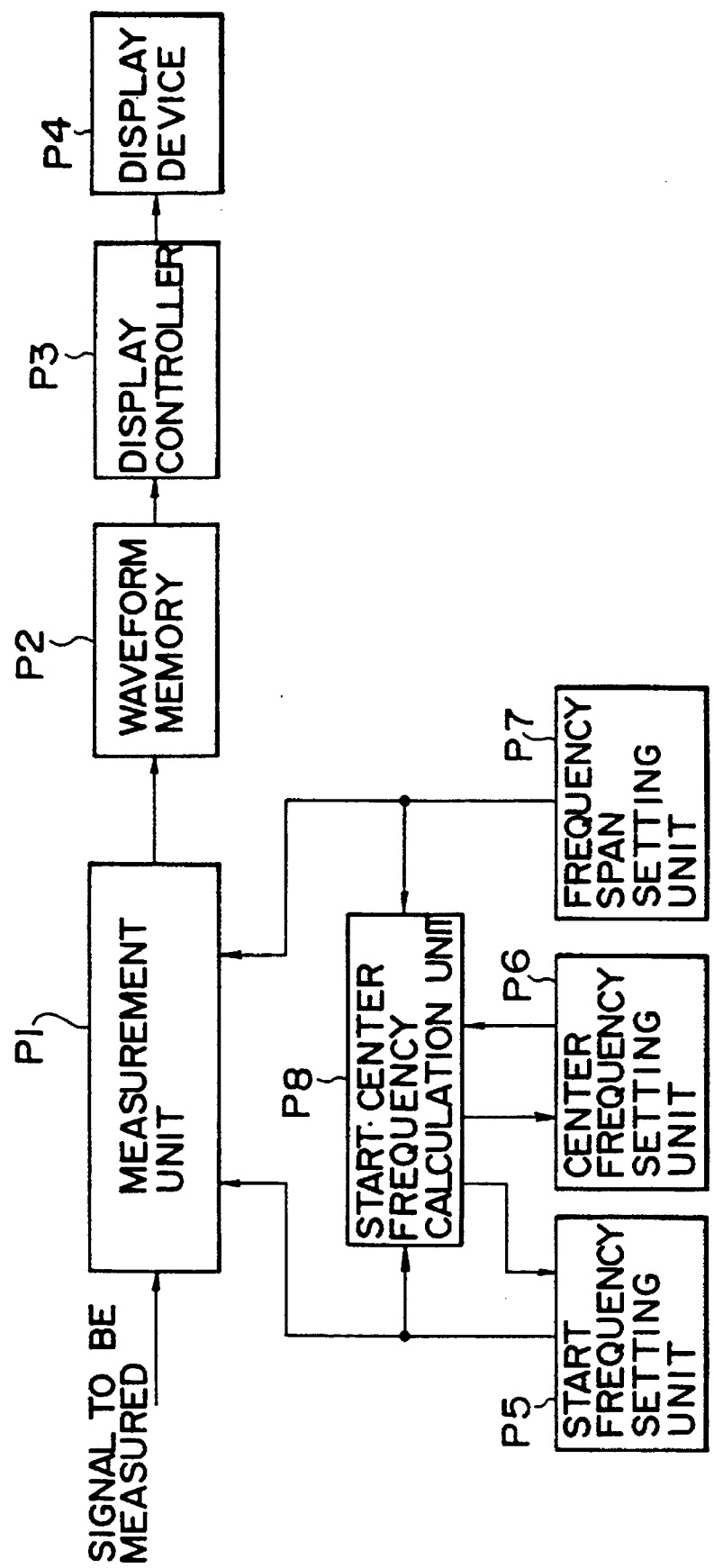
FIG. 29 is a block diagram showing an arrangement of a conventional apparatus.
Figure 30A:
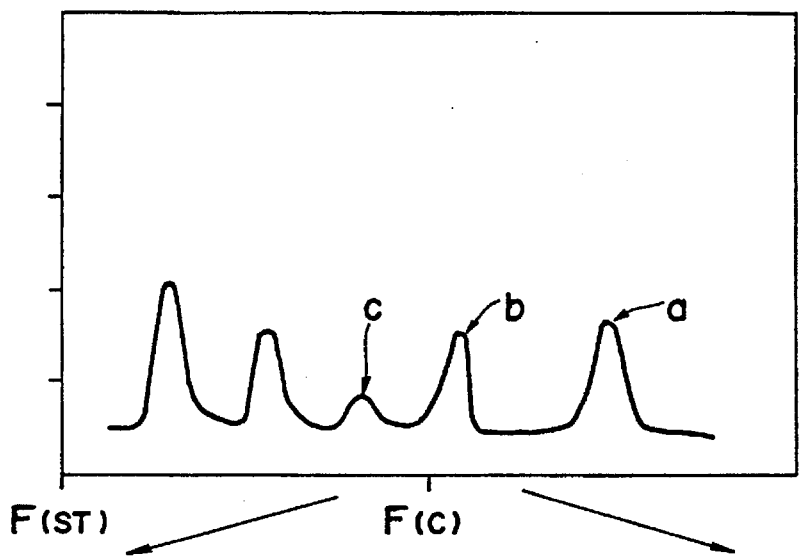
FIGS. 30A and 30B and FIGS. 31A and 31B show display screen data for explaining operations of the conventional apparatus.
Figure 30B:
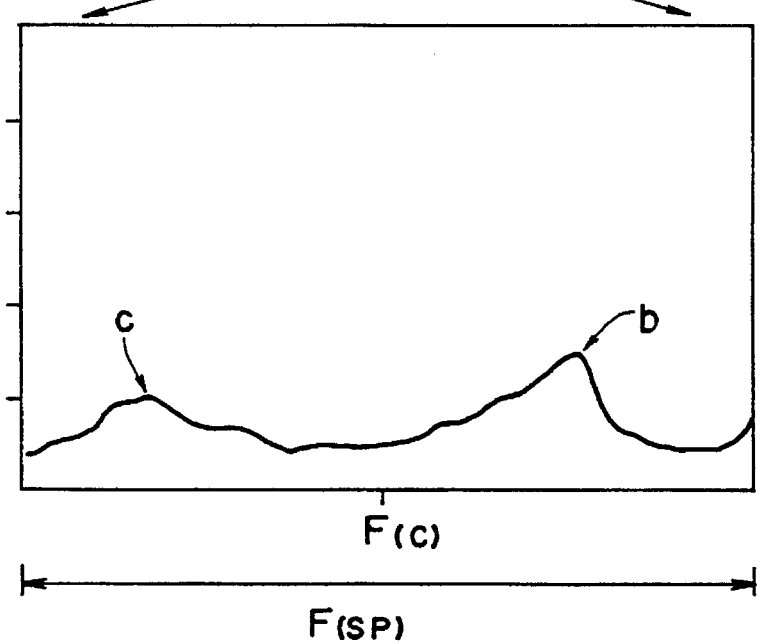
Figure 31A:
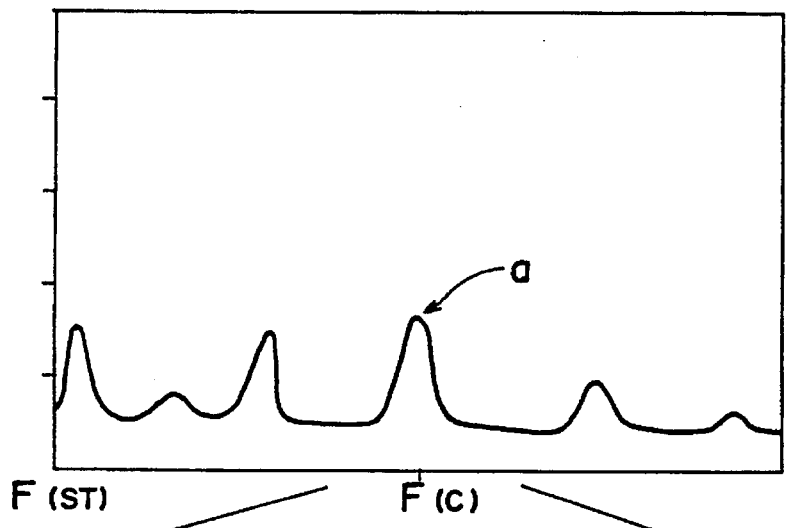
Figure 31B:
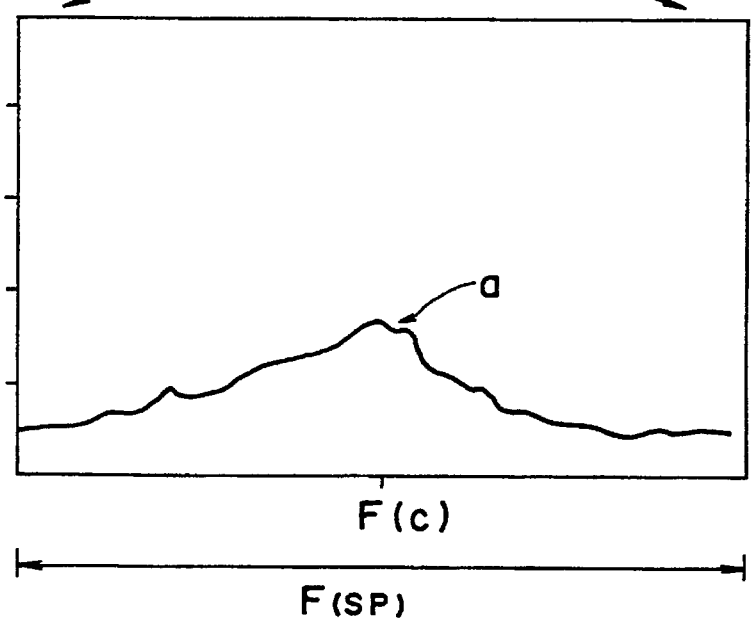
Figure 32:
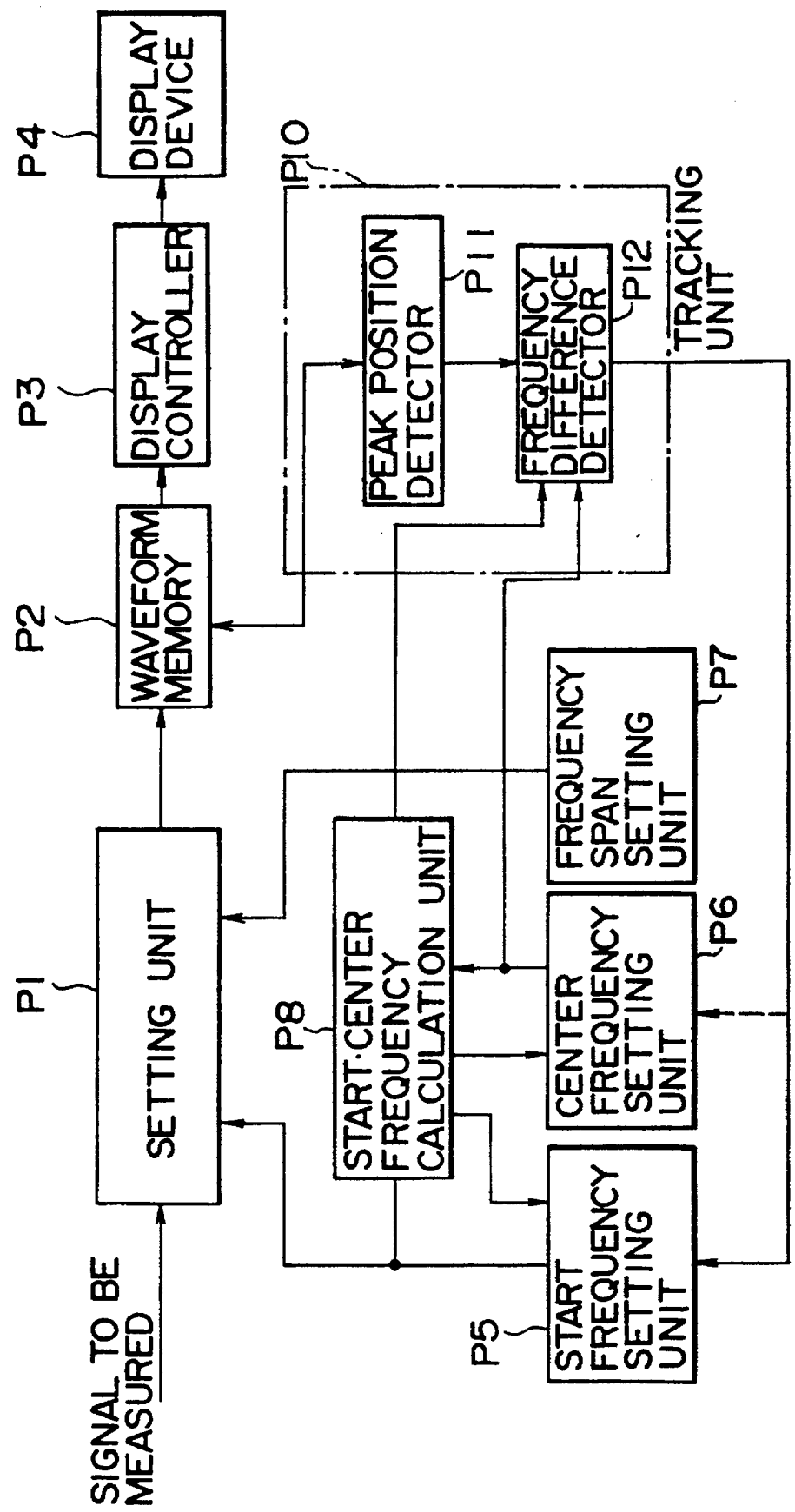
FIG. 32 is a block diagram showing an arrangement of a conventional apparatus which utilizes a center tracking function.

In the above-mentioned case, the center of the zone is defined as the reference position. However, the present invention is not limited to this. The reference position may be moved within the range of the zone. Alternatively, as shown in a tracking unit P62 shown in FIG. 24, an initial position memory P63 for storing initial position data of a marker point (specific point) itself in the zone may be arranged, and the storage value may be used as the reference position data. In this case, a frequency deviation upon first tracking can be advantageously decreased.

According to the fifth embodiment of the present invention, as described above, since the tracking unit for shifting a sweep detection frequency range so as to decrease the difference between a frequency of the specific point of a spectrum in a region set at an arbitrary position on a screen, and a frequency of the reference position in the region is arranged, an observation region is not limited by tracking, and an arbitrary one of a large number of spectra displayed on a single screen can be tracked by only setting the region without adjusting the start frequency, the frequency span, and the like, and the level difference or the like from other spectra need not be taken into consideration.

In each of the first to fifth embodiments described above, the present invention is applied to a one-screen display using a single screen before and after the magnification is changed. Except for the second embodiment, the present invention may be applied to a two-screen display wherein data before the magnification is changed is displayed on a first display unit, and data after the magnification is changed is displayed on a second display unit. With this two-screen display, the relative relationship before and after the magnification is changed can be displayed to allow easier understanding.

Therefore, according to the present invention as described in detail above, a waveform display apparatus of frequency sweep type, which can easily provide high-definition waveform observation of a waveform displayed to be developed on the frequency axis to a user, can be realized.

[Industrial Applicability]

The present invention can be widely applied to waveform display apparatuses of frequency sweep type, such as spectrum analyzers, network analyzers, and the like, which display waveform data developed on the frequency axis.

What is claimed is:

1. A waveform display apparatus of frequency sweep type, comprising:

a measurement unit for measuring a signal to be measured by sweeping a frequency under a predetermined measurement frequency condition so as to obtain waveform data corresponding to the frequency;

a display device for displaying the waveform data obtained by said measurement unit as developed on a frequency axis thereof;

first parameter setting means for setting a first measurement frequency range, and setting a first scale factor for displaying waveform data in the first measurement frequency range on said display device;

a first parameter memory for storing parameters set by said first parameter setting means;

reference parameter setting means for setting a desired frequency on the frequency axis on said display device as a reference position, said desired frequency being within said first measurement frequency range corresponding to the waveform data displayed with the first scale factor;

second parameter setting means for setting a second measurement frequency range, and setting a second scale factor enlarging the first scale factor, for a portion of the frequency axis which includes said desired frequency and set by the reference parameter setting means for displaying waveform data in the second measurement frequency range on said display device;

a second parameter memory for storing parameters set by said second parameter setting means; and control means for controlling the first and second measurement frequency ranges in said measurement unit, and controlling a display position in said display device so as to cause a coincidence between said desired frequency at the reference position set by said reference parameter setting means and one frequency in the second frequency range at the reference position, and to permit to display the waveform data in the second frequency range according to the second scale factor.

2. A waveform display apparatus according to claim 1, wherein said control means includes a feature point detection unit for detecting a frequency at a feature point of the waveform data obtained by said measurement unit, and a frequency deviation calculation unit for detecting a difference between the frequency at the feature point detected by said feature point detection unit, and a frequency corresponding to the reference position set by said reference parameter setting means, and changes the reference position and the measurement frequency range information in said second parameter memory according to the difference information from said frequency deviation calculation unit, so that the frequency corresponding to the reference position coincides with the frequency at the feature point on one point on the frequency axis on said display device, thereby controlling the first and second measurement frequency ranges in said measurement unit.

3. A waveform display apparatus according to claim 2, wherein said feature point detection unit detects a frequency at the feature point of the waveform data in the second measurement frequency range.

4. A waveform display apparatus according to claim 2, wherein said control means includes a feature point detection unit for detecting a frequency at a feature point of the waveform data obtained by said measurement unit, and a frequency deviation calculation unit for detecting a difference between the frequency at the feature point detected by said feature point detection unit, and a frequency corresponding to the reference position set by said reference parameter setting means, and changes the measurement frequency range information in said first and second parameters according to the difference information from said frequency deviation calculation unit, so that a position of the feature point on the frequency axis coincides with the reference position, thereby controlling the first and second measurement frequency ranges in said measurement unit, and said feature point detection unit detects a frequency at the feature point of the waveform data in the second measurement frequency range.

5. A waveform display apparatus according to claim 2, wherein said second parameter setting means includes means for setting a condition representing a zone on the frequency axis on said display device, a frequency range corresponding to a portion inside the zone coinciding with the second frequency range, said reference parameter setting means includes means for setting a condition representing the zone, a predetermined position in the zone coinciding with the reference position, and said feature point detection unit detects a frequency at the feature point of the waveform data in the second measurement frequency range.

6. A waveform display apparatus according to claim 2, wherein said control means includes a feature point detection unit for detecting a frequency at a feature point of the waveform data obtained by said measurement unit, and a frequency deviation calculation unit for detecting a difference between the frequency at the feature point detected by said feature point detection unit, and a frequency corresponding to the reference position set by said reference parameter setting means, and changes the measurement frequency range information in said second parameter according to the difference information from said frequency deviation calculation unit, so that the frequency corresponding to the reference position coincides with the frequency at the feature point on one point on the frequency axis on said display device, thereby controlling the first and second measurement frequency ranges in said measurement unit, said second parameter setting means includes means for setting a condition representing a zone on the frequency axis on said display device, a frequency range corresponding to a portion inside the zone coinciding with the second frequency range, said reference parameter setting means includes means for setting a condition representing the zone, a predetermined position in the zone coinciding with the reference position, and said feature point detection unit detects a frequency at the feature point of the waveform data in the second measurement frequency range.

7. A waveform display apparatus according to claim 2, wherein said control means includes a feature point detection unit for detecting a frequency at a feature point of the waveform data obtained by said measurement unit, and a frequency deviation calculation unit for detecting a difference between the frequency at the feature point detected by said feature point detection unit, and a frequency corresponding to the reference position set by said reference parameter setting means, and changes the measurement frequency range information in said second parameter according to the difference information from said frequency deviation calculation unit, so that a position of the feature point on the frequency axis coincides with the reference position, thereby controlling the first and second measurement frequency ranges in said measurement unit, said second parameter setting means includes means for setting a condition representing a zone on the frequency axis on said display device, a frequency range corresponding to a portion inside the zone coinciding with the second frequency range, said reference parameter setting means includes means for setting a condition representing the zone, a predetermined position in the zone coinciding with the reference position, and said feature point detection unit detects a frequency at the feature point of the waveform data in the second measurement frequency range.

8. A waveform display apparatus according to claim 1, wherein said control means includes a feature point detection unit for detecting a frequency at a feature point of the waveform data obtained said measurement unit, and a frequency deviation calculation unit for detecting a difference between the frequency at the feature point detected by said feature point detection unit, and a frequency corresponding to the reference position set by said reference parameter setting means, and changes the measurement frequency range information in said first and second parameter memories according to the difference information from said frequency deviation calculation unit, so that a position of the feature point on the frequency axis coincides with the reference position, thereby controlling the first and second measurement frequency ranges in said measurement unit.

9. A waveform display apparatus according to claim 1, wherein said second parameter setting means includes means for setting a condition representing a zone on the frequency axis on said display device, a frequency range corresponding to a portion inside the zone coinciding with the second frequency range, and said reference parameter setting means includes means for setting a condition representing the zone, a predetermined position in the zone coinciding with the reference position.

10. A waveform display apparatus according to claim 1, wherein said control means includes a feature point detection unit for detecting a frequency at a feature point of the waveform data obtained by said measurement unit, and a frequency deviation calculation unit for detecting a difference between the frequency at the feature point detected by said feature point detection unit, and a frequency corresponding to the reference position set by said reference parameter setting means, and changes the measurement frequency range information in said second parameter according to the difference information from said frequency deviation calculation unit, so that the frequency corresponding to the reference position coincides with the frequency at the feature point on one point on the frequency axis on said display device, thereby controlling the first and second measurement frequency ranges in said measurement unit, said second parameter setting means includes means for setting a condition representing a zone on the frequency axis on said display device, a frequency range corresponding to a portion inside the zone coinciding with the second frequency range, and said reference parameter setting means includes means for setting a condition representing the zone, a predetermined position in the zone coinciding with the reference position.

11. A waveform display apparatus according to claim 1, wherein said control means includes a feature point detection unit for detecting a frequency at a feature point of the waveform data obtained by said measurement unit, and a frequency deviation calculation unit for detecting a difference between the frequency at the feature point detected by said feature point detection unit, and a frequency corresponding to the reference position set by said reference parameter setting means, and changes the measurement frequency range information in said first and second parameters according to the difference information from said frequency deviation calculation unit, so that a position of the feature point on the frequency axis coincides with the reference position, thereby controlling the first and second measurement frequency ranges in said measurement unit, said second parameter setting means includes means for setting a condition representing a zone on the frequency axis on said display device, a frequency range corresponding to a portion inside the zone coinciding with the second frequency range, and said reference parameter setting means includes means for setting a condition representing the zone, a predetermined position in the zone coinciding with the reference position.

* * * * *